United States Patent
Kim et al.

(10) Patent No.: US 10,685,626 B2
(45) Date of Patent: Jun. 16, 2020

(54) DISPLAY MODULE, ELECTRONIC WATCH HAVING THE SAME, AND ELECTRONIC DEVICE HAVING THE DISPLAY MODULE

(71) Applicant: SAMSUNG DISPLAY CO., LTD., Yongin-si, Gyeonggi-do (KR)

(72) Inventors: Mugyeom Kim, Hwaseong-si (KR); Heejune Kwak, Yongin-si (KR); Young-seok Seo, Seoul (KR); Jiwon Sohn, Seoul (KR); Doyoung Lee, Uiwang-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 295 days.

(21) Appl. No.: 15/417,345

(22) Filed: Jan. 27, 2017

(65) Prior Publication Data
US 2017/0301314 A1 Oct. 19, 2017

(30) Foreign Application Priority Data
Apr. 19, 2016 (KR) .......................... 10-2016-0047788

(51) Int. Cl.
| | |
|---|---|
| *G09G 5/14* | (2006.01) |
| *G09G 3/30* | (2006.01) |
| *G09G 3/3225* | (2016.01) |
| *H01L 27/32* | (2006.01) |
| *G06F 3/041* | (2006.01) |

(Continued)

(52) U.S. Cl.
CPC .............. *G09G 5/14* (2013.01); *G06F 3/044* (2013.01); *G06F 3/0416* (2013.01); *G09G 3/2074* (2013.01); *G09G 3/30* (2013.01); *G09G 3/3225* (2013.01); *G09G 5/10* (2013.01); *H01L 27/3216* (2013.01); *H01L 27/3218* (2013.01); *G06F 1/163* (2013.01); *G06F 1/1637* (2013.01); *G09G 3/3233* (2013.01); *G09G 2300/0426* (2013.01); *G09G 2300/0452* (2013.01); *G09G 2320/0233* (2013.01); *G09G 2320/0686* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 6,483,482 B1 | 11/2002 | Kim | |
| 2003/0128324 A1* | 7/2003 | Woods | .............. G02F 1/134336 349/143 |

(Continued)

FOREIGN PATENT DOCUMENTS

| | | |
|---|---|---|
| CN | 103969864 A | 8/2014 |
| KR | 10-2008-0091145 A | 10/2008 |
| KR | 10-2009-0059661 A | 6/2009 |

*Primary Examiner* — Temesghen Ghebretinsae
*Assistant Examiner* — Sosina Abebe
(74) *Attorney, Agent, or Firm* — Kile Park Reed & Houtteman PLLC

(57) ABSTRACT

A display module includes a window member configured to include a first window area having a first thickness and a second window area having a second thickness greater than the first thickness, and a display panel configured to include a first display area overlapped with the first window area in a thickness direction and including a first pixel and a second display area overlapped with the second window area in the thickness direction and including a second pixel. The second pixel has a second pixel area smaller than a first pixel area of the first pixel.

25 Claims, 41 Drawing Sheets

(51) Int. Cl.
*G06F 3/044* (2006.01)
*G09G 3/20* (2006.01)
*G09G 5/10* (2006.01)
G06F 1/16 (2006.01)
G09G 3/3233 (2016.01)

(52) U.S. Cl.
CPC ............... *G09G 2340/045* (2013.01); *G09G 2340/0407* (2013.01); *G09G 2340/0442* (2013.01)

(56) References Cited

U.S. PATENT DOCUMENTS

| | | | |
|---|---|---|---|
| 2006/0001796 A1* | 1/2006 | Chang | G02F 1/13336 349/95 |
| 2006/0077544 A1* | 4/2006 | Stark | G02F 1/13336 359/448 |
| 2009/0115933 A1* | 5/2009 | Mimura | G02F 1/133512 349/59 |
| 2011/0109535 A1* | 5/2011 | Watanabe | G02F 1/13336 345/87 |
| 2015/0049287 A1 | 2/2015 | Chang et al. | |
| 2015/0160506 A1* | 6/2015 | Park | G02F 1/133377 349/138 |
| 2016/0011633 A1 | 1/2016 | Watanabe et al. | |

* cited by examiner

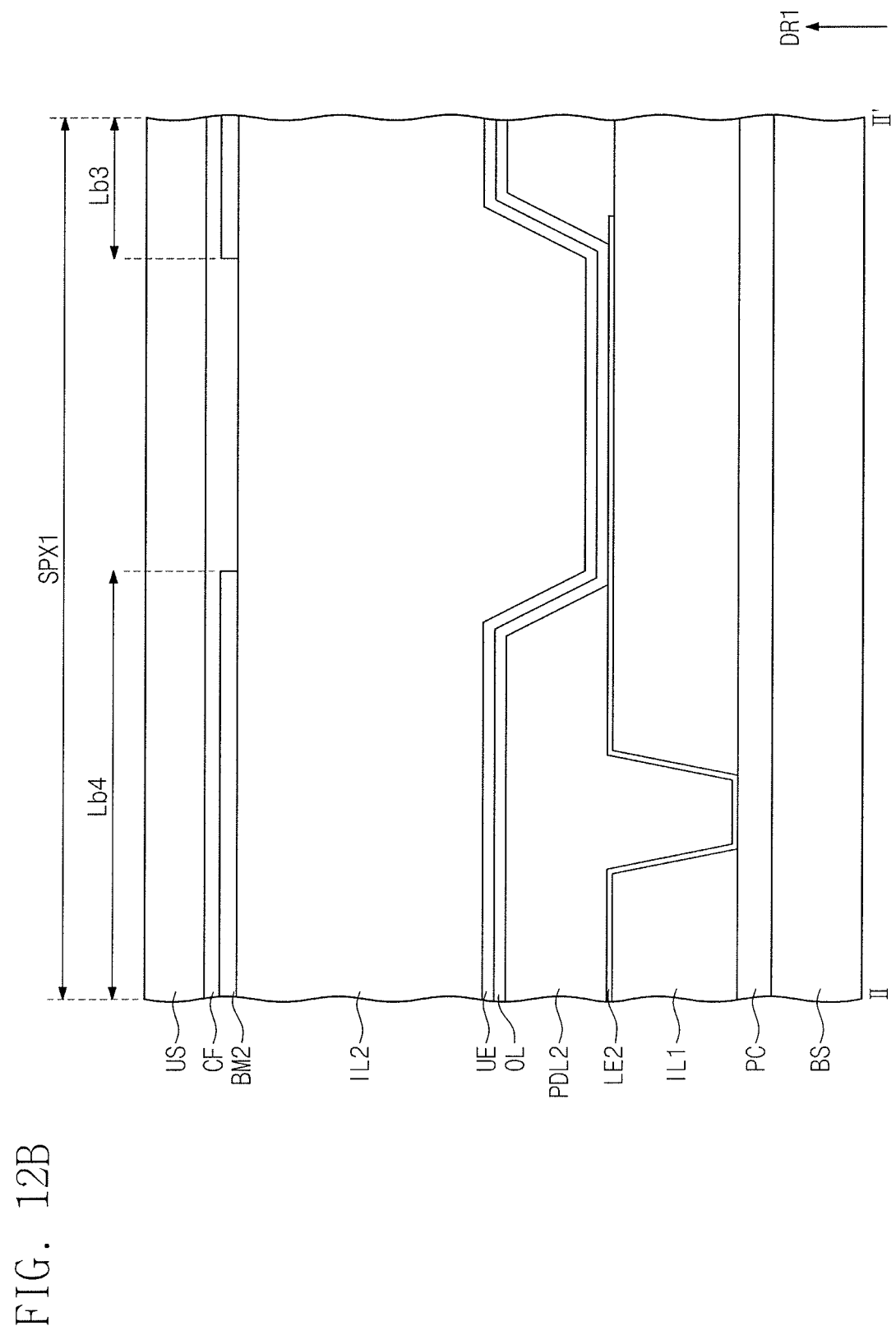

DISPLAY MODULE, ELECTRONIC WATCH HAVING THE SAME, AND ELECTRONIC DEVICE HAVING THE DISPLAY MODULE

CROSS-REFERENCE TO RELATED APPLICATION

Korean Patent Application No. 10-2016-0047788, filed on Apr. 19, 2016, in the Korean Intellectual Property Office, and entitled: "Display Module, Electronic Watch Having the Same, and Electronic Device Having the Display Module," is incorporated by reference herein in its entirety.

BACKGROUND

1. Field

The present disclosure relates to a display module, an electronic watch having the same, and an electronic device having the same. More particularly, the present disclosure relates to a display module having improved display quality, an electronic watch having the display module, and an electronic device having the display module.

2. Description of the Related Art

Various electronic devices used for a multimedia device, e.g., a television set, a mobile phone, a navigation system, a computer monitor, a game unit, etc., have been developed. The electronic devices include a display panel displaying an image. Particularly, in recent years, various portable electronic devices, e.g., a mobile phone, a tablet, an electronic watch, etc., have been developed.

SUMMARY

The present disclosure provides a display module having improved display quality, an electronic watch having the display module, and an electronic device having the display module.

Embodiments provide a display module including a window member configured to include a first window area having a first thickness and a second window area having a second thickness greater than the first thickness, and a display panel configured to include a first display area overlapped with the first window area in a thickness direction and including a plurality of first pixels and a second display area overlapped with the second window area in the thickness direction and including a plurality of second pixels. At least one of the plurality of second pixels has a second pixel area smaller than a first pixel area of at least one of the plurality of first pixels.

The window member further includes a third window area having a third thickness greater than the second thickness, the display panel further includes a third display area overlapped with the third window area in the thickness direction and having a plurality of third pixels, and the second pixel area is greater than a third pixel area of at least one of the plurality of third pixels.

The second display area is disposed between the first and third display areas to connect the first display third display area when viewed in a plan view.

An equation of $$\frac{ES1}{PS1} < \frac{ES2}{PS2}$$

is satisfied, the PS1 denotes the first pixel area, the ES1 denotes an area of a first light emitting area of at least one of the plurality of first pixels, the PS2 denotes the second pixel area, and the ES2 denotes an area of a second light emitting area of at least one of the plurality of second pixels.

The display panel further includes a first black matrix overlapped with the plurality of first pixels in the thickness direction to define the first light emitting area and a second black matrix overlapped with the second black matrix overlapped with the plurality of second pixels in the thickness direction to defined the second light emitting area, and the first black matrix has an area greater than an area of the second black matrix.

The display panel further includes a first pixel definition layer exposing a lower electrode of at least one of the plurality of first pixels to correspond to the first light emitting area and a second pixel definition layer exposing a lower electrode of at least one of the plurality of second pixels to correspond to the second light emitting area.

The window member has a substantially circular shape or an oval shape when viewed in a plan view, the first display area is disposed more outside than the second display area when viewed in a plan view, and a boundary of the first and second display areas has the circular shape or the oval shape.

the plurality of first and second pixels are arranged in a matrix form along a radial direction ($\hat{\rho}$) and a tangential direction ($\hat{\varphi}$) of a cylindrical coordinate system.

A width in the tangential direction ($\hat{\varphi}$) of the first black matrix is greater than a width in the tangential direction ($\hat{\varphi}$) of a portion of the second black matrix.

A width in the radial direction ($\hat{\rho}$) of the first black matrix is greater than a width in the radial direction ($\hat{\rho}$) of a portion of the second black matrix.

At least one of the plurality of first pixels includes first and second sub-pixels arranged in the tangential direction ($\hat{\varphi}$), and at least a portion of a sub-light emitting area of the first sub-pixel is not overlapped with at least a portion of a sub-light emitting area of the second sub-pixel in the tangential direction ($\hat{\varphi}$).

The display panel further includes first and second display lines substantially parallel to the radial direction ($\hat{\rho}$), the second display line is disposed between adjacent first pixels to each other in the tangential direction ($\hat{\varphi}$) among the plurality of first pixels and between adjacent second pixels to each other in the tangential direction ($\hat{\varphi}$) among the plurality of second pixels, and the first display line is disposed between adjacent first pixels to each other in the tangential direction ($\hat{\varphi}$) among the plurality of first pixels and spaced apart from the plurality of second pixels in the radial direction ($\hat{\rho}$).

The display module further includes a controller receiving first input image data having information on an image displayed in the first display area and second input image data having information on an image displayed in the second display area, and the controller compensates for a grayscale value of at least one of the first and second input image data to compensate for a difference in brightness between the first and second pixel areas, which is caused by a different in area between the first and second pixel areas.

A curvature of an upper surface of the first window area is different from a curvature of an upper surface of the second window area.

A length of at least one of the plurality of second pixels in a horizontal direction perpendicular to the thickness direction is smaller than a length of at least one of the plurality of the first pixels in the horizontal direction A total number of the plurality of first pixels being smaller than a total number of the plurality of second pixels.

A first distance in a horizontal direction perpendicular to the thickness direction between the first pixels adjacent to each other among the plurality of first pixels is greater than a second distance in the horizontal direction between the second pixels adjacent to each other among the plurality of second pixels Embodiments provide a display module including a window member configured to include a first window area having a first thickness and a second window area having a second thickness greater than the first thickness and a touch module configured to include a first touch area overlapped with the first window area in a thickness direction and including a first touch electrode and a second touch area overlapped with the second window area in the thickness direction and including a second touch electrode. The second touch electrode has a sensitivity greater than a sensitivity of the first touch electrode.

The second touch electrode has an area smaller than an area of the first touch electrode.

Each of the first and second touch electrodes is provided in a plural number, and a distance between adjacent second touch electrodes to each other among the second touch electrodes is smaller than adjacent first touch electrodes to each other among the first touch electrodes.

Each of the first and second touch electrodes is provided in a plural number, and the first and second touch electrodes are arranged in a matrix form along a radial direction ($\hat{\rho}$) and a tangential direction ($\hat{\varphi}$) of a cylindrical coordinate system.

The touch module further includes a plurality of first touch lines and a plurality of second touch lines, which are substantially parallel to the radial direction ($\hat{\rho}$), the second touch lines are disposed between the first touch electrodes, disposed between the second touch electrodes, and transmit a signal caused by a self-capacitance of the second touch electrodes, and the first touch lines are disposed between the first touch electrodes, spaced apart from the second electrodes in the radial direction ($\hat{\rho}$), and transmit a signal caused by a self-capacitance of the first touch electrodes.

The touch module further includes a sensing controller, the sensing controller outputs a first sensing signal to the first touch area and outputs a second sensing signal to the second touch area, and the second sensing signal has an intensity greater than an intensity of the first sensing signal.

Embodiments provide an electronic watch including a display panel configured to include a first display area displaying a first partial image to a first direction and a second display area displaying a second partial image to the first direction, a window member configured to include an edge portion disposed on the first display area to enlarge the first partial image M1 times and a center portion disposed on the second display area to enlarge the second partial image M2 times and the window member having an upper surface convex to the first direction, and a housing accommodating the display panel. The M2 is greater than the M1, and a number of pixels per a unit area in the first display area is smaller than a number of the pixels per a unit area in the second display area.

An equation of PN2/PN1=M2/M1 is satisfied, the PN1 denotes the number of the pixels per the unit area of the first display area, and the PN2 denotes the number of the pixels per the unit area of the second display area.

Embodiments provide an electronic device including a window member including an upper surface convex to a thickness direction in which an image is provided and a display panel configured to include a first display area overlapped with an edge portion of the upper surface in the thickness direction and including a first pixel and a second display area overlapped with a center portion of the upper surface in a one first direction and including a second pixel, the second pixel having a second pixel area smaller than a first pixel area of the first pixel.

BRIEF DESCRIPTION OF THE DRAWINGS

Features will become apparent to those of ordinary skill in the art by describing in detail exemplary embodiments with reference to the attached drawings, in which:

FIGS. 12A and 12B illustrate cross-sectional views taken along lines and respectively shown in FIGS. 11A and 11B;

DETAILED DESCRIPTION

Figure 1:
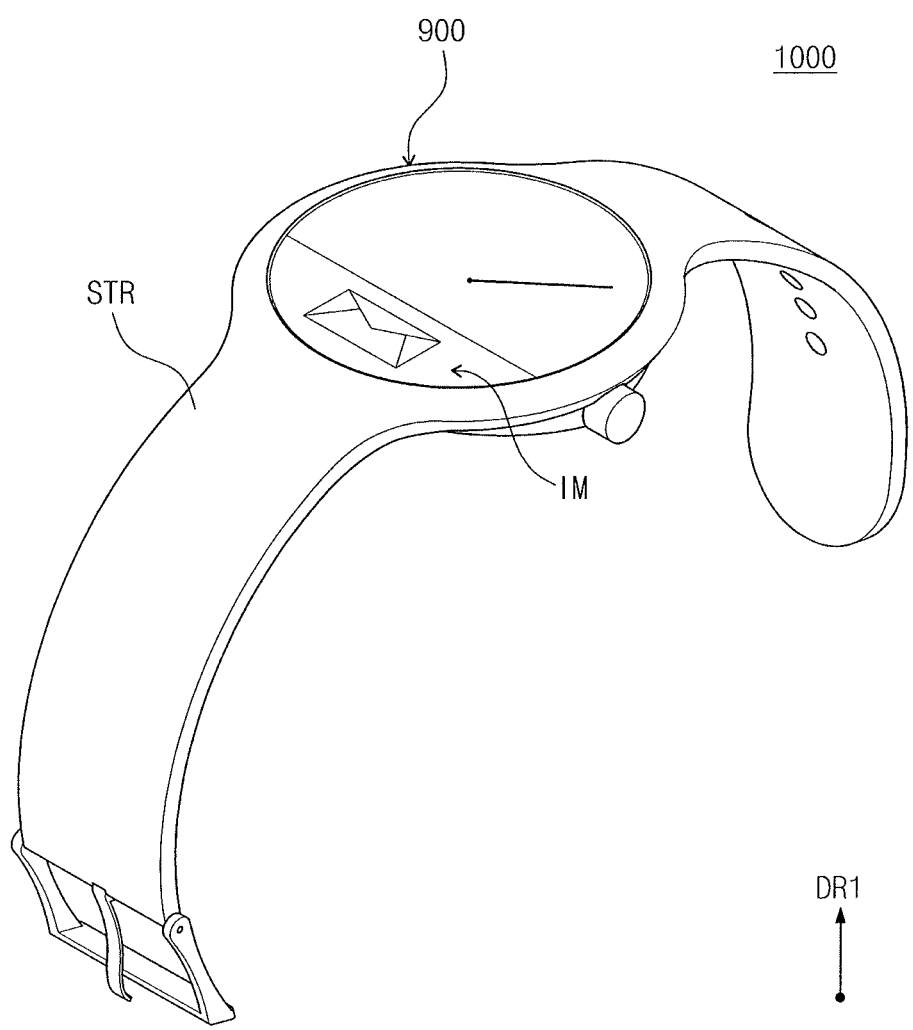
FIG. 1 illustrates a perspective view showing an electronic device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, it will be understood that when an element or layer is referred to as being "connected to" or "coupled to" another element or layer, it can be directly connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout.

Hereinafter, embodiments will be explained in detail with reference to the accompanying drawings.

Figure 2:
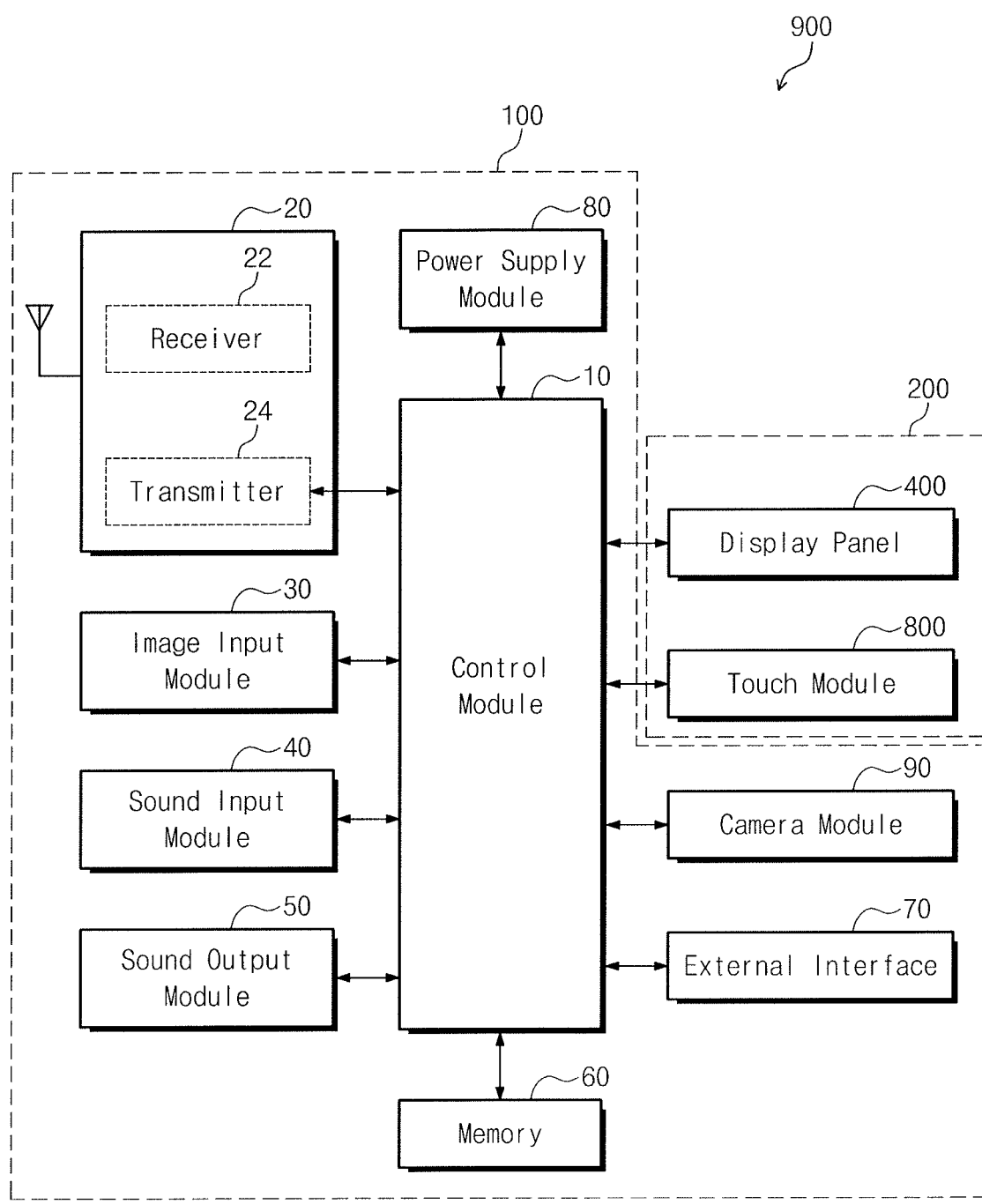
FIG. 2 illustrates a block diagram showing a watch assembly shown in FIG. 1 according to an exemplary embodiment of the present disclosure.

FIG. 1 is a perspective view showing an electronic device according to an exemplary embodiment of the present disclosure, and FIG. 2 is a block diagram showing a watch assembly shown in FIG. 1 according to an exemplary embodiment of the present disclosure. Hereinafter, the electronic device according to an exemplary embodiment of the present disclosure will be described with reference to FIGS. 1-2.

Referring to FIG. 1, the electronic device according to the present exemplary embodiment may be an electronic watch 1000. According to another embodiment, the electronic device may be an electronic device displaying an image, e.g., a mobile phone, a tablet, a monitor, a head-mounted display, a television set, etc.

The electronic watch 1000 may include a watch assembly 900 and a strap STR. The watch assembly 900 displays an image IM having predetermined information in a first direction DR1. In the present disclosure, the first direction DR1 may be referred to as a vertical direction or a thickness direction, e.g., along a normal to a face of the watch assembly 900. The image IM may include, for example, an image implementing a conventional analog watch, e.g., a clock hand indicating a current time, an icon of an application executed by an application processor, or an execution screen of an application.

The watch assembly 900 is attachable to and detachable from the strap STR. A user may wear the strap STR on his/her wrist to wear the electronic watch 1000 on the wrist. The use of the strap STR should not be limited to the user's wrist. That is, a shape of the strap STR may be modified to be worn on a user's arm or to be put around a user's neck, or the strap STR may be replaced with a watch cradle used to mount the watch assembly 900 to another electronic device.

As shown in FIG. 2, the watch assembly 900 may include a display module 200 and an electronic module 100. The display module 200 includes a display panel 400 and a touch module 800. In the present exemplary embodiment, the touch module 800 may be omitted. The touch module 800 may be integrally provided with the display module 200 or replaced with a keypad.

The display module 200 generates the image IM shown in FIG. 1. The display module 200 may include, e.g., an organic light emitting display panel, a liquid crystal display panel, or an electrophoretic display panel. The touch module 800 senses an external input. The external input may be a touch event or a hovering event generated by a user's finger or a stylus pen. The touch module 800 should not be limited thereto or thereby. That is, the touch module 800 may be an electrostatic capacitance type touch module, a sound wave type touch module, or an optical type touch module.

The electronic module 100 may include various functional modules to operate the watch assembly 900. The electronic module 100 may include at least one of a control module 10, a wireless communication module 20, an image input module 30, a sound input module 40, a sound output module 50, a memory 60, an external interface 70, a power supply module 80, and a camera module 90. The modules are mounted on a printed circuit board and are electrically connected to each other through a flexible printed circuit board.

The control module 10 controls an overall operation of the electronic watch 1000 and processes data. For instance, the control module 10 activates or inactivates the display module 200 and outputs input image data to the display module 200. The control module 10 activates or inactivates the touch module 800 and controls the display module 200, the image input module 30, the sound input module 40, and the sound output module 50.

The wireless communication module 20 transmits and receives a wireless signal to and from another terminal using a Bluetooth or WiFi connection. The wireless communication module 20 transmits and receives a sound signal using a general communication line. The wireless communication module 20 includes a transmitter 24 transmitting a signal after modulating the signal and a receiver 22 demodulating the signal applied thereto.

The image input module 30 processes input image data to convert the input image data to image data that may be displayed through the display module 200. The sound input module 40 receives an external sound signal through a microphone during a recording mode or a voice recognition mode, and converts the sound signal to electrical sound data. The sound output module 50 converts the sound data provided from the wireless communication module 20 or sound data stored in the memory 60 and outputs the converted sound data to the outside.

The external interface 70 serves as an interface connected to an external recharger, a wire/wireless data port, a card socket (e.g., a memory card, an SIM/UIM card, etc.). The power supply module 80 supplies power required for the overall operation of the watch assembly 900.

Figure 3:
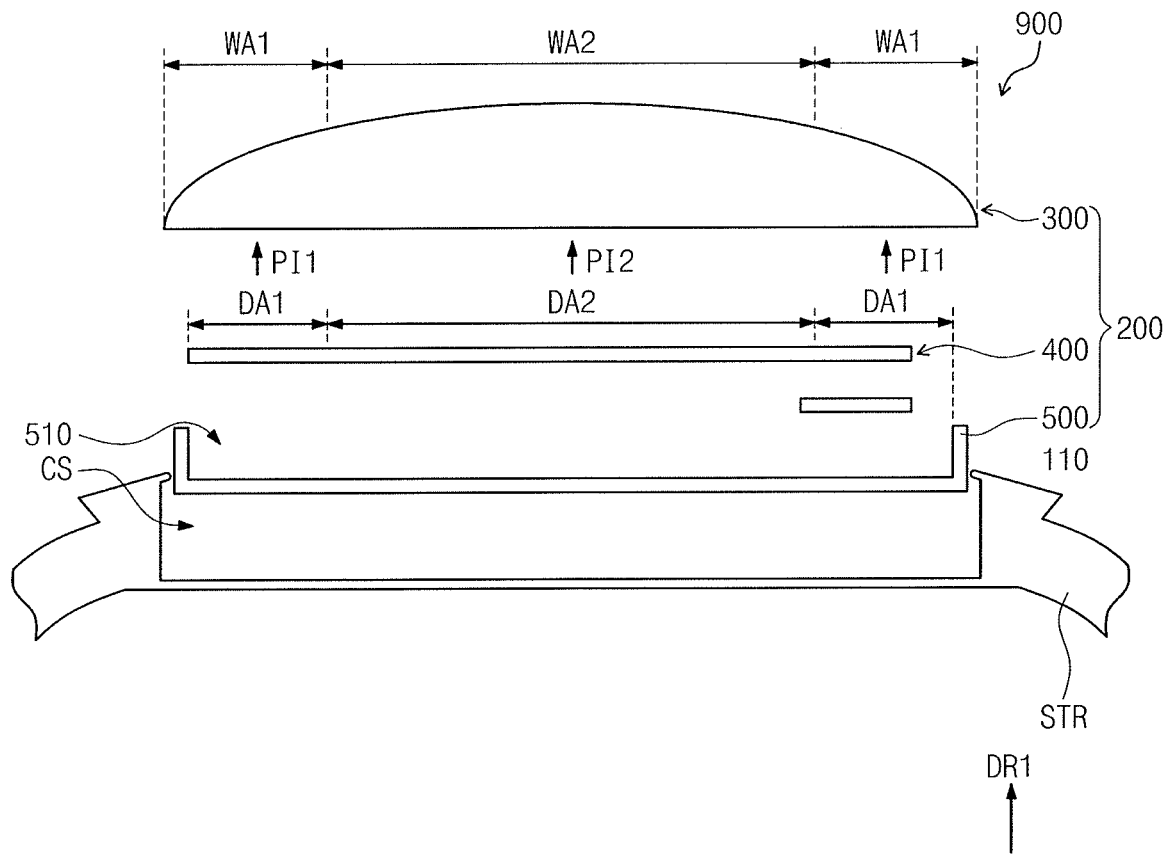
FIG. 3 illustrates an exploded cross-sectional view showing an electronic watch according to an exemplary embodiment of the present disclosure.

FIG. 3 is an exploded cross-sectional view showing an electronic watch according to an exemplary embodiment of the present disclosure.

Referring to FIG. 3, the display module 200 of the watch assembly 900 may be coupled to the strap STR to be attachable to and detachable from the strap STR. In more detail, a coupling space CS is defined in the strap STR, and the display module 200 is accommodated in the coupling space CS of the strap STR. In the present exemplary embodiment, the display module 200 may include an electronic module substrate 110, a window member 300, the display panel 400, and a housing 500.

The electronic module substrate 110 may be, but not limited to, a printed circuit board, and various electronic elements may be mounted on the electronic module substrate 110 to implement the electronic module 100 (refer to FIG. 2). For instance, the electronic module substrate 110 may include a passive element, e.g., a capacitor, a resistor, etc., an active element, e.g., a micro-processor including an integrated circuit, a memory chip, etc., and lines connecting the above-mentioned elements.

In the present exemplary embodiment, the housing 500 accommodates the display module 200 and the electronic module substrate 110 to protect the display module 200 and the electronic module substrate 110 from external impacts. An accommodating space 510 is defined in the housing 500, and the display module 200 and the electronic module substrate 110 are accommodated in the accommodating space 510. The housing 500 is accommodated in the coupling space CS of the strap STR to be coupled the display module 200 and the electronic module substrate 110.

The display panel 400 displays the image in the first direction DR1. The display panel 400 may include a first display area DAh1 and a second display area DA2 distinguished from the first display area DA1 in a horizontal direction, e.g., the first and second display areas DA1 and DA2 are adjacent to each other along the horizontal direction. In the present disclosure, the term "plane" used herein means an imaginary surface vertical to the first direction DR1, and the term "horizontal direction" used herein means a direction substantially parallel to the plane. The first display area DA1 surrounds the second display area DA2 when viewed in a plane view. The first display area DA1 displays a first partial image PI1 of the image IM (refer to FIG. 1), and the second display area DA2 displays a second partial image PI2 of the image IM.

The window member 300 is disposed on the display panel 400. The window member 300 is coupled to the housing 500 to define the accommodating space 510 or coupled to the display panel 400 by an adhesive member.

The window member 300 includes a transparent material that transmits the first and second partial images PI1 and PI2. The window member 300 includes a rigid glass material or a transparent polymer having flexibility.

The window member 300 includes a first window area WA1 and a second window area WA2 distinguished from the first window area WA1 in the horizontal direction. The first and second window areas WA1 and WA2 are respectively overlapped with the first and second display areas DA1 and DA2 in the first direction DR1.

In the present exemplary embodiment, the window member 300 has a dome shape. The window member 300 includes a flat lower surface and a convex upper surface. When viewed in a plan view, the window member 300 has an oval shape or a substantially circular shape. The upper surface of the window member 300 may be, but not limited to, a two-dimensional curved surface. In other words, the upper surface of the window member 300 may be curved along at least two directions substantially parallel to the plane surface. Since the window member 300 has the dome shape, the electronic watch 1000 provides the user with an image having improved three-dimensional effect, sense of immersion (or immersiveness), and presence of the image.

The first window area WA1 is defined more outside than the second window area WA2 when viewed in a plan view. The first window area WA1 is defined at an edge of the window member 300, and the second window area WA2 is defined at a center of the window member 300. For example, the first and second window areas WA1 and WA2 may be concentric, and the first window area WA1 may be external to and, e.g., completely, surround the second window areas WA2. Since the window member 300 has a dome shape, a second thickness of the second window area WA2 is thicker than a first thickness of the first window area WA1.

The first and second partial images PI1 and PI2 transmit through the first and second window areas WA1 and WA2. Since the first and second window areas WA1 and WA2 have a convex upper surface, the first and second partial images PI1 and PI2 are enlarged by the first and second window areas WA1 and WA2. In more detail, the first window area WA1 enlarges the first partial image PI1 M1 times, and the second window area WA2 enlarges the second partial image PI2 M2 times. Since the second window area WA2 is defined at the center, the "M2" is greater than the "M1". Each of M1 and M2 is greater than zero (0). In the present exemplary embodiment, the first and second partial images PI1 and PI2 are enlarged or contracted depending on the thickness, a refractive index, and a curvature of the window member 300, and thus the first and second partial images PI1 and PI2 could be distorted. However, as described later, the display panel 400 according to the present exemplary embodiment prevents the first and second partial images PI1 and PI2 from being distorted by the window member 300.

Figure 4:
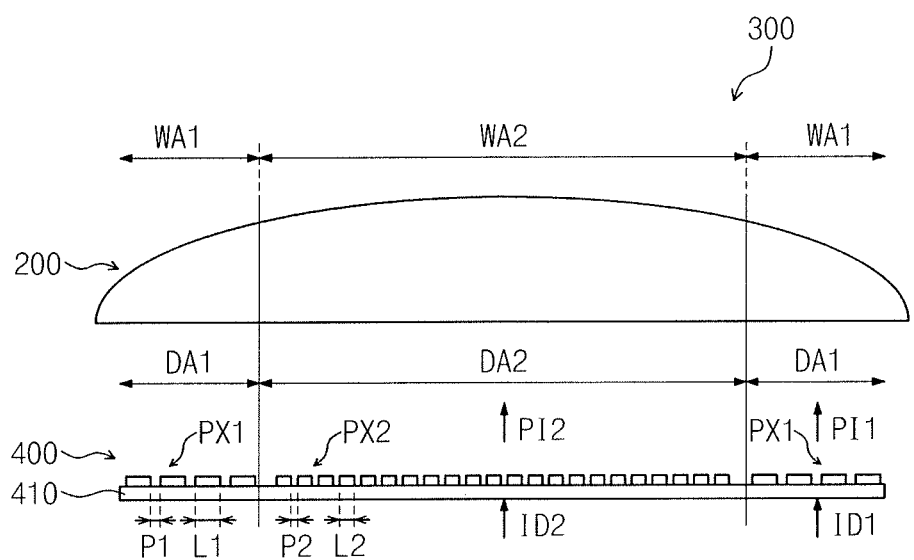
FIG. 4 illustrates a cross-sectional view showing a display module according to an exemplary embodiment of the present disclosure.

FIG. 4 is a cross-sectional view showing a display module according to an exemplary embodiment of the present disclosure.

Referring to FIG. 4, the display panel 400 may include a base layer 410 and a pixel disposed on the base layer 410. In the present exemplary embodiment, the pixel includes a first pixel PX1 disposed in the first display area DA1 and a second pixel PX2 disposed in the second display area DA2.

The second pixel PX2 is smaller in size than the first pixel PX1. For instance, as shown in FIG. 4, a first length L1 in the horizontal direction of the first pixel PX1 is longer than a second length L2 in the horizontal direction of the second pixel PX2. In the present exemplary embodiment, a first distance P1 in the horizontal direction between the first pixels PX1 adjacent to each other may be greater than a second distance P2 in the horizontal direction between the second pixels PX2 adjacent to each other. However, the first distance P1 may be equal to the second distance P2 according to embodiments. Since the second length L2 is smaller than the first length L1, the second partial image PI2 is relatively contracted while being displayed when compared to the first partial image PI1. Accordingly, the distortion of the image, which is caused by the second partial image PI2 enlarged more than the first partial image PI1 when the first and second partial images PI1 and PI2 transmit through the window member 300, may be prevented, and as a result, the display quality of the display module 200 may be improved.

In the present exemplary embodiment, the number (hereinafter, referred to as a pixel number PN2) of the second pixels PX2 per a unit area of the second display area DA2 may be greater than the number (hereinafter, referred to as a pixel number PN1) of the first pixels PX1 per a unit area of the first display area DA1. Thus, an area of the display panel 400 through which the second partial image PI2 is displayed is relatively smaller than that of the second partial image PI1. Consequently, the distortion of the image caused by the second partial image PI2 enlarged more than the first partial image PI1 may be prevented, and thus the display quality of the display module 200 may be improved.

In the present exemplary embodiment, the following equation of PN2/PN1=M2/M1 may be satisfied. The enlargement of the image is proportional to ratios M1 and M2 of the first and second window areas WA1 and WA2, and inversely proportional to the pixel number of the first and second display areas DA1 and DA2 per unit area. Thus, the distortion of the image may be effectively prevented in the case that the above-mentioned equation is satisfied.

First image data ID1 are provided to the first display area DA1. The first image data ID1 include data provided to the first pixel PX1 to display the first partial image PI1. Second image data ID2 are provided to the second display area DA2. The second image data ID2 include data provided to the second pixel PX2 to display the second partial image PI2.

In the present exemplary embodiment, the display module 200 may further include a controller. The controller is disposed on the base layer 410 or on a display printed circuit board 205 (refer to FIG. 19). The controller receives first input image data having information on the first partial image PI1 and second input image data having information on the second partial image PI2 from the control module 10 (refer to FIG. 2), and compensates for grayscale values of the first and/or second input image data to generate the first and second image data ID1 and ID2, thereby compensating for a difference in brightness between the first and second pixels PX1 and PX2, which is caused by a different in size between the first and second pixels PX1 and PX2. For instance, since the size of the first pixel PX1 is greater than the size of the second pixel PX2, the brightness of the image (or light) displayed in the first pixel PX1 may be higher than the brightness of the image displayed in the second pixel PX2 at the same grayscale value. Accordingly, the controller relatively increases the grayscale value of the second input image data and generates the second image data in order to prevent the distortion of the image due to non-uniform brightness. Consequently, the brightness difference caused by the difference in size between the first and second pixels PX1 and PX2 may be reduced, and thus the brightness of the first and second pixels PX1 and PX2 may be uniform.

In the earlier description, the display panel 400 that prevents the first and second partial images PI1 and P12 (refer to FIG. 3) from being distorted due to the difference in thickness of the window member 300 has been described, but embodiments described earlier and embodiments described later should not be limited to the display panel 400. The first and second partial images PI1 and PI2 are enlarged or contracted by the thickness, the refractive index, and the curvature of the window member 300. Accordingly, the display panel 400 may be deformed in various shapes to prevent the first and second partial images PI1 and PI2 may be distorted due to the thickness, the refractive index, and the curvature of the window member 300.

Figure 5:
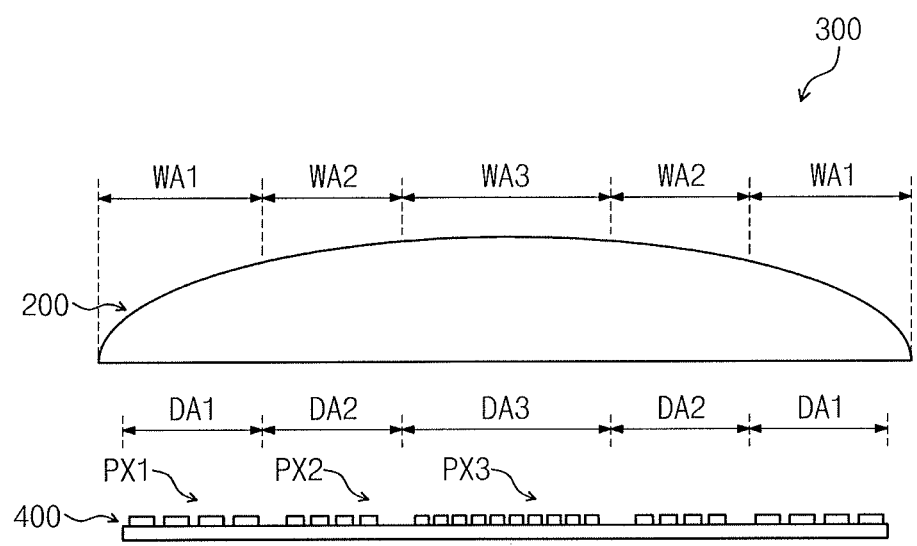
FIG. 5 illustrates a cross-sectional view showing a display module according to an exemplary embodiment of the present disclosure.

FIG. 5 is a cross-sectional view showing a display module according to an exemplary embodiment of the present disclosure.

In FIG. 5, the display module 200 has a similar structure and function as those of the display module 200 shown in FIG. 4, and thus different features will be described in detail. Referring to FIG. 5, each of the display panel 400 and the window member 300 is divided into three or more areas in the horizontal direction.

For example, as illustrated in FIG. 5, the display panel 400 may include first, second, and third areas DA1, DA2, and DA3, and the window member 300 may include first, second, and third window areas WA1, WA2, and WA3. The first, second, and third window areas WA1, WA2, and WA3 respectively have first, second, and third thicknesses. The second thickness is greater than the first thickness and smaller than the third thickness. The first, second, and third display areas DA1, DA2, and DA3 include first, second, and third pixels PX1, PX2, and PX3, respectively. When assuming that the first, second, and third pixels PX1, PX2, and PX3 respectively have first, second, and third pixel sizes, the second pixel size is smaller than the first pixel size and greater than the third pixel size.

Figure 6:
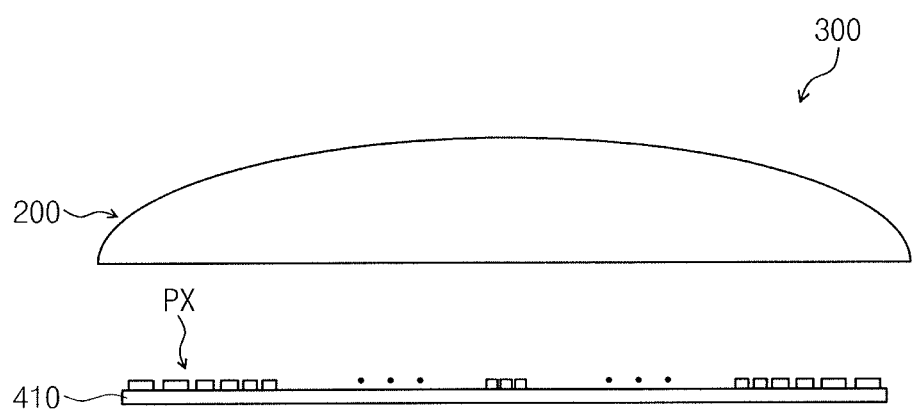
FIG. 6 illustrates a cross-sectional view showing a display module according to an exemplary embodiment of the present disclosure.

FIG. 6 is a cross-sectional view showing a display module according to an exemplary embodiment of the present disclosure.

In FIG. 6, a display module 200 has similar a structure and function as those of the display module 200 shown in FIG. 4, and thus different features will be described in detail. Referring to FIG. 6, the size of the pixels PX gradually increases as a distance from the center of the base layer 410 increases, i.e., a distance from the edge of the base layer 410 decreases.

In detail, a magnification of the window member 300 enlarging the image is successively varied along a direction toward the edge of the window member 300 from the center of the window member 300. The size of the pixel PX may be determined depending on the magnification successively varied.

Figure 7A:
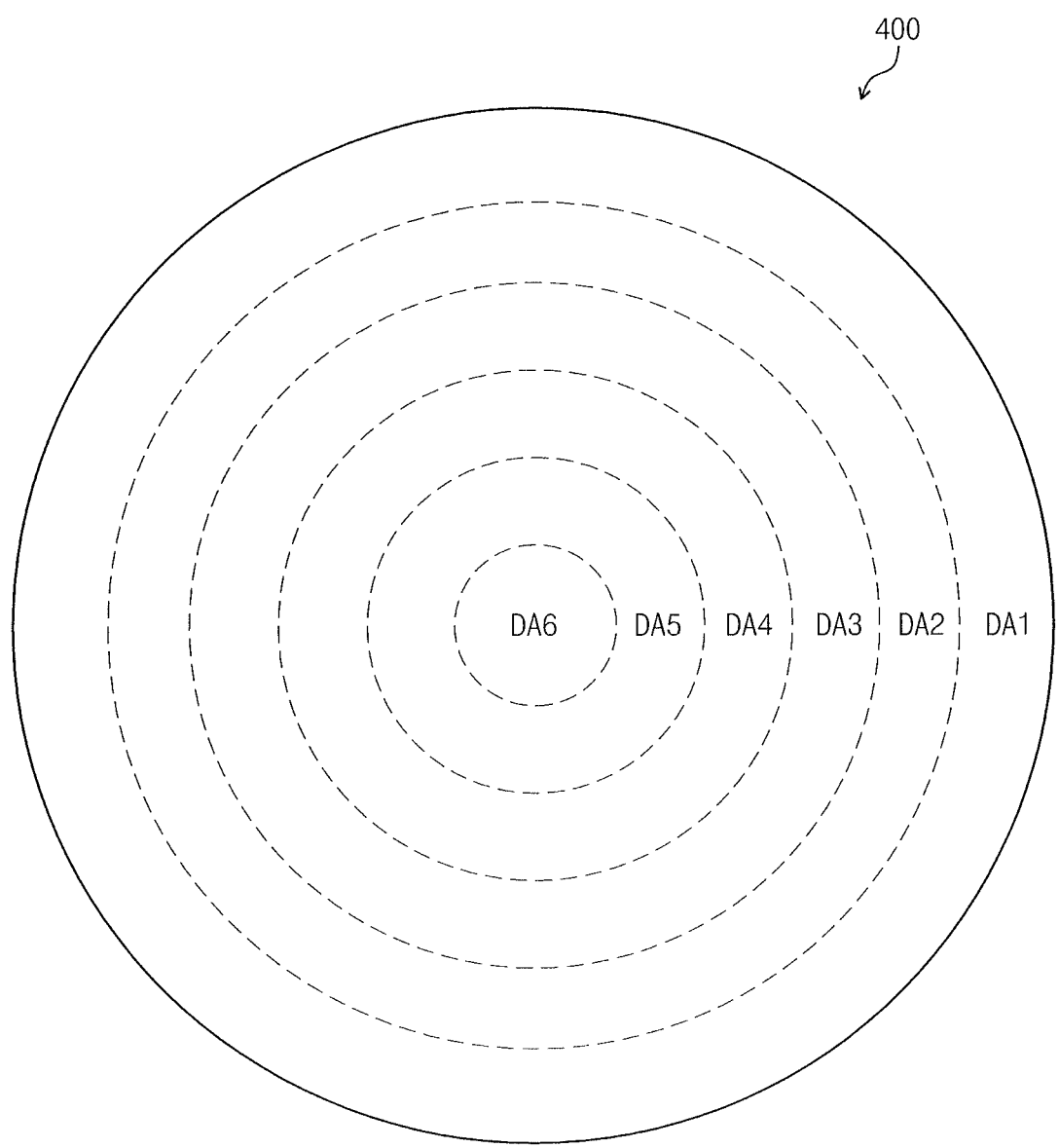
FIG. 7A illustrates a view showing display areas according to an exemplary embodiment of the present disclosure.
Figure 7B:
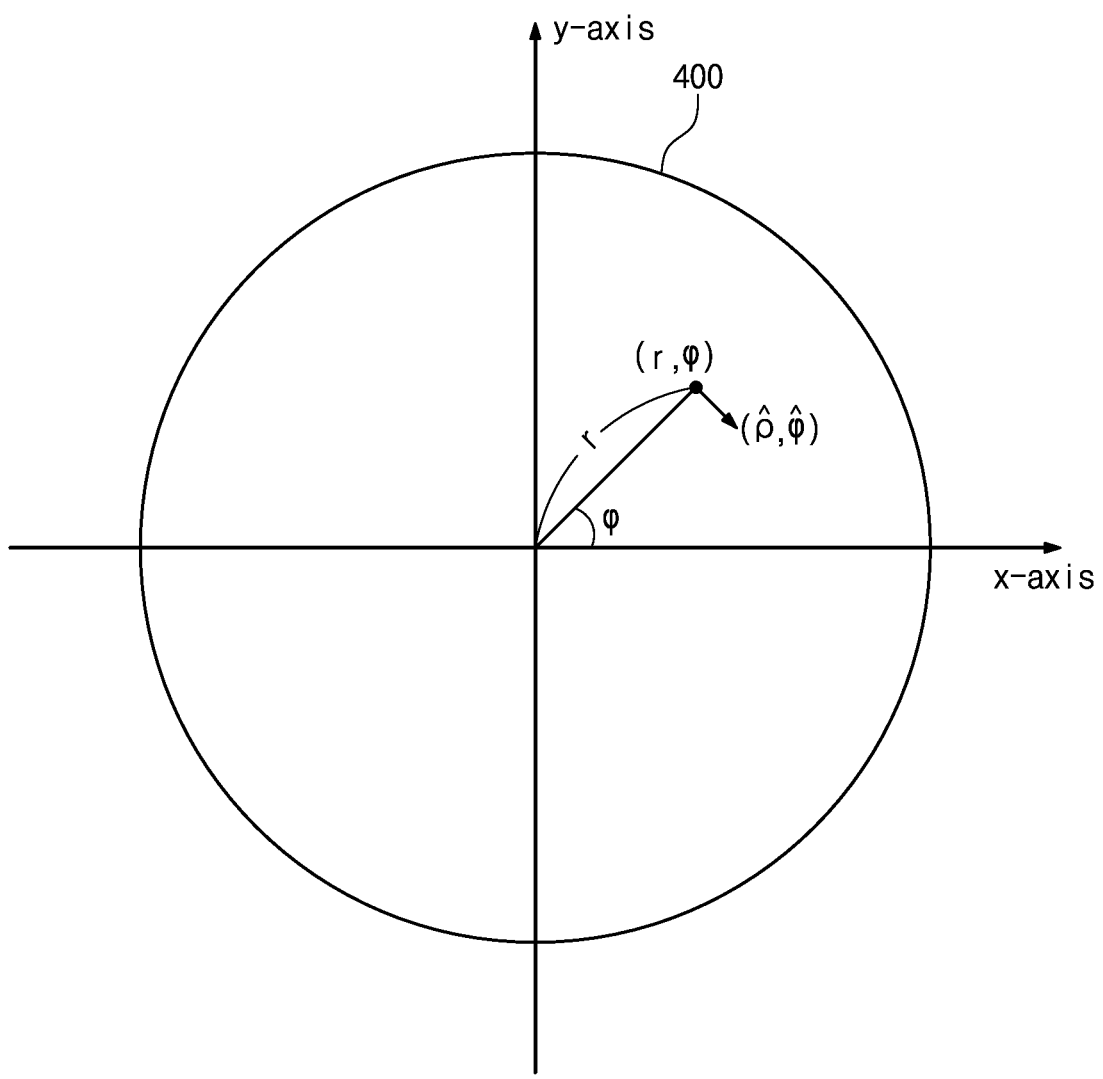
FIG. 7B illustrates a view explaining a cylindrical coordinate system.

FIG. 7A is a view showing display areas according to an exemplary embodiment of the present disclosure, and FIG. 7B is a view explaining a cylindrical coordinate system.

Referring to FIG. 7A, a display panel 400 may include first, second, third, fourth, fifth, and sixth display areas DA1, DA2, DA3, DA4, DA5, and DA6. In the present exemplary embodiment, the display panel 400 has an oval shape, e.g., a substantially circular shape. The display areas DA1 to DA6 may be defined corresponding to the shape of the display panel 400, e.g., the display areas DA1 to DA6 may have increasing radiuses and arranged to be concentric with each other.

As shown in FIG. 7B, components of the display panel 400 may be explained using the cylindrical coordinate system. An origin of the cylindrical coordinate system may be defined as a center of the display panel 400, a position coordinate on the display panel 400 may be represented as (r, φ), and a unit vector at the coordinate (r, φ) may be represented as ($\hat{\rho}$, $\hat{\varphi}$). The "r" denotes a distance between the origin and the corresponding coordinate, the "φ" denotes an angle between an x-axis and the corresponding coordinate, the "$\hat{\rho}$" denotes a radial direction, and the "$\hat{\varphi}$" denotes a tangential direction.

Referring to FIG. 7A again, the display areas DA1 to DA6 may be sequentially arranged in the radial direction ($\hat{\rho}$). In more detail, a boundary between the display areas DA1 to DA6 has an oval shape or a substantially circular shape. The first to fifth display areas DA1 to DA5 have a ring shape when viewed in a plan view, and the sixth area DA6 has the circular shape. Outer circumferences of the first to sixth display areas DA1 to DA6 may decrease in order of the first to sixth display areas DA1 to DA6.

Figure 8:
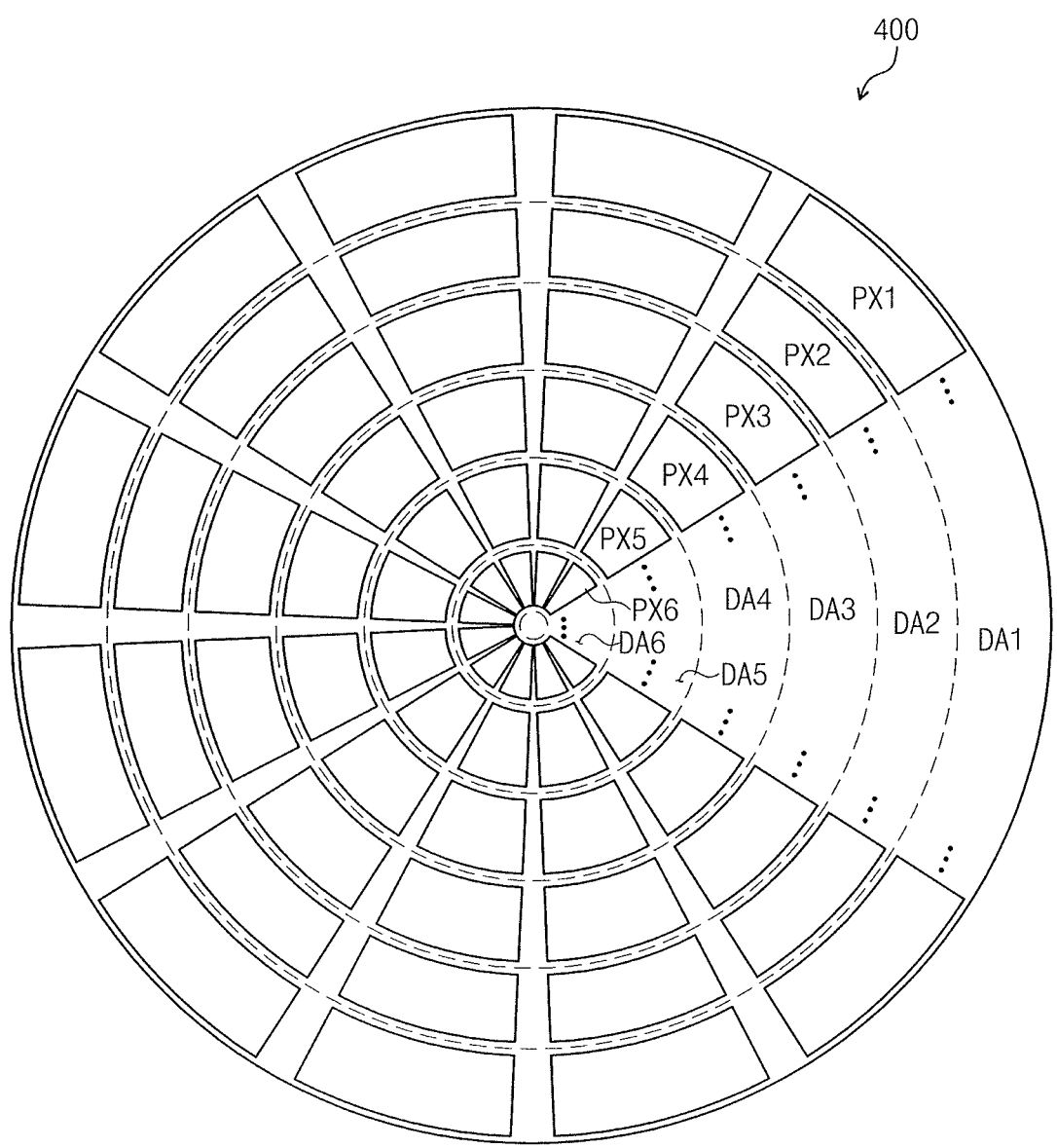
FIG. 8 illustrates a plan view showing a display panel according to an exemplary embodiment of the present disclosure.

FIG. 8 is a plan view showing a display panel according to an exemplary embodiment of the present disclosure.

For the convenience of explanation, a portion of configurations of the display panel 400 shown in FIG. 8 is omitted. Referring to FIG. 8, the first to sixth display areas DA1 to DA6 respectively include the first to sixth pixels PX1 to PX6. For instance, a plurality of first, second, third, fourth, fifth, and sixth pixels PX1, PX2, PX3, PX4, PX5, and PX6 are respectively arranged in the first, second, third, fourth, fifth, and sixth display areas DA1, DA2, DA3, DA4, DA5, and DA6 along the tangential direction ($\hat{\varphi}$), e.g., a plurality of first pixels PX1 may be arranged along a perimeter of the first display area DA1, etc. The first to sixth pixels PX1 to PX6 have similar structures to each other, and thus hereinafter, the first and second pixels PX1 and PX2 will be described as a representative example.

In the present disclosure, a circumferential row and a radial column may be defined. The circumferential row may be defined by an imaginary line defined along the tangential direction ($\hat{\varphi}$), and the "r (the distance from the center of the display panel)" may be constant at the position/coordinate on the same circumferential row. The radial column may be defined by an imaginary line defined along the radial direction ($\hat{\rho}$), and the "φ (the angle with the x-axis)" may be constant at the position/coordinate on the same radial column. As illustrated in FIG. 8, the first pixels PX1 may be arranged on one circumferential row along the tangential direction ($\hat{\varphi}$) in the first display area DA1, but they should not be limited thereto or thereby. That is, the first pixels PX1 may be arranged on two or more circumferential rows in the first display area DA1. In other words, the first pixels PX1 may be arranged in a radial matrix pattern along the tangential direction ($\hat{\varphi}$) and the radial direction ($\hat{\rho}$). The second to sixth pixels PX2 to PX6 include pixels arranged in the radial matrix pattern in the second to sixth display areas DA2 to DA6, respectively.

Figure 9A:
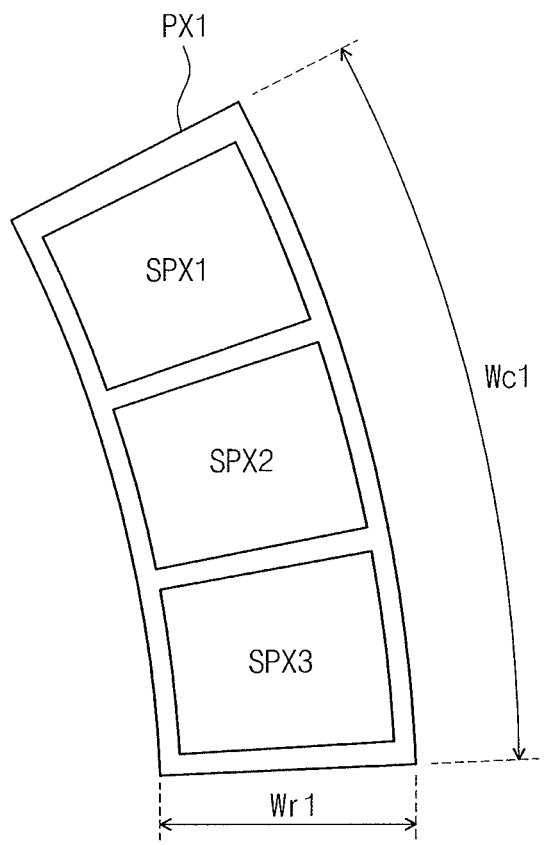
FIGS. 9A and 9B illustrate views showing a pixel shown in FIG. 8 according to an exemplary embodiment of the present disclosure.
Figure 9B:
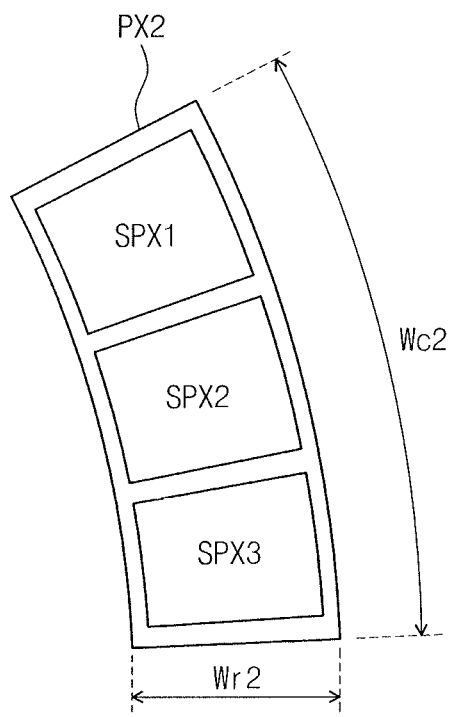

FIGS. 9A and 9B are views showing enlarged views of first and second pixels PX1 and PX2 shown in FIG. 8 according to an exemplary embodiment of the present disclosure. Hereinafter, the first and second pixels PX1 and PX2 will be described with reference to FIGS. 9A and 9B. The first to sixth pixels PX1 to PX6 have similar structure to each other, and thus hereinafter, the first and second pixels PX1 and PX2 will be described as a representative example.

In the present exemplary embodiment, a first pixel area of the first pixel PX1 is greater than a second pixel area of the second pixel PX2. In the present disclosure, the term "area" used herein means a size defined when viewed in a plan view, and the term "pixel area" used herein means an area of the pixel. For instance, when a width in the radial direction ($\hat{\rho}$) of the first pixel PX1 is referred to as a first radial width Wr1, a maximum width in the tangential direction ($\hat{\varphi}$) of the first pixel PX1 is referred to as a first tangential width Wc1, a width in the radial direction ($\hat{\rho}$) of the second pixel PX2 is referred to as a second radial width Wr2, and a maximum width in the tangential direction ($\hat{\varphi}$) of the second pixel PX2 is referred to as a second tangential width Wc2, at least one of the second radial width Wr2 and the second tangential width Wc2 may be smaller than the first radial width Wr1 and the first tangential width Wc1.

Each of the first and second pixels PX1 and PX2 includes first, second, and third sub-pixels SPX1, SPX2, and SPX3. The first, second, and third sub-pixels SPX1, SPX2, and SPX3 are arranged in the tangential direction ($\hat{\varphi}$), but they should not be limited thereto or thereby. That is, at least one sub-pixel of the sub-pixels SPX1 to SPX3 may be arranged to overlap with another sub-pixel of the sub-pixels SPX1 to SPX3 in the radial direction ($\hat{\rho}$).

The sub-pixels SPX1 to SPX3 may display one of primary colors, such as red, green, and blue colors. The colors displayed by the sub-pixels SPX1 to SPX3 should not be limited to the red, green, and blue colors, and the sub-pixels SPX1 to SPX3 may display various colors, e.g., secondary primary colors of white or yellow, cyan, and magenta. Each of the first and second pixels PX1 and PX2 includes two, or four or more sub-pixels.

The area of the first to third sub-pixels SPX1 to SPX3 of the second pixel PX2 may be smaller than the area of the first to third sub-pixels SPX1 to SPX3 of the first pixel PX1. In the present exemplary embodiment, a ratio between the area of the first to third sub-pixels SPX1 to SPX3 of the second pixel PX2 and the area of the first to third sub-pixels SPX1 to SPX3 of the first pixel PX1 may substantially be equal to a ratio between the area of the second pixel PX2 and the area of the first pixel PX1.

Figure 10A:
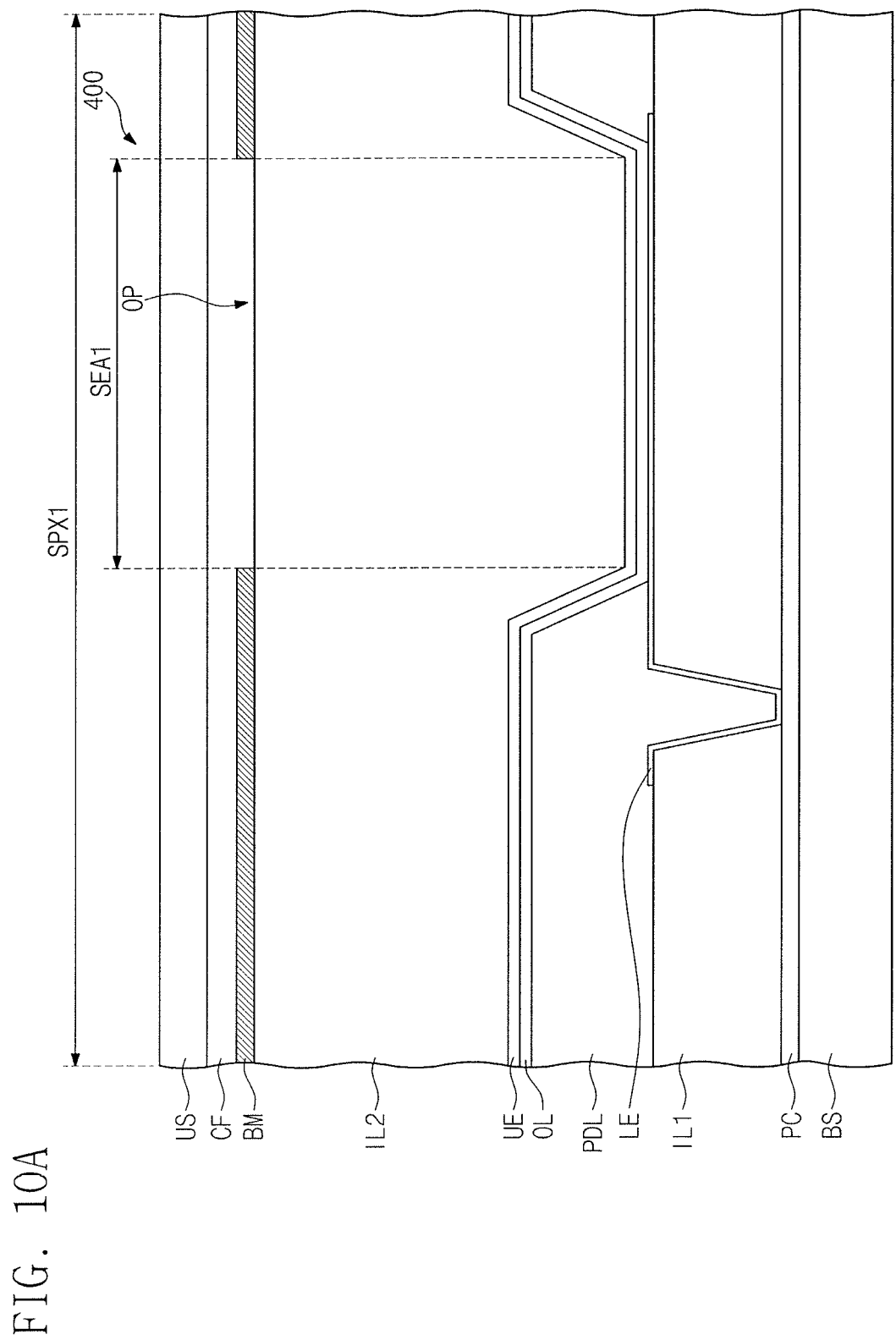
FIG. 10A illustrates a cross-sectional view showing a first sub-pixel shown in FIG. 9A.
Figure 10B:
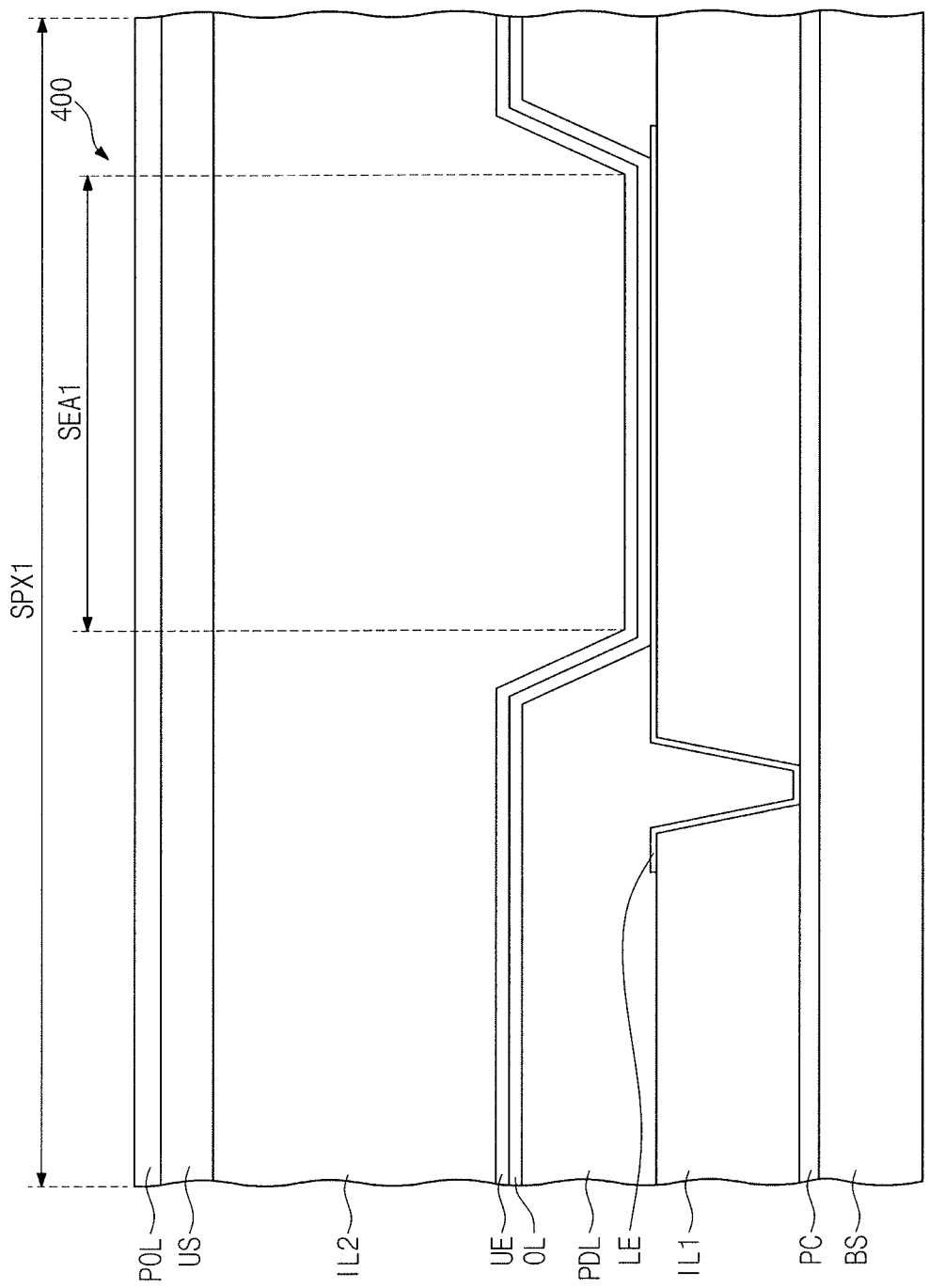
FIG. 10B illustrates a cross-sectional view showing a first sub-pixel according to an exemplary embodiment of the present disclosure.

FIG. 10A is a cross-sectional view showing the first sub-pixel SPX1 shown in FIG. 9A, and FIG. 10B is a cross-sectional view showing the first sub-pixel SPX1 according to an exemplary embodiment of the present disclosure.

Referring to FIG. 10A, the display panel 400 includes a base substrate BS, a pixel circuit layer PC, a first insulating layer IL1, a lower electrode LE, an organic light emitting layer OL disposed on the lower electrode LE, an upper electrode UE disposed on the organic light emitting layer OL, and a second insulating layer IL2 disposed on the upper electrode UE.

In the present exemplary embodiment, the base substrate BS is transparent and includes a rigid glass material or a polymer having flexibility. The pixel circuit layer PC may be disposed over an entire area of the base substrate BS. The pixel circuit layer PC may include, e.g., two or more transistors. The pixel circuit layer PC may include a switching transistor turned on in response to a gate signal applied thereto to transmit a data voltage, and a driving transistor providing a driving current corresponding to the data voltage from the switching transistor to the organic light emitting layer OL.

The first insulating layer IL1 may be disposed over an entire area of the pixel circuit layer PC. The first insulating layer IL1 includes a contact hole formed therethrough to expose a portion of the pixel circuit layer PC. The first insulating layer IL1 has a single-layer structure or a multi-layer structure of an organic material or inorganic material.

In the present exemplary embodiment, the lower electrode LE may be disposed on the first insulating layer IL1. Portions of the lower electrode LE may be disposed in the contact hole to make contact with the pixel circuit layer PC, and may independently receive the driving current from the pixel circuit layer PC.

The display panel 400 may further include a pixel definition layer PDL. The pixel definition layer PDL may be disposed on the lower electrode EL and the first insulating layer IL1. The pixel definition layer PDL may cover an edge of the lower electrode LE and exposes a portion of the lower electrode LE.

In the present exemplary embodiment, the organic light emitting layer OL may be disposed on the pixel definition layer PDL and the lower electrode LE. The organic light emitting layer OL may emit light. As an example, the organic light emitting layer OL may include a white organic light emitting layer generating a white light.

The upper electrode UE may be disposed on the organic light emitting layer OL. The second insulating layer IL2 may be disposed on the upper electrode UE. The second insulating layer IL2 may encapsulate the organic light emitting layer OL. The second insulating layer IL2 may include, for example, a plurality of thin film encapsulation layers. The thin film encapsulation layers may include an organic layer and an inorganic layer, which are alternately stacked on one another.

The display panel 400 may include a black matrix BM, a color filter CF, and an upper substrate US, which are sequentially stacked on the second insulating layer IL2. The color filter CF and the black matrix BM may be directly formed and stacked on the second insulating layer IL2 and disposed on a layer defined between the lower electrode LE and the base substrate BS. In the present exemplary embodiment, the first sub-pixel SPX1 is a red sub-pixel, and the color filter CF is a red color filter.

The black matrix BM may prevent the transistor of the pixel circuit layer PC and the lines disposed on the base substrate BS from being perceived. The black matrix BM and the color filter CF may prevent an external light incident from the upper substrate US from being perceived by the user after being reflected.

A first sub-light emitting area SEA1 may be defined in the first sub-pixel SPX1. The first sub-light emitting area SEA1 may be defined by the pixel definition layer PDL or the black matrix BM. For instance, the first sub-light emitting area SEA1 may be defined corresponding to the lower electrode LE exposed by the pixel definition layer PDL or by an opening OP defined through the black matrix BM.

Each of the lower electrode LE and the upper electrode UE may include a conductive material. In more detail, each of the lower electrode LE and the upper electrode UE may be a transparent electrode, a semi-transparent electrode, or an opaque electrode (or a reflective electrode). In addition, each of the lower electrode LE and the upper electrode UE may have a single-layer structure of a single material or plural different materials or a multi-layer structure of layers formed of different materials.

When each of the upper electrode UE and the lower electrode LE is a transparent electrode or a semi-transparent electrode, each of the upper electrode UE and the lower electrode LE may include, e.g., Li, Ca, LiF/Ca, LiF/Al, Al, Mg, BaF, Ba, Ag, a compound thereof, or a mixture thereof, e.g., a mixture of Ag and Mg, each which is optically thin, or a transparent metal oxide, e.g., indium tin oxide (ITO), indium zinc oxide (IZO), zinc oxide (ZnO), indium tin zinc oxide (ITZO), Mo, Ti, etc. When each of the upper electrode UE and the lower electrode LE is a reflective electrode, each of the upper electrode UE and the lower electrode LE may include, e.g., Ag, Mg, Cu, Al, Pt, Pd, Au, Ni, Nd, Ir, Cr, Li, Ca, LiF/Ca, LiF/Al, Mo, Ti, a compound thereof, or a mixture thereof, e.g., a mixture of Ag and Mg, each which is optically thick.

In the present exemplary embodiment, the first sub-pixel SPX1 may be a rear surface light emitting type or a front surface light emitting type. In the case where the first sub-pixel SPX1 is a rear surface light emitting type, the lower electrode LE may be a transparent or semi-transparent electrode, the upper electrode UE may be a reflective electrode, and the red light may exit to the outside through the lower electrode LE. In the case where the first sub-pixel SPX1 is a front surface light emitting type, the lower electrode LE may be a reflective electrode, the upper electrode UE may be a transparent or semi-transparent electrode, and the light may exit to the outside through the upper electrode UE.

In the present exemplary embodiment, the first sub-pixel SPX1 may have a non-inverted structure or an inverted structure. In the case that the first sub-pixel SPX1 has the non-inverted structure, the lower electrode LE is an anode, the upper electrode UE is a cathode, and a voltage applied to the lower electrode LE is higher than a voltage applied to the upper electrode UE. On the contrary, in the case that the first sub-pixel SPX1 has the inverted structure, the lower electrode LE is the cathode, the upper electrode UE is the anode, and the voltage applied to the lower electrode LE is lower than the voltage applied to the upper electrode UE.

Referring to FIG. 10B, the display panel 400 may not include the black matrix BM and the color filter CF. The display panel 400 may further include a polarizing plate POL disposed on the upper substrate US. The polarizing plate POL may effectively reduce the reflection of the external light. Although not shown in figures, the display panel 400 may further include a retardation plate interposed between the upper substrate US and the polarizing plate POL. The retardation plate may include a λ/4 retardation plate or a λ/2 retardation plate.

In the present exemplary embodiment, the organic light emitting layer OL may include at least one of a red organic light emitting layer, a green organic light emitting layer, and a blue organic light emitting layer. The first sub-pixel SPX1 may be, for example, a red sub-pixel, and the organic light emitting layer OL may include the red organic light emitting layer.

Figure 11A:
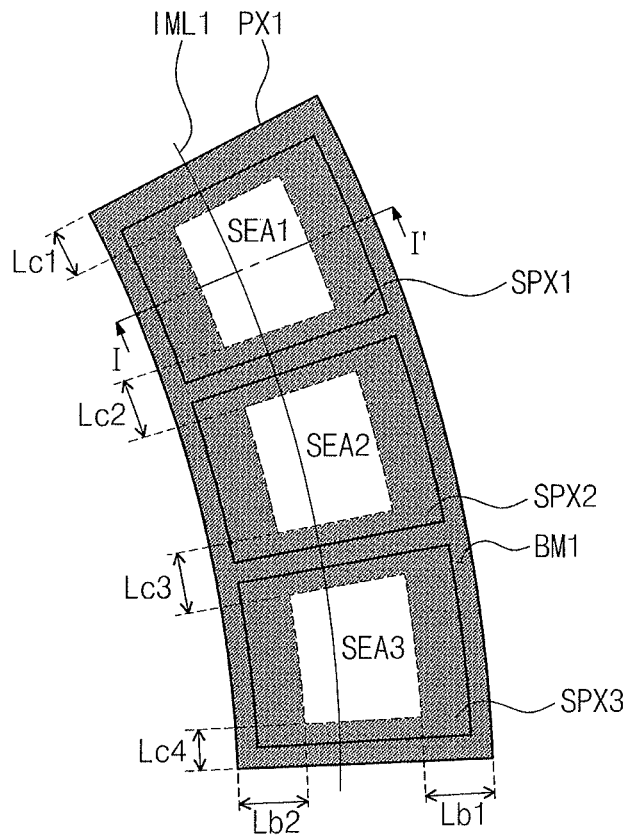
FIGS. 11A and 11B illustrate plan views showing first and second pixels according to an exemplary embodiment of the present disclosure.
Figure 11B:
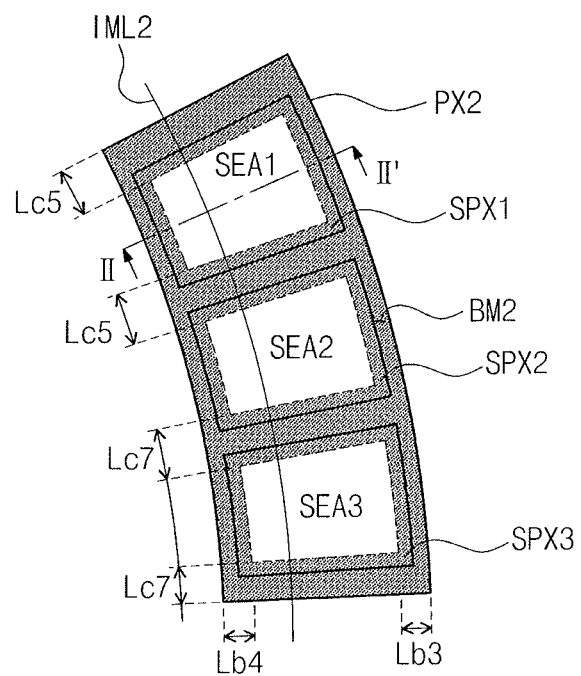
Figure 12A:
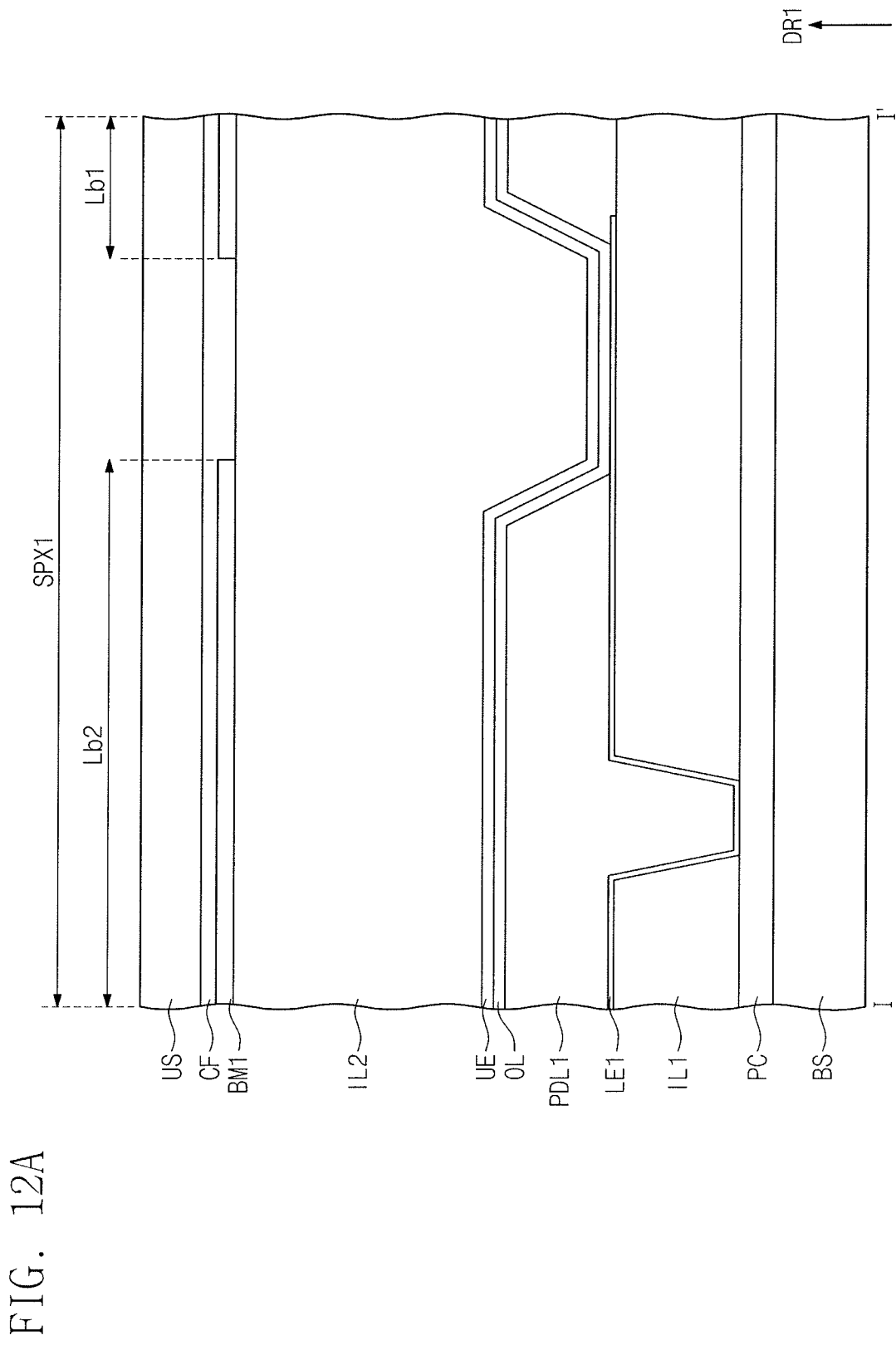

FIGS. 11A and 11B are plan views showing first and second pixels according to an exemplary embodiment of the present disclosure, and FIGS. 12A and 12B are cross-sectional views taken along lines I-I' and II-II' respectively shown in FIGS. 11A and 11B.

Referring to FIGS. 11A and 11B, each of the first to third sub-pixels SPX1 to SPX3 of the first and second pixels PX1 and PX2 may include a sub-light emitting area defined therein. In more detail, the first to third sub-light emitting areas SEA1 to SEA3 are respectively defined in the first to third sub-pixels SPX1 to SPX3. In the present exemplary embodiment, the area of the light emitting area may be defined by sub-light emitting areas of each pixel.

In more detail, the first to third sub-light emitting areas SEA1 to SEA3 of the first pixel PX1 may form a first light emitting area of the first pixel PX1, and a sum of areas of the first to third sub-light emitting areas SEA1 to SEA3 of the first pixel PX1 may be defined as an area of the first light emitting area. Similarly, the first to third sub-light emitting areas SEA1 to SEA3 of the second pixel PX2 may form a second light emitting area of the second pixel PX2, and a sum of areas of the first to third sub-light emitting areas SEA1 to SEA3 of the second pixel PX2 may be defined as an area of the second light emitting area.

In the present exemplary embodiment, an equation of (ES1/PS1)<(ES2/PS2) may be satisfied. "PS1" denotes the first pixel area, "ES1" denotes the area of the first light emitting area of the first pixel PX1, "PS2" denotes the second pixel area, and "ES2" denotes the area of the second light emitting area of the second pixel PX2. In other words, in case of a ratio of the light emitting area to the pixel area, a second light emitting area ratio of the second pixel PX2 may be greater than a first light emitting area ratio of the first pixel PX1.

As a result, a difference in area between the first light emitting area and the second light emitting area is reduced, and thus a difference in brightness caused by the difference between the first and second pixel areas may be reduced. Thus, the brightness of the first and second pixels PX1 and PX2 becomes uniform.

Referring to FIGS. 12A and 12B, the first and second pixels PX1 and PX2 include first and second black matrices BM1 and BM2, respectively. The first black matrix BM1 is overlapped with the first pixel PX1 in the first direction DR1 and defines the first to third sub-light emitting areas SEA1 to SEA3 of the first pixel PX1. The second black matrix BM2 is overlapped with the second pixel PX2 in the first direction DR1 and defines the first to third sub-light emitting areas SEA1 to SEA3 of the second pixel PX2. In the present exemplary embodiment, the first black matrix BM1 has an area greater than an area of the second black matrix BM2.

In the present exemplary embodiment, a first width in the radial direction ($\hat{\rho}$) of the first black matrix BM1 is greater than a width in the radial direction ($\hat{\rho}$) of the second black matrix BM2. The first width of the first black matrix BM1 corresponds to a sum of widths Lb1 and Lb2 of portions of the first black matrix BM1, which face each other in the radial direction ($\hat{\rho}$) such that the first sub-light emitting area SEA1 of the first pixel PX1 is disposed between the portions of the first black matrix BM1. Similarly, the second width of the second black matrix BM2 corresponds to a sum of widths Lb3 and Lb4 of portions of the second black matrix BM2, which face each other in the radial direction ($\hat{\rho}$) such that the first sub-light emitting area SEA1 of the second pixel PX2 is disposed between the portions of the second black matrix BM2.

In the present exemplary embodiment, a third width in the tangential direction ($\hat{\varphi}$) of the first black matrix BM1 is substantially equal to a fourth width in the tangential direction ($\hat{\varphi}$) of the second black matrix BM2. The third width corresponds to a sum of widths Lc1 to Lc4 of portions of the first black matrix BM1 overlapped with an imaginary line IML1 penetrating through the first pixel PX1 and substantially parallel to the tangential direction ($\hat{\varphi}$). Similarly, the fourth width corresponds to a sum of widths Lc5 to Lc8 of portions of the second black matrix BM2 overlapped with an imaginary line IML2 penetrating through the second pixel PX2 and substantially parallel to the tangential direction ($\hat{\varphi}$). In addition, the third width may be the width (i.e., one of Lc1, Lc2, Lc3, and Lc4) in the tangential direction ($\hat{\varphi}$) of the first black matrix BM1 disposed between the sub-pixels adjacent to each other among the first to third sub-pixels SPX1 to SPX3 of the first pixel PX1, and the fourth width may be the width (i.e., one of Lc5, Lc6, Lc7, and Lc8) in the tangential direction ($\hat{\varphi}$) of the second black matrix BM2 disposed between the sub-pixels adjacent to each other among the first to third sub-pixels SPX1 to SPX3 of the second pixel PX2.

As shown in FIGS. 12A and 12B, the first pixels PX1 include a first pixel definition layer PDL1. The first pixel definition layer PDL1 defines the first to third sub-light emitting areas SEA1 to SEA3 of the first pixel PX1. In more detail, since only a portion of the organic light emitting layer OL corresponding to a lower electrode LE1 exposed without being covered by the first pixel definition layer PDL1 emits a light, the first to third light emitting areas SEA1 to SEA3 may be defined corresponding to the lower electrode LE1 exposed without being covered by the first pixel definition layer PDL1. In other words, the first pixel definition layer PDL1 may expose the lower electrode LE1 by the first light emitting area.

Similarly, the second pixels PX2 include a second pixel definition layer PDL2. The second pixel definition layer PDL2 defines the first to third sub-light emitting areas SEA1 to SEA3 of the second pixel PX2. In more detail, since only a portion of the organic light emitting layer OL corresponding to a lower electrode LE2 exposed without being covered by the second pixel definition layer PDL2 emits a light, the first to third light emitting areas SEA1 to SEA3 may be defined corresponding to the lower electrode LE2 exposed without being covered by the second pixel definition layer PDL2. In other words, the second pixel definition layer PDL2 may expose the lower electrode LE2 by the second light emitting area.

In the present exemplary embodiment, the first pixel definition layer PDL1 has an area greater than an area of the second pixel definition layer PDL2. In addition, a ratio of the area of the first pixel definition layer PDL1 to the first pixel area may be greater than a ratio of the area of the second pixel definition layer PDL2 to the second pixel area. Accordingly, a second light emitting area ratio of the second pixel PX2 may be greater than a first light emitting area ratio of the first pixel PX1.

Accordingly, a difference in area between the light emitting area of the organic light emitting layer OL of the first pixel PX1 and the light emitting area of the organic light emitting layer OL of the second pixel PX2 is reduced, and thus a difference in brightness caused by the difference between the first and second pixel areas may be reduced. Thus, the brightness of the first and second pixels PX1 and PX2 becomes uniform.

Figure 13A:
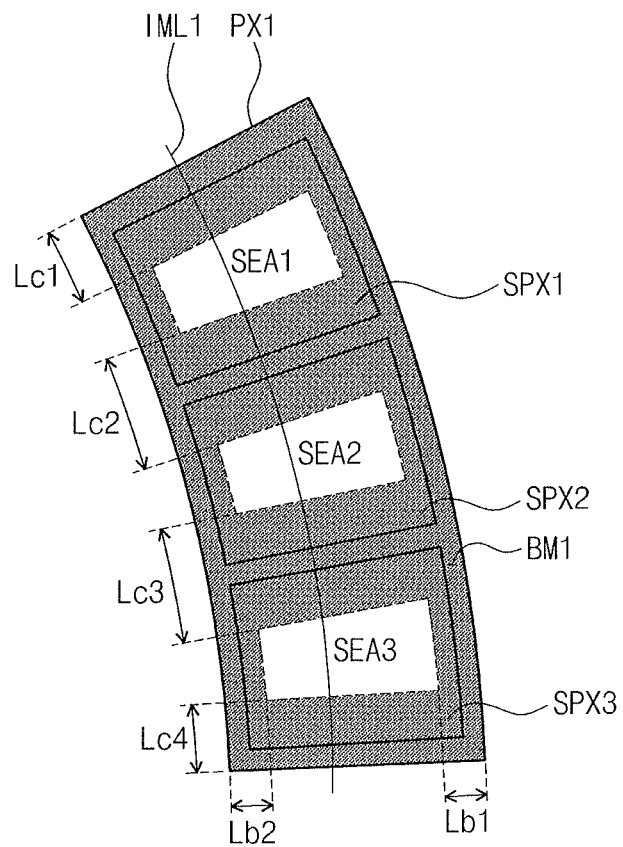
FIGS. 13A and 13B illustrate plan views showing first and second pixels according to an exemplary embodiment of the present disclosure.
Figure 13B:
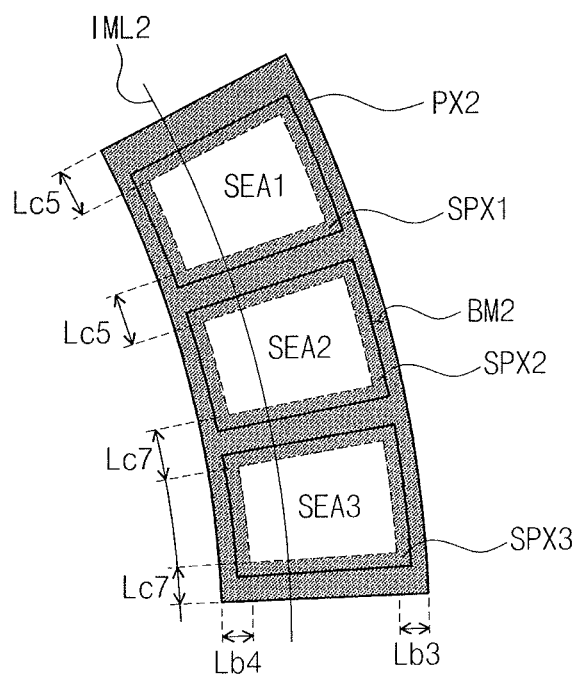

FIGS. 13A and 13B are plan views showing first and second pixels according to an exemplary embodiment of the present disclosure. Referring to FIGS. 13A and 13B, the third and fourth widths may be different from each other. For instance, the fourth width may be greater than the third width. In addition, the first width may be greater than the second width.

In more detail, the sum of the widths Lc1 to Lc4 of the portions of the first black matrix BM1 may be greater than the sum of the widths Lc5 to Lc8 of the portions of the second black matrix BM2. In addition, the width (i.e., one of Lc1, Lc2, Lc3, and Lc4) in the tangential direction ($\hat{\varphi}$) of the first black matrix BM1 disposed between the sub-pixels SPX1 to SPX3 adjacent to each other may be greater than the width (i.e., one of Lc5, Lc6, Lc7, and Lc8) in the tangential direction ($\hat{\varphi}$) of the second black matrix BM2 disposed between the sub-pixels SPX1 to SPX3 adjacent to each other.

Figure 14:
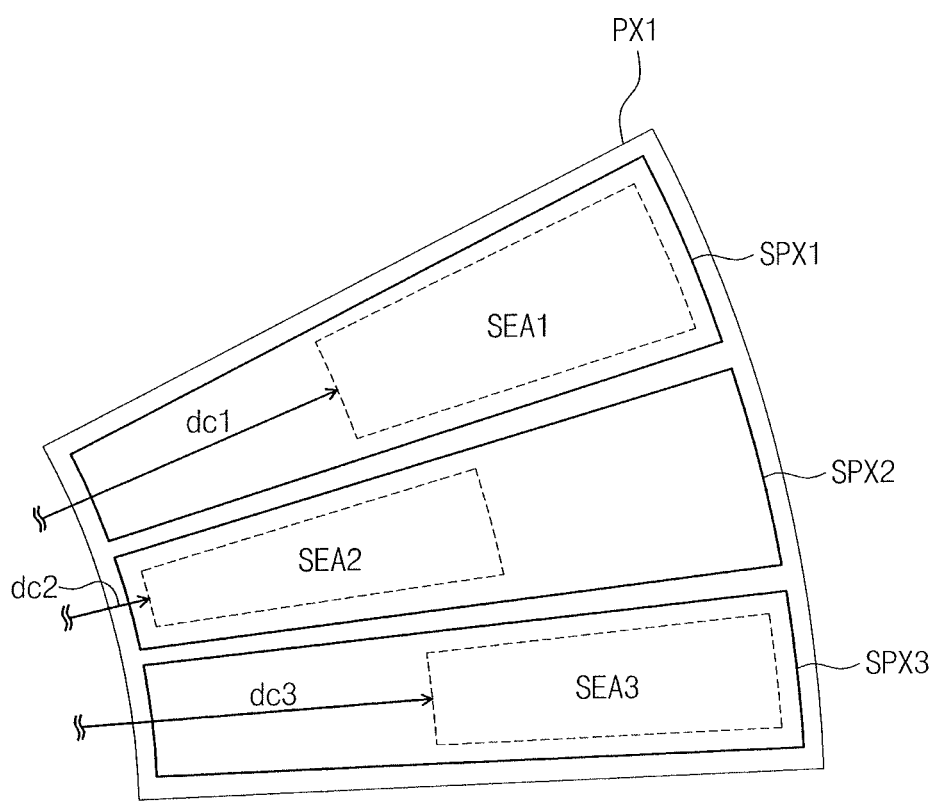
FIG. 14 illustrates an enlarged view showing a first pixel according to an exemplary embodiment of the present disclosure.

FIG. 14 is an enlarged view showing a first pixel according to an exemplary embodiment of the present disclosure.

Referring to FIG. 14, a portion of the second sub-light emitting area SEA2 of the first pixel PX1 may be overlapped with the first and third sub-light emitting areas SEA1 and SEA3 of the second pixel PX1 in the tangential direction ($\hat{\varphi}$). The first to the third sub-light emitting areas SEA1 to SEA3 are arranged in zigzag form in the tangential direction ($\hat{\varphi}$). In more detail, a first minimum distance dc1 that is smallest between the first sub-light emitting area SEA1 and the center of the display panel 400 may be different from a second minimum distance dc2 that is smallest between the second sub-light emitting area SEA2 and the center of the display panel 400. The first minimum distance dc1 may be greater than the second minimum distance dc2 and equal to a third minimum distance dc3 that is smallest between the third sub-light emitting area SEA5 and the center of the display panel 400.

Figure 15:
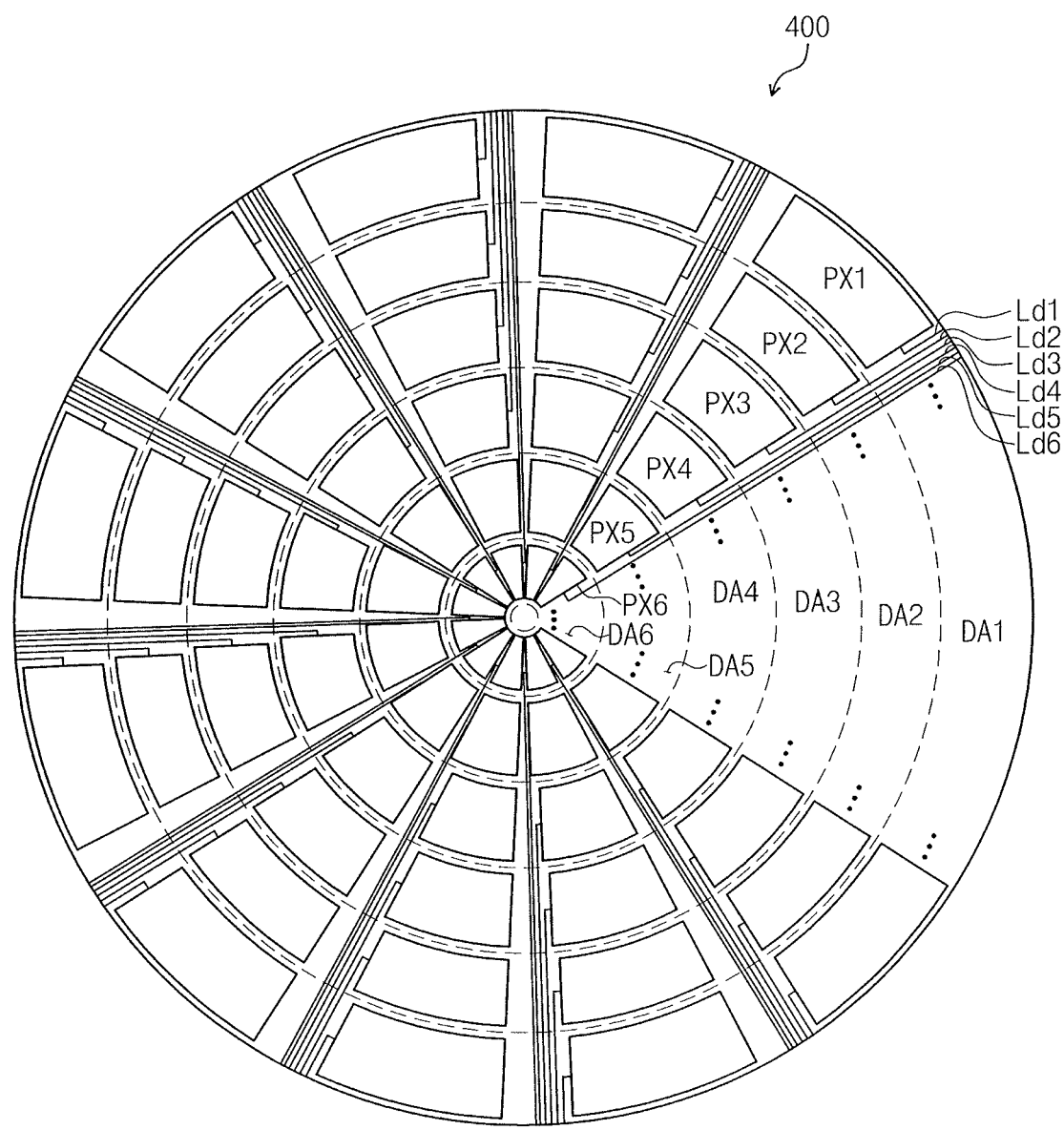
FIG. 15 illustrates a plan view showing a display panel according to an exemplary embodiment of the present disclosure.
Figure 16:
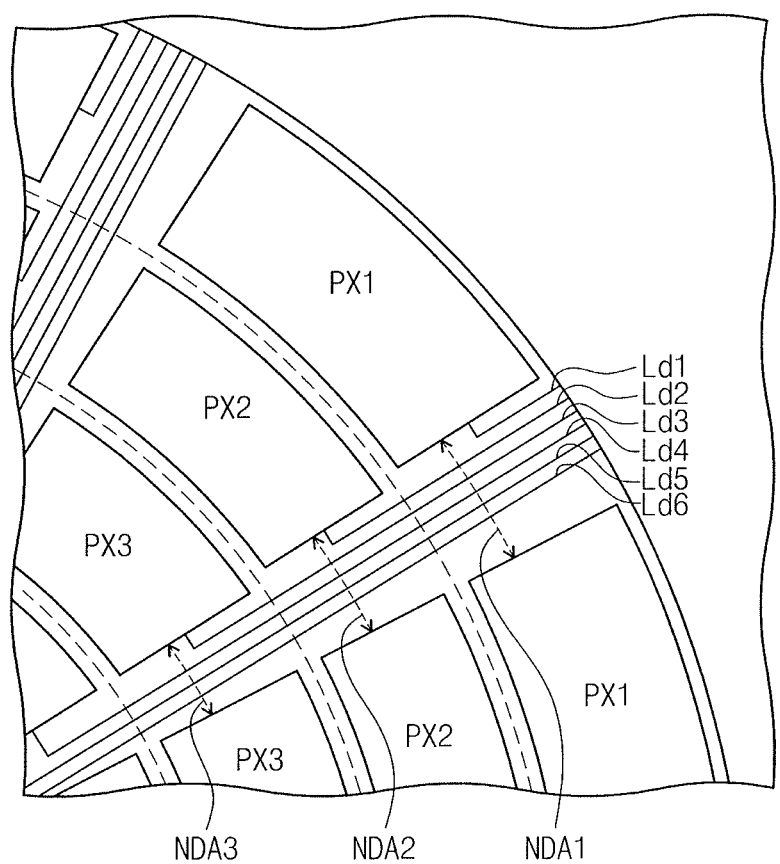
FIG. 16 illustrates an enlarged view showing first and second display lines shown in FIG. 15.

FIG. 15 is a plan view showing a display panel according to an exemplary embodiment of the present disclosure, and FIG. 16 is an enlarged view showing first and second display lines shown in FIG. 15.

In FIG. 15, a display panel 400 has similar structure and function as those of the display panel 400 shown in FIG. 13, and thus different features of additional display lines will be described in detail. Referring to FIG. 15, the display panel may further include display lines. The display lines may include first to sixth display lines Ld1 to Ld6 respectively connected to the first to sixth pixels PX1 to PX6.

In detail, each of the first to sixth display lines Ld1 to Ld6 includes at least one of a gate line transmitting a gate signal, a data line transmitting a data voltage, and a control line transmitting a light emitting control signal. The first to sixth display lines Ld1 to Ld6 are substantially parallel to the radial direction ($\hat{\rho}$) and arranged in the tangential direction ($\hat{\varphi}$). The first to sixth display lines Ld1 to Ld6 are similar to each other, and thus the first and second display lines Ld1 and Ld2 will be described in detail as a representative example. Descriptions of the first and second display lines Ld1 and Ld2 may be similarly applied to other display lines.

Referring to FIG. 16, the first display line Ld1 includes the gate line and the data line, and applies the gate signal and the data voltage to the first pixel PX1. The first pixel PX1 displays the image in response to the gate signal and the data voltage from the first display line Ld1.

The first display line Ld1 is disposed between two first pixels PX1 adjacent to each other in the tangential direction ($\hat{\varphi}$). In the present exemplary embodiment, the first display line Ld1 is spaced apart from the second pixel PX2 in the radial direction ($\hat{\rho}$) and not overlapped with the second pixel PX2 in the tangential direction ($\hat{\varphi}$). In other words, the first display line Ld1 may not be disposed between the second to sixth pixels PX2 to PX6. In the present exemplary embodiment, the first display line Ld1 may be overlapped with the second pixel PX2 in the radial direction ($\hat{\rho}$).

In the present exemplary embodiment, the second display line Ld2 includes the gate line and the data line, and applies the gate signal and the data voltage to the second pixel PX2. The second pixel PX2 displays the image in response to the gate signal and the data voltage from the second display line Ld2.

The second display line Ld2 is disposed between two second pixels PX2 adjacent to each other in the tangential direction ($\hat{\varphi}$) and between two first pixels PX1 adjacent to each other in the tangential direction ($\hat{\varphi}$). In the present exemplary embodiment, the second display line Ld2 is spaced apart from the third pixel PX3 in the radial direction ($\hat{\rho}$) and not overlapped with the third pixel PX3 in the tangential direction ($\hat{\varphi}$). In other words, the second display line Ld2 may not be disposed between the third to sixth pixels PX3 to PX6. In the present exemplary embodiment, the second display line Ld2 may be overlapped with the third pixel PX3 in the radial direction ($\hat{\rho}$).

In the above-mentioned structure, a width of a non-display area NDA2 between the second pixels PX2 adjacent to each other in the tangential direction ($\hat{\varphi}$) and a width of a non-display area NDA3 between the third pixels PX3 adjacent to each other in the tangential direction ($\hat{\varphi}$) are decreased, and the areas of the second and third pixel areas are increased. Accordingly, the difference in pixel areas between the first to third pixels PX1 to PX3 is reduced, and the brightness of the first to third pixels PX1 to PX3 becomes uniform.

Figure 17:
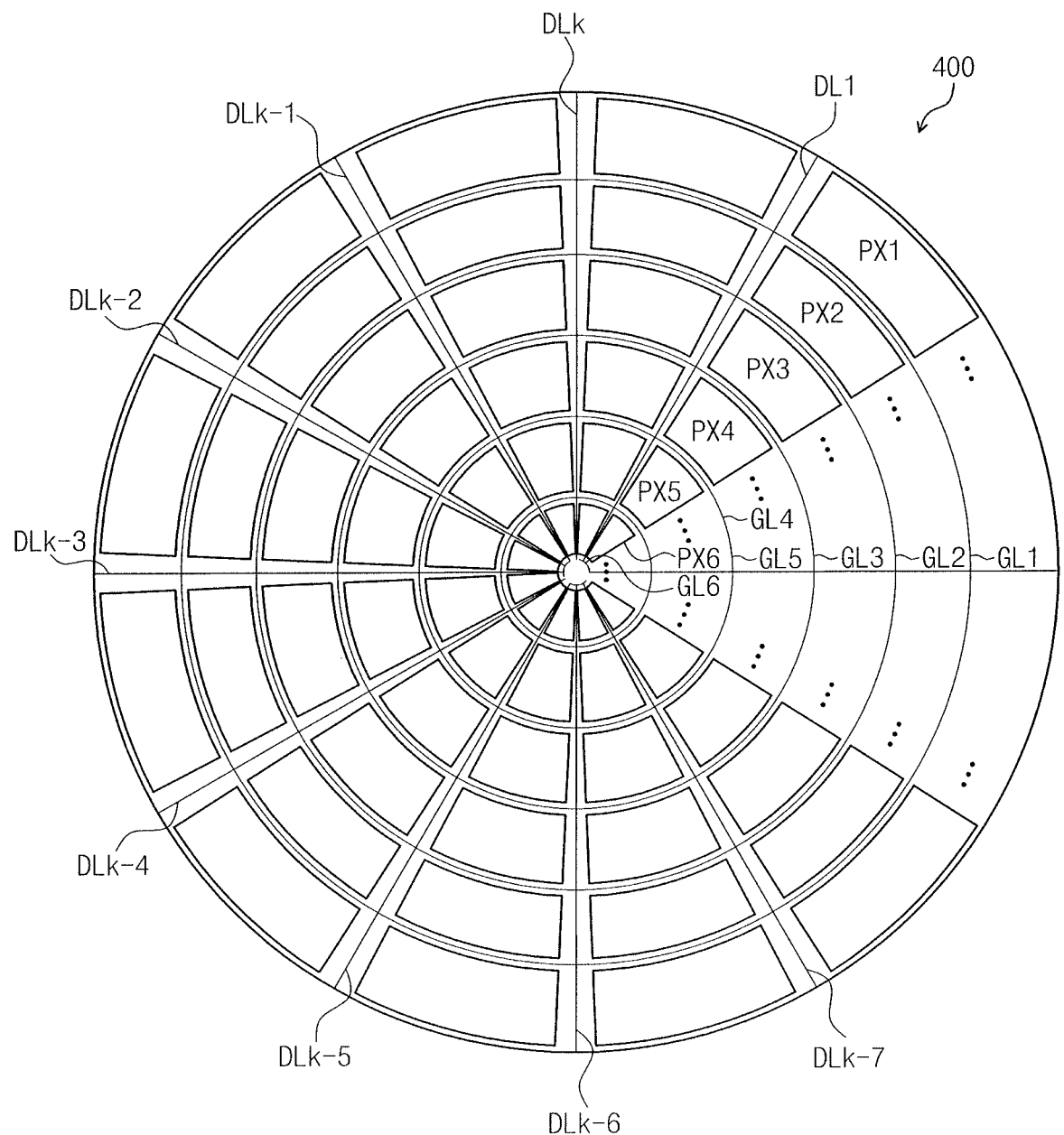
FIG. 17 illustrates a plan view showing a display panel according to an exemplary embodiment of the present disclosure.
Figure 18:
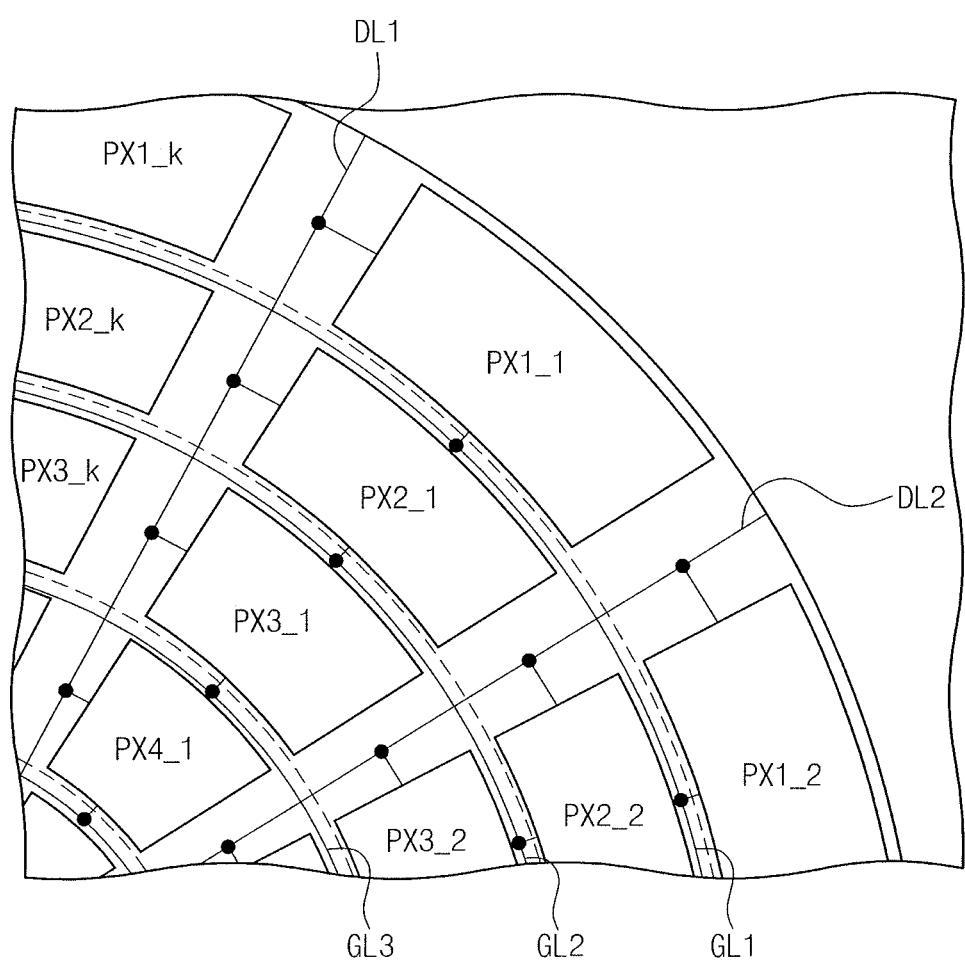
FIG. 18 illustrates an enlarged view showing first and second display lines shown in FIG. 17.

FIG. 17 is a plan view showing a display panel according to an exemplary embodiment of the present disclosure, and FIG. 18 is an enlarged view showing first and second display lines shown in FIG. 17.

In FIG. 17, a display panel 400 has similar structure and function as those of the display panel 400 shown in FIG. 7A, and thus different features of additional display lines will be described in detail. Referring to FIG. 17, the display panel 400 may further include display lines.

In detail, the display lines include first to sixth gate lines GL1 to GL6 and first to k-th data lines DL1 to DLk. The first to sixth gate lines GL1 to GL6 are respectively connected to the first to sixth pixels PX1 to PX6. Each of the first to sixth pixels PX1 to PX6 is provided in a number of "k" to correspond to the first to k-th data lines DL1 to DLk along the tangential direction ($\hat{\varphi}$).

The first to sixth gate lines GL1 to GL6 are substantially parallel to the tangential direction ($\hat{\varphi}$) and arranged in the radial direction ($\hat{\rho}$). The first to k-th data lines DL1 to DLk are substantially parallel to the radial direction ($\hat{\rho}$) and arranged in the tangential direction ($\hat{\varphi}$). Since the first to sixth gate lines GL1 to GL6 are similar to each other, the first and second gate lines GL1 and GL2 will be described in detail as a representative example. Descriptions of the first and second gate lines GL1 and GL2 may be similarly applied to other gate lines. In addition, the first to k-th data lines DL1 to DLk are similar to each other, and thus the first data line DL1 will be described as a representative example. Descriptions of the first data line DL1 may be similarly applied to other data lines.

Referring to FIG. 18, a first gate line GL1 transmits a first gate signal, and a first data line DL1 transmits a data voltage. A first pixel PX1_1 displays an image in response to the first gate signal provided through the first gate line GL1 and the data voltage provided through the first data line DL1.

The first data line DL1 is disposed between two first pixels PX1_1 and PX1_k adjacent to each other in the tangential direction ($\hat{\varphi}$) and two second pixels PX2_1 and PX2_k adjacent to each other in the tangential direction ($\hat{\varphi}$). The first gate line GL1 is disposed between the first pixels PX1_1 to PX1_k and the second pixels PX2_1 to PX2_k.

Similarly, a second gate line GL2 transmits a second gate signal, and the first data line DL1 transmits the data voltage. A second pixel PX2_1 displays an image in response to the second gate signal provided through the second gate line GL2 and the data voltage provided through the first data line DL1. The second gate line GL2 is disposed between the second pixels PX2_1 to PX2_k and the third pixels PX3_1 to PX3_k.

Figure 19:
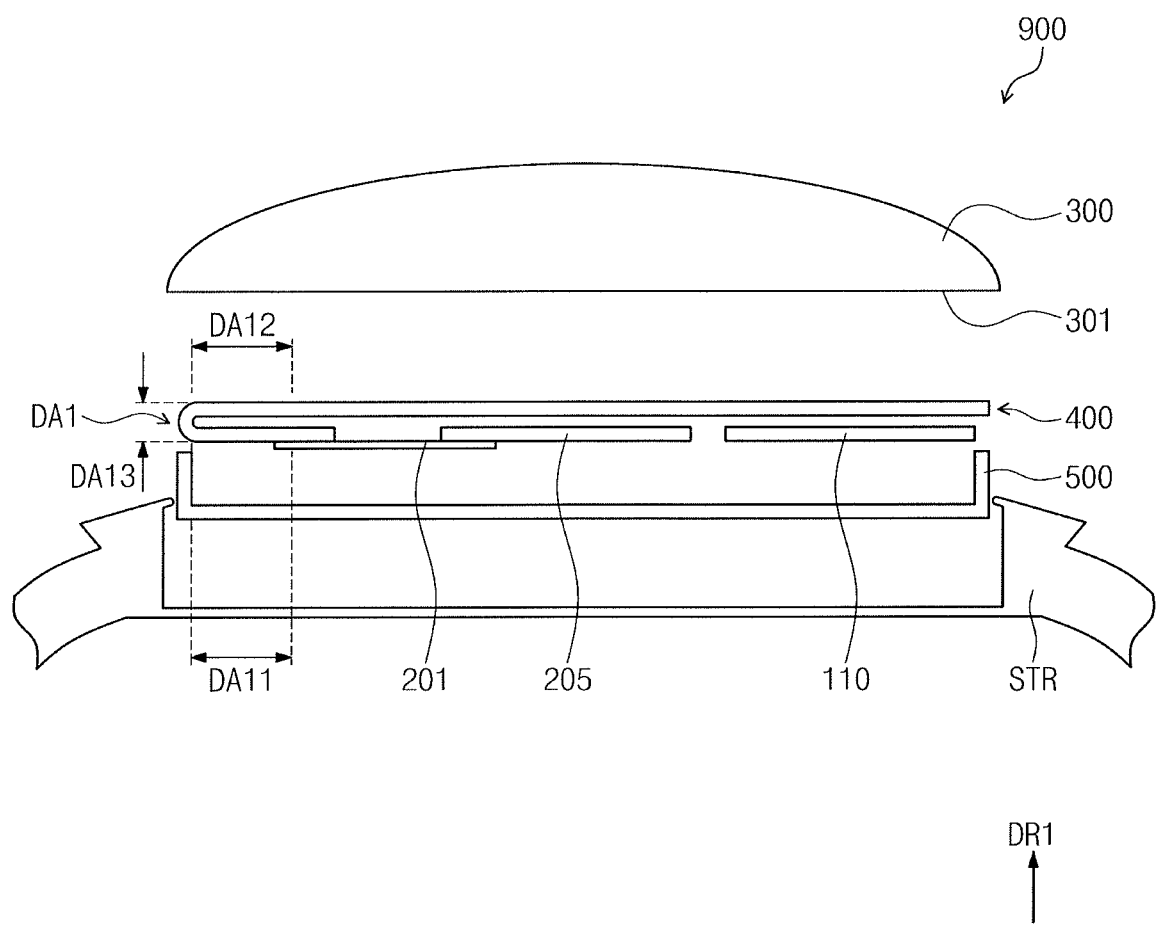
FIG. 19 illustrates a cross-sectional view showing a display module according to an exemplary embodiment of the present disclosure.
Figure 20:
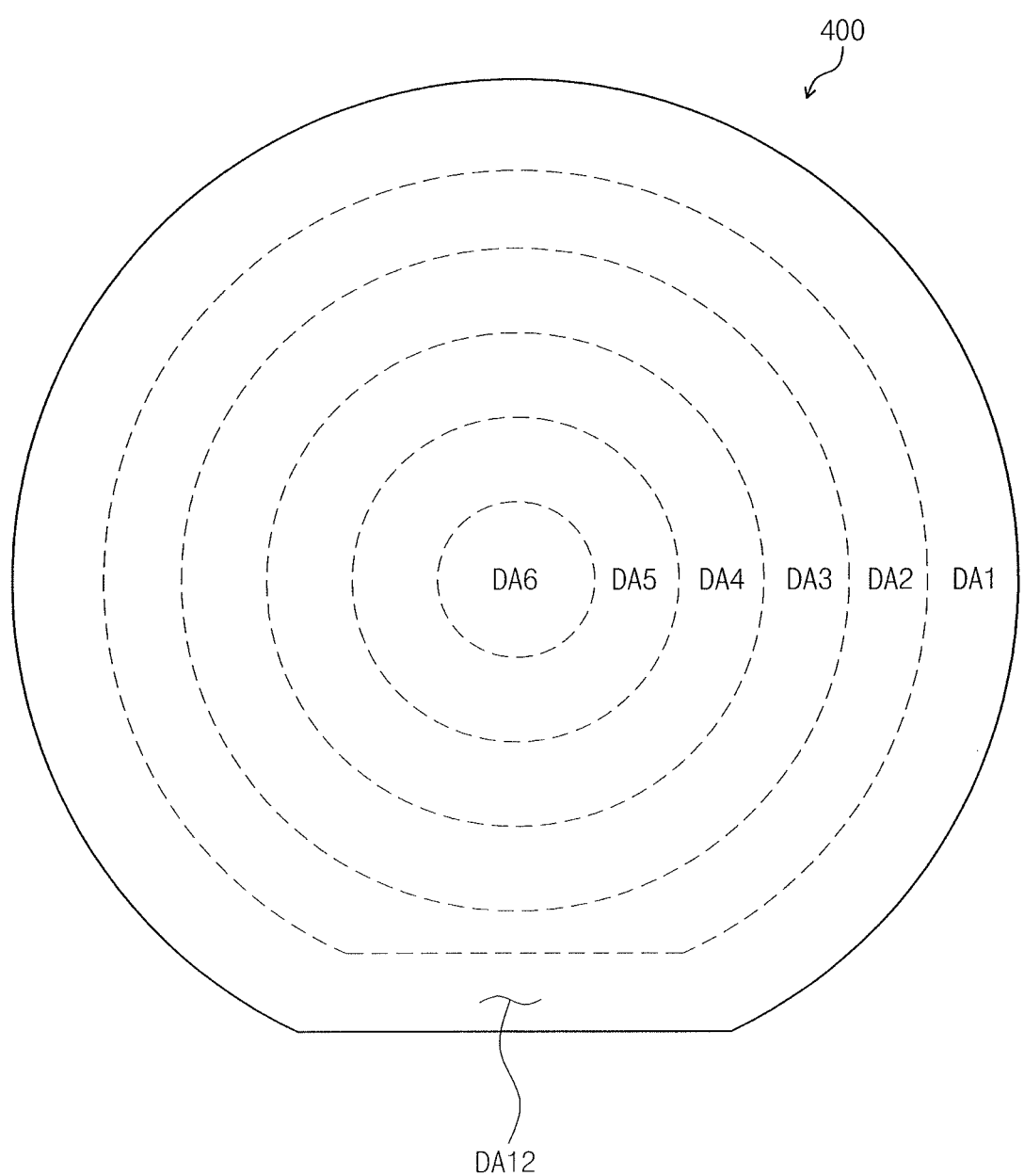
FIG. 20 illustrates a plan view showing a display panel shown in FIG. 19.
Figure 21:
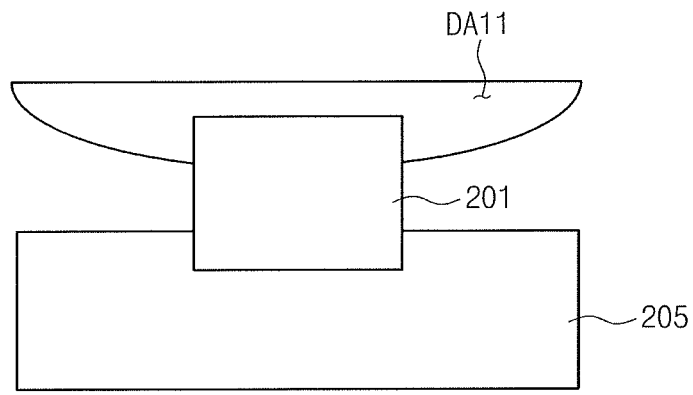
FIG. 21 illustrates a rear view showing a display panel shown in FIG. 19.

FIG. 19 is a cross-sectional view showing a display module according to an exemplary embodiment of the present disclosure, FIG. 20 is a plan view showing a display panel shown in FIG. 19, and FIG. 21 is a rear view showing a display panel shown in FIG. 19.

Referring to FIG. 19, a first display area DA1 includes a first portion DA11, a second portion DA12 and a bending portion DA13 connecting the first portion DA11 and the second portion DA12. The bending portion DA13 is bended such that the first portion DA11 is folded downward. For example, the first portion DA11 may be connected to the second portion DA12, and may be folded away from the second portion DA12 toward the housing 500 such that the first portion DA11 and the second portion DA12 face each other in the first direction DR1. In other words, the first portion DA11 is folded to allow the second portion DA12 to be interposed between the window member 300 and the first portion DA11.

Referring to FIGS. 20 and 21, a display surface of the second portion DA12 faces a lower surface 301 of the window member 300. A display surface of the first portion DA11 faces an upper surface of the housing 500. In other words, the lower surface of the first portion DA11 may be opposite to the lower surface of the window member 300.

In the present exemplary embodiment, the display module 200 may further include a flexible printed circuit board 201 and a display printed circuit board 205. The flexible printed circuit board 201 connects the display panel 400 and the display printed circuit board 205. One end of the flexible printed circuit board 201 is connected to an edge of the first portion DA11, and the other end of the flexible printed circuit board 201 is connected to the display printed circuit board 205. A connection pad is disposed at the edge of the first portion DA11. The connection pad connects the lines of the display panel 400 to the flexible printed circuit board 201.

The second portion DA12 is disposed between the flexible printed circuit board 201 and the window member 300, and between the display printed circuit board 205 and the window member 300.

Since the flexible printed circuit board 201 is connected to the display panel 400 through a pad portion disposed on the first portion DA11, a black matrix used to prevent the pad portion from being perceived is not required. As a result, a width of a bezel of the display panel 400 may be effectively reduced.

Figure 22:
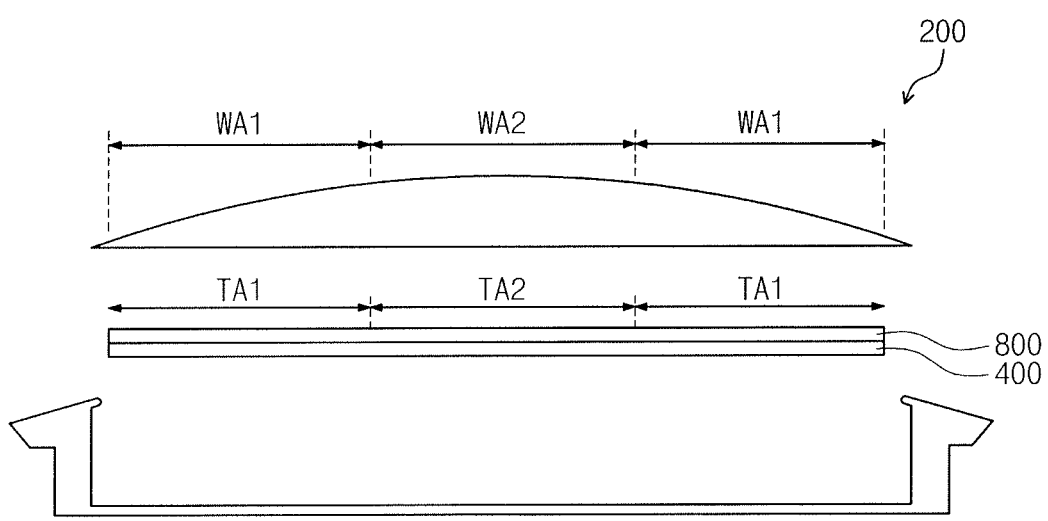
FIG. 22 illustrates a cross-sectional view showing a display module according to an exemplary embodiment of the present disclosure.

FIG. 22 is a cross-sectional view showing a display module according to an exemplary embodiment of the present disclosure.

In FIG. 22, a display module 200 has similar structure and function as those of the display module 200 shown in FIG. 3, and thus different features of additional touch module 800 will be described in detail. Referring to FIG. 22, the display module 200 includes the touch module 800.

In detail, the touch module 800 is disposed between the window member 300 and the display panel 400. In the present exemplary embodiment, the touch module 800 includes a first touch area TA1 and a second touch area TA2, which are distinguished from each other in the horizontal direction. The first and second touch areas TA1 and TA2 are respectively disposed under the first and second window areas WA1 and WA2. The first touch area TA1 senses a first external input applied to the first window area WA1 to generate a touch signal, and the second touch area TA2 senses a second external input applied to the second window area WA2 to generate the touch signal.

As described above, the second thickness of the second window area WA2 is greater than the first thickness of the first window area WA1. Accordingly, an intensity of the second external input applied to the second touch area TA2 after crossing through the second window area WA2 may be smaller than an intensity of the first external input applied to the first touch area TA1 after crossing the first window area WA1.

In the present exemplary embodiment, a sensitivity of the second touch area TA2 may be higher than a sensitivity of the first touch area TA1. Therefore, the touch module 800 may compensate for a difference in intensity between the first and second external inputs, and thus the touch module 800 may accurately sense the external input. To improve the intensity of the second touch area TA2 more than that of the first touch area TA1, a size of the touch electrodes, the number of the touch electrodes per a unit area, a distance between the touch electrodes, a process of the touch signal and the sensing signal may be controlled.

Figure 23A:
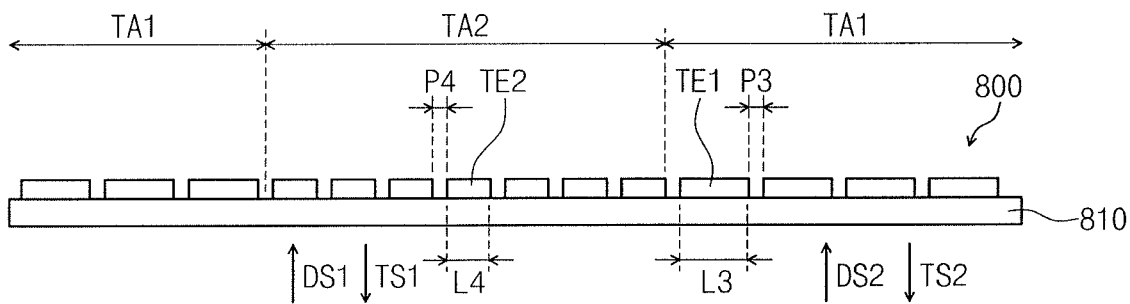
FIG. 23A illustrates an enlarged cross-sectional view showing a touch module shown in FIG. 22.

FIG. 23A is an enlarged cross-sectional view showing a touch module shown in FIG. 22, and FIGS. 23B to 23D are plan views showing touch modules according to an exemplary embodiment of the present disclosure.

Referring to FIG. 23A, the touch module 800 includes a base layer 810 and a touch electrode disposed on the base layer 810. In the present exemplary embodiment, the touch electrode includes a first touch electrode TE1 disposed in the first touch area TA1 and a second touch electrode TE2 disposed in the second touch area TA2.

The touch module 800 may be, e.g., a self-capacitance type or a mutual capacitance type. The first and second touch electrodes TE1 and TE2 may be deformed, arranged, and connected corresponding to the type of the touch module 800.

In the present exemplary embodiment, the size of the first touch electrode TE1 may be greater than the size of the second touch electrode TE2. A third length L3 in the horizontal direction of the first touch electrode TE1 may be greater than a fourth length L4 in the horizontal direction of the second touch electrode TE2.

Figure 23B:
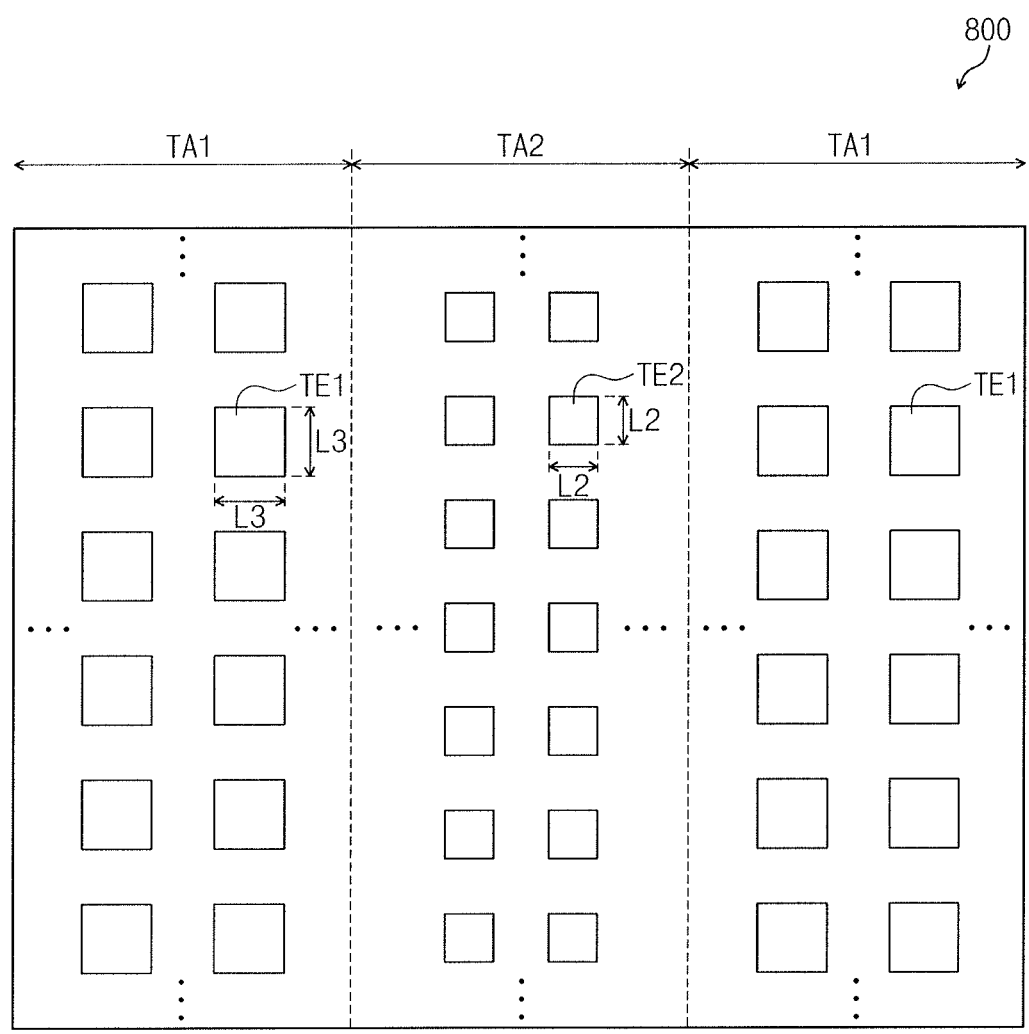
FIGS. 23B to 23D illustrate plan views showing touch modules according to an exemplary embodiment of the present disclosure.

Referring to FIG. 23B, a first electrode area of the first touch electrode TE1 may be greater than a second electrode area of the second touch electrode TE2, and a distance between two first touch electrodes TE1 adjacent to each other may be substantially equal to a distance between two second touch electrodes TE2 adjacent to each other. In the present exemplary embodiment, each of the first and second touch electrodes TE1 and TE2 may have a substantially square shape.

In the present exemplary embodiment, the number of the second touch electrodes TE2 per the unit area may be greater than the number of the first touch electrodes TE1 per the unit area. Accordingly, the difference in intensity between the first and second external inputs may be compensated, and as a result, the touch module 800 may accurately sense the external input.

Figure 23C:
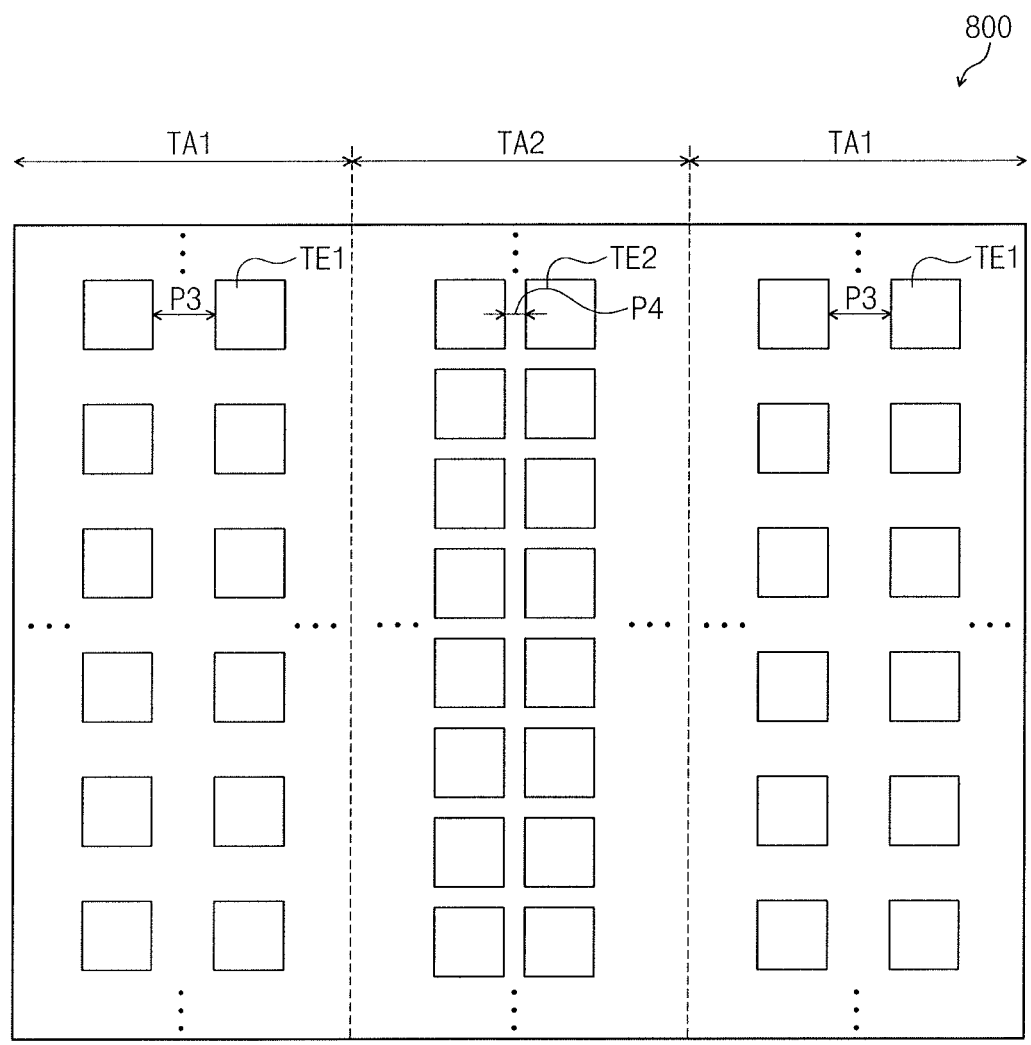

Referring to FIG. 23C, a third distance P3 in the horizontal direction between two first touch electrodes TE1 adjacent to each other may be greater than a fourth distance P4 in the horizontal direction between two second touch electrodes TE2 adjacent to each other, and the first and second pixel areas may be equal to each other, but they should not be limited thereto or thereby. That is, the first and second distances P1 and P2 may be equal to each other. As a result, an intensity of a fringe field formed between the second touch electrodes TE2 adjacent to each other may be greater than an intensity of a fringe field formed between the first touch electrodes TE1 adjacent to each other. Accordingly, the difference in intensity between the first and second external inputs may be compensated, and thus the accuracy of the touch module 800 with respect to the external input may be improved.

Figure 23D:
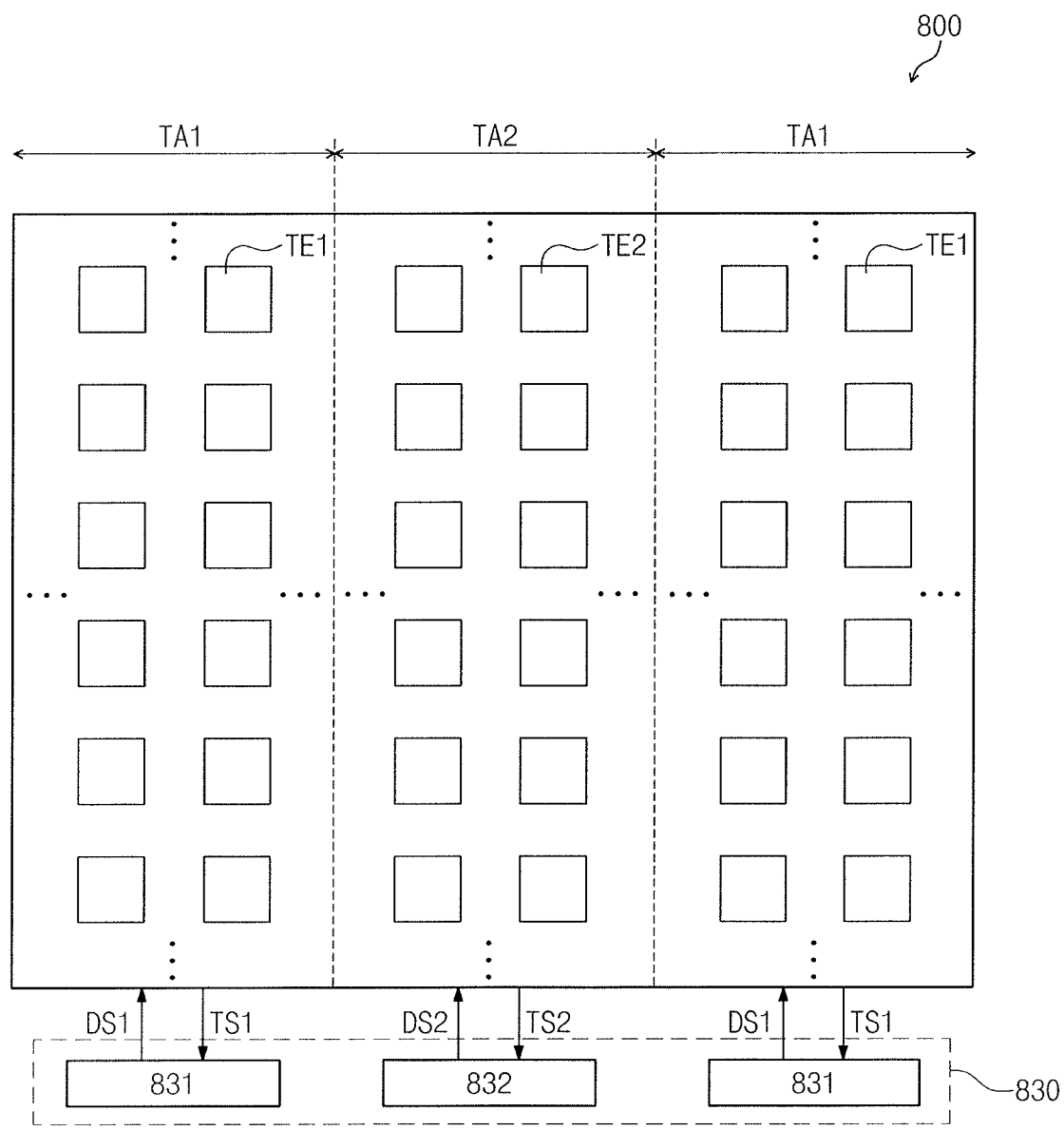

Referring to FIG. 23D, a first sensing signal DS1 is applied to the first touch area TA1. The first sensing signal DS1 may be a signal provided to the first touch electrode TE1 to sense the first external input. Similarly, a second sensing signal DS2 is applied to the second touch area TA2. The second sensing signal DS2 may be a signal provided to the second touch electrode TE2 to sense the second external input.

In the present exemplary embodiment, the touch module 800 may further include a sensing controller 830. The sensing controller 830 is disposed on one of the base layer 810, the display printed circuit board 205 (refer to FIG. 19), or the electronic module substrate 110 (refer to FIG. 19). The sensing controller 830 includes a first sub-sensing controller 831 and a second sub-sensing controller 832. The first and second sub-sensing controllers 831 and 832 respectively generate the first and second sensing signals DS1 and DS2 and respectively receive the first and second touch signals TS1 and TS2.

The first touch electrode TE1 of the first touch area TA1 outputs the first touch signal TS1 in response to the first sensing signal DS1, and the second touch electrode TE2 of the second touch area TA2 outputs the second touch signal TS2 in response to the second sensing signal DS2. The sensing controller 830 calculates a coordinate of the external input using the first and second touch signals TS1 and TS2.

The first and second sub-sensing controller 831 and 832 may generate the first and/or second sensing signals DS1 and/or DS2 to have different intensities such that the difference in intensity between the first and second external inputs is compensated. For instance, since the intensity of the first external input is greater than the intensity of the second external input, the first and second sub-sensing controllers 831 and 832 may increase the intensity of the second sensing signal DS2. Accordingly, the difference in intensity between the first and second external inputs may be compensated, and thus the accuracy of the touch module 800 with respect to the external input may be improved.

The present disclosure should not be limited thereto or thereby. In the present exemplary embodiment, the intensities of the first and second sensing signals DS1 and DS2 may be the same as each other, and the first and second sub-sensing controllers 831 and 832 may process the first and second touch signals TS1 and TS2 on the basis of the difference in intensity between the first and second external inputs. Thus, the intensity difference between the first and second external inputs may be compensated.

Figure 24A:
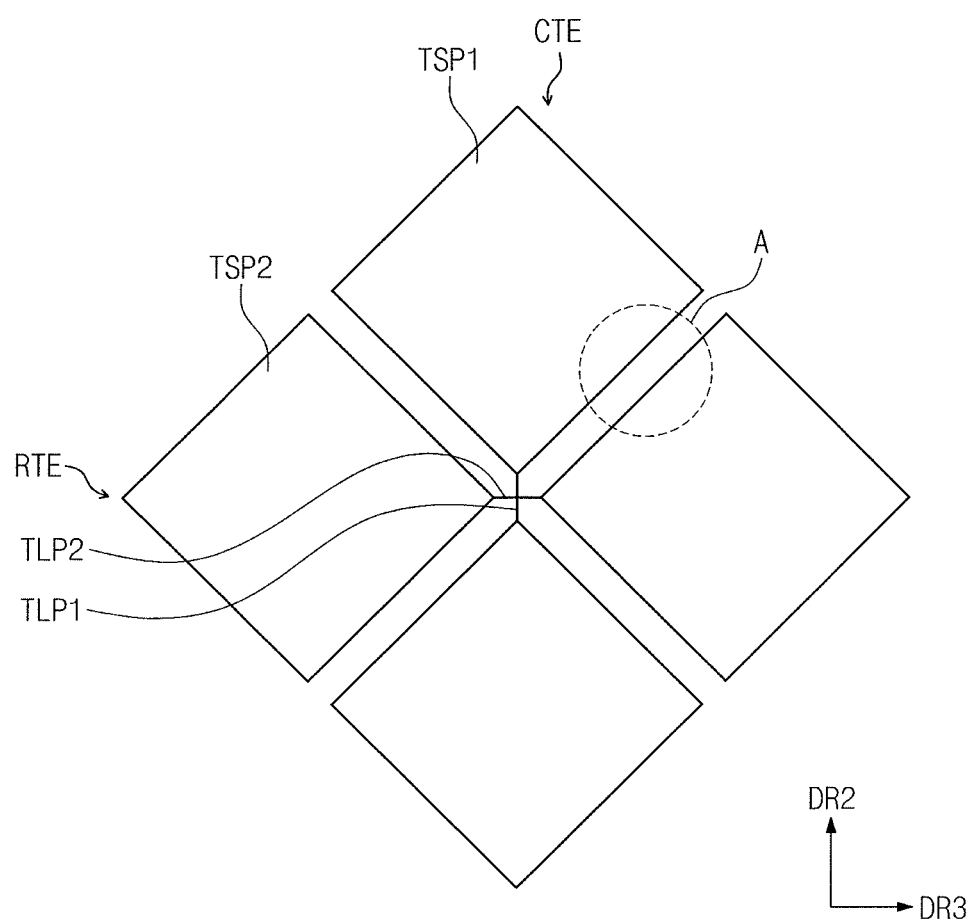
FIG. 24A illustrates a view showing a touch electrode according to an exemplary embodiment of the present disclosure.
Figure 24B:
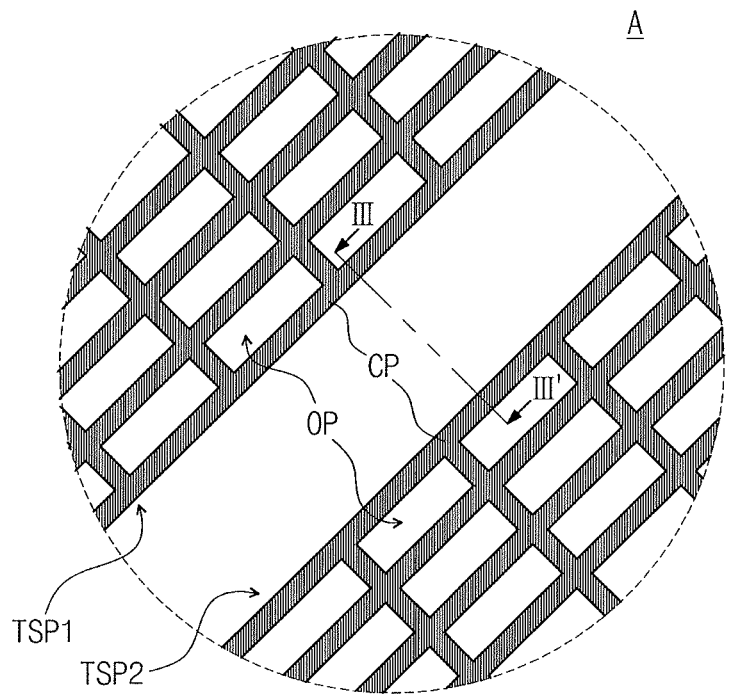
FIG. 24B illustrates an enlarged view showing an area "A" shown in FIG. 24A.
Figure 24C:
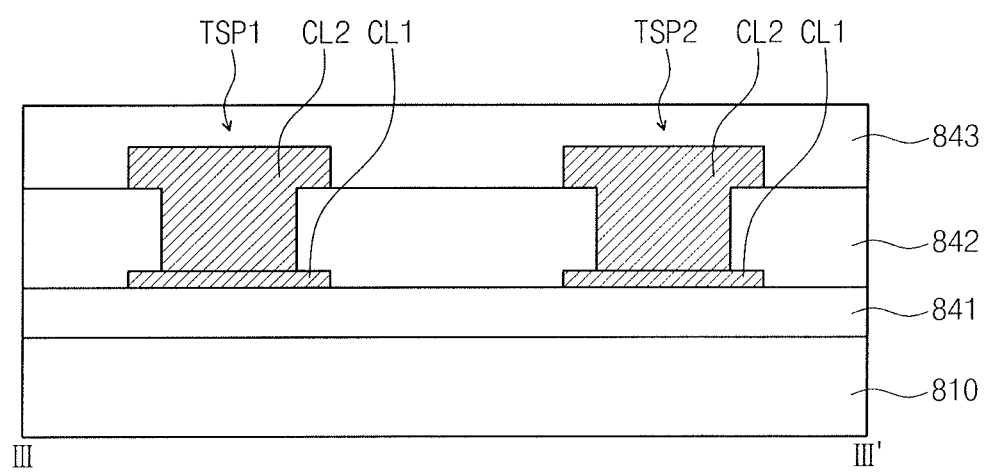
FIG. 24C illustrates an enlarged cross-sectional view taken along a line shown in FIG. 24B.

FIG. 24A is a view showing a touch electrode according to an exemplary embodiment of the present disclosure, FIG. 24B is an enlarged view showing an area "A" shown in FIG. 24A, and FIG. 24C is an enlarged cross-sectional view taken along a line III-III' shown in FIG. 24B.

Referring to FIG. 24A, a first touch area TA1 includes a column touch electrode CTE and a row touch electrode RTE. The column touch electrode CTE extends in a second direction DR2, and the row touch electrode RTE extends in a third direction DR3. The row touch electrode RTE is insulated from the column touch electrode CTE. The external input is sensed on the basis of a mutual capacitance between the row touch electrode RTE and the column touch electrode CTE.

The column touch electrode CTE includes first sensor patterns TSP1 arranged in the second direction DR2 and first connection patterns TLP1 connecting two first sensor patterns adjacent to each other in the second direction DR2 among the first sensor patterns TSP1. The first sensor patterns TSP1 may be integrally formed with the first connection patterns TLP1.

The row touch electrode RTE includes second sensor patterns TSP2 arranged in the third direction DR3 and second connection patterns TLP2 connecting two second sensor patterns adjacent to each other in the third direction DR3 among the second sensor patterns TSP2. The second sensor patterns TSP2 may be integrally formed with the second connection patterns TLP2. The second connection patterns TLP2 are insulated from the first connection patterns TLP1 while crossing the first connection patterns TLP1.

Referring to FIG. 24B, each of the first and second sensor patterns TSP1 and TSP2 may have a mesh shape. In more detail, conductive portions CP, each having a width in a range from few hundreds of nanometers to few hundreds of micrometers, may cross each other to form the mesh shape. Openings OP may be defined between the conductive portions CP. A transmittance and a resistance of the first and second sensor patterns TSP1 and TSP2 may be determined depending on a size of the openings or the width of the conductive portions CP.

Referring to FIG. 24C, the touch module 800 includes a buffer layer 841, an intermediate layer 842, and a cover layer 843, which are sequentially stacked on the base layer 810. Each of the first and second sensor patterns TSP1 and TSP2 includes a first conductive layer CL1 and a second conductive layer CL2.

Each of the first and second conductive layers CL1 and CL2 may include, for example, Ag, Mg, Al, Pt, Pd, Au, Ni, Nd, Ir, Cr, Li, Ca, LiF/Ca, LiF/Al, Mo, Ti, a compound thereof, or a mixture thereof. Each of the first and second conductive layers CL1 and CL2 may include a transparent metal oxide, e.g., indium tin oxide (ITO), indium zinc oxide (IZO), zinc oxide (ZnO), indium tin zinc oxide (ITZO), Mo, Ti, etc.

The first conductive layer CL1 is disposed between the buffer layer 841 and the intermediate layer 842, and the second conductive layer CL2 is disposed between the intermediate layer 842 and the cover layer 843. The second conductive layer CL2 is connected to the first conductive layer CL1 through a contact hole formed through the intermediate layer 842.

Figure 25A:
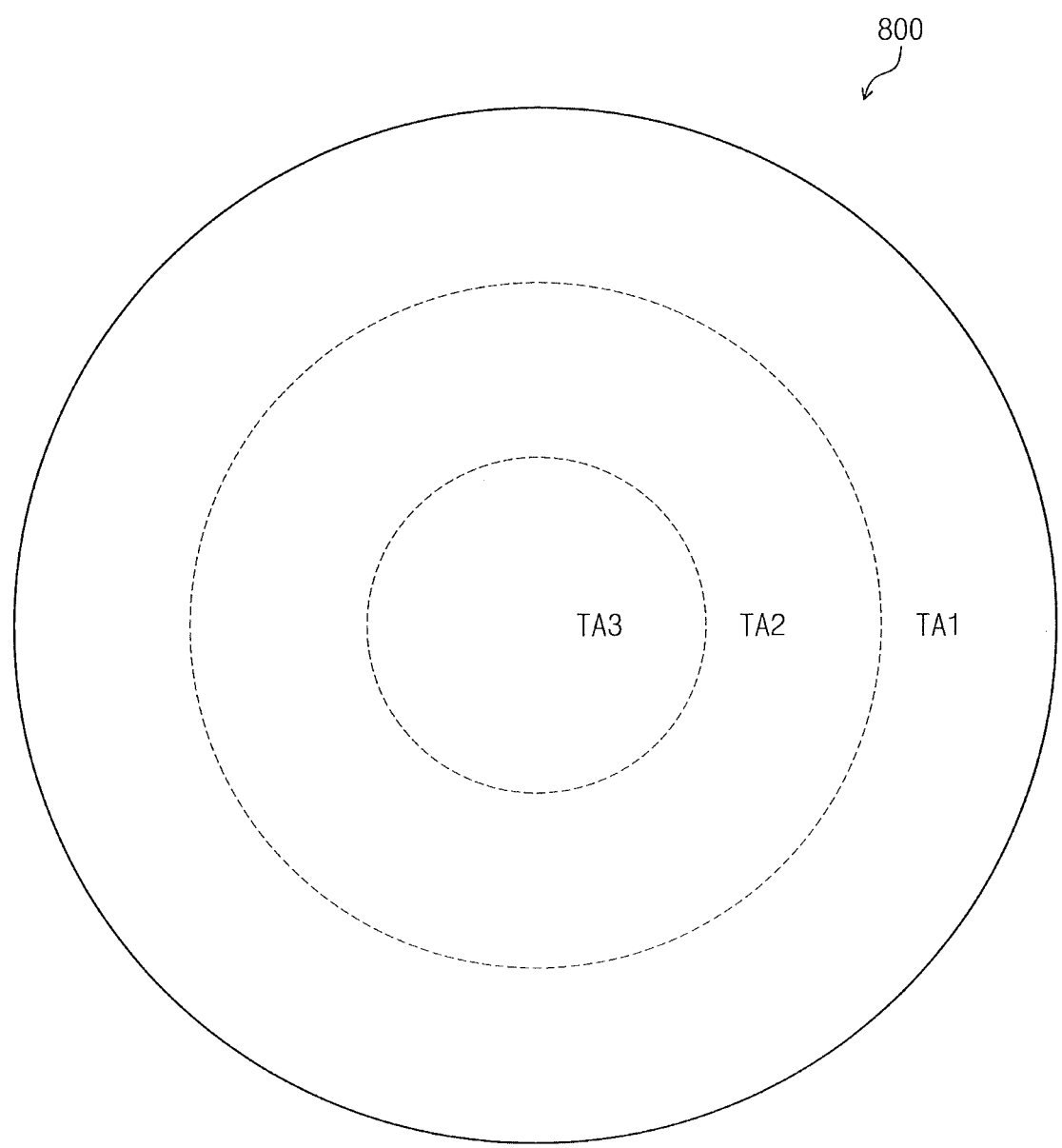
FIG. 25A illustrates a view showing touch areas according to an exemplary embodiment of the present disclosure.

FIG. 25A is a view showing touch areas according to an exemplary embodiment of the present disclosure.

Referring to FIG. 25A, a touch module 800 includes first, second, and third touch areas TA1, TA2, and TA3. The touch module 800 has an oval shape, e.g., a substantially circular shape. The first to third touch areas TA1 to TA3 are defined corresponding to the shape of the touch module 800.

In more detail, the first to third touch areas TA1 to TA3 are sequentially arranged in the radial direction ($\hat{\rho}$). A boundary of the first to third touch areas TA1 to TA3 has an oval shape or a substantially circular shape. Each of the first and second touch areas TA1 and TA2 has a ring shape when viewed in a plan view, and the third touch area TA3 has a circular shape. Circumferences of the first to third touch areas TA1 to TA3 become smaller in order of first, second, and third touch areas TA1, TA2, and TA3.

Figure 25B:
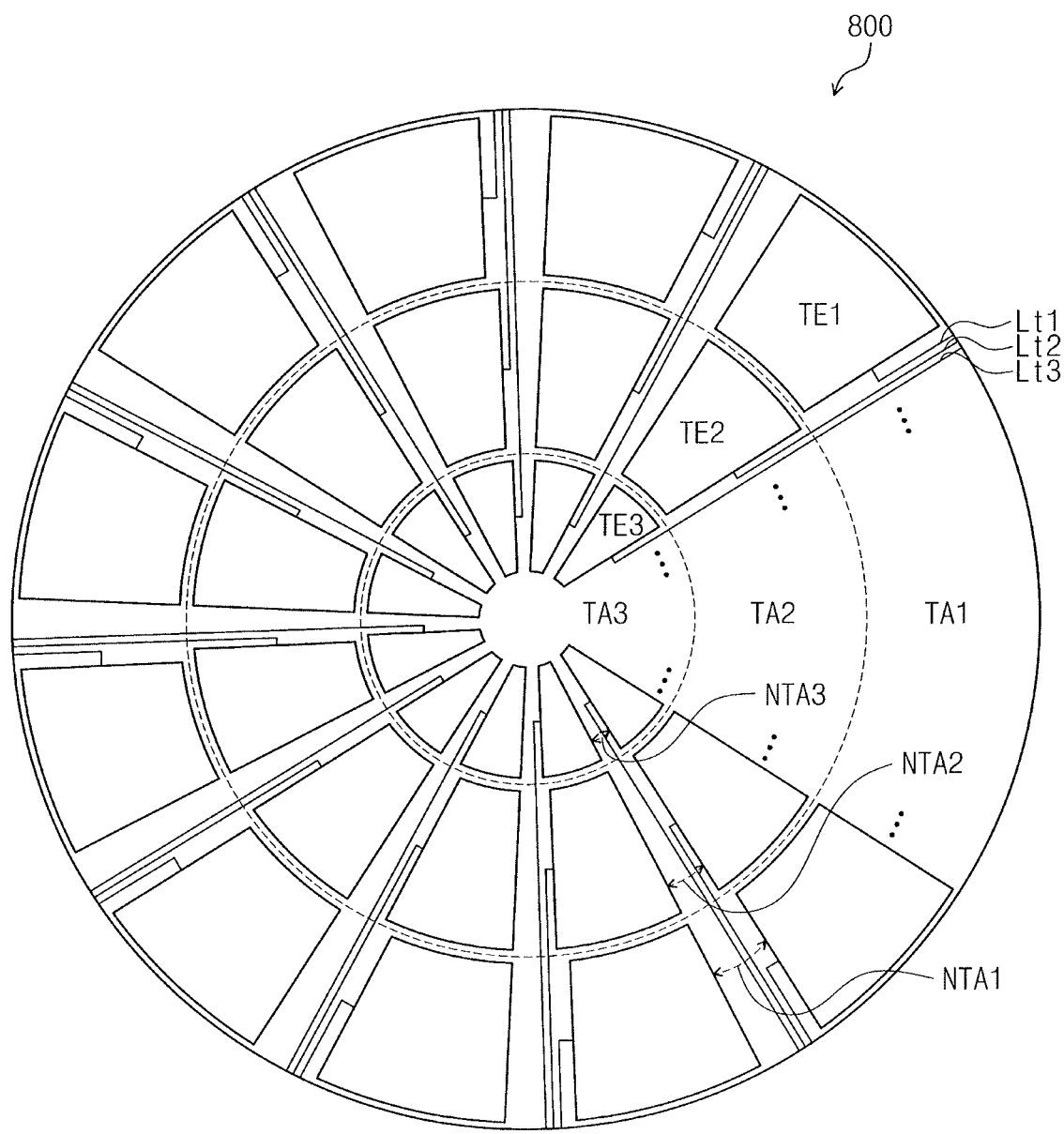
FIG. 25B illustrates a plan view showing a touch module according to an exemplary embodiment of the present disclosure.

FIG. 25B is a plan view showing a touch module according to an exemplary embodiment of the present disclosure.

For the convenience of explanation, some components of the touch module are omitted in FIG. 25B. Referring to FIG. 25B, the touch module 800 may further include touch lines. The touch lines may include, for example, first, second, and third touch lines Lt1, Lt2, and Lt3 respectively connected to the first, second, and third touch electrodes TE1, TE2, and TE3.

In the present exemplary embodiment, each of the first to third touch electrodes TE1 to TE3 includes a pair of sides substantially parallel to the radial direction ($\hat{\rho}$) and a pair of sides substantially parallel to the tangential direction ($\hat{\varphi}$).

The first to third touch lines Lt1 to Lt3 are substantially parallel to the radial direction ($\hat{\rho}$) and arranged in the tangential direction ($\hat{\varphi}$). The first to third touch lines Lt1 to Lt3 are similar to each other, and thus the first and second touch lines Lt1 and Lt2 will be described as a representative example. Descriptions of the first and second touch lines Lt1 and Lt2 may be similarly applied to the third touch lines Lt3.

In the present exemplary embodiment, the first touch line Lt1 applies a sensing signal to the first touch electrode TE1 and receives a touch signal from the first touch electrode TE1. Responsive to the sensing signal from the first touch line Lt1, the first touch electrode TE1 outputs the touch signal corresponding to the self-capacitance changed by the external input.

The first touch line Lt1 is disposed between two first touch electrodes TE1 adjacent to each other in the tangential direction ($\hat{\varphi}$). In the present exemplary embodiment, the first touch line Lt1 is spaced apart from the second touch electrode TE2 in the radial direction ($\hat{\rho}$) and is not overlapped with the second touch electrode TE2 in the tangential direction ($\hat{\varphi}$). In other words, the first touch line Lt1 may not be disposed between the second and third touch electrodes TE2 and TE3.

In the present exemplary embodiment, the second touch line Lt2 applies a sensing signal to the second touch electrode TE2 and receives a touch signal from the second touch electrode TE2. Responsive to the sensing signal from the second touch line Lt2, the second touch electrode TE2 outputs the touch signal corresponding to the self-capacitance changed by the external input.

The second touch line Lt2 is disposed between two second touch electrodes TE2 adjacent to each other in the tangential direction ($\hat{\varphi}$). In the present exemplary embodiment, the second touch line Lt2 is spaced apart from the third touch electrode TE3 in the radial direction ($\hat{\rho}$) and is not overlapped with the third touch electrode TE3 in the tangential direction ($\hat{\varphi}$). In other words, the second touch line Lt2 may not be disposed between the second and third touch electrodes TE2 and TE3. In the present exemplary embodiment, the first touch line Lt1 is overlapped with the second touch electrode TE2 in the radial direction ($\hat{\rho}$).

In the above-mentioned structure, a width of a non-touch area NTA2 between two second touch electrodes TE2 adjacent to each other in the tangential direction ($\hat{\varphi}$) may be reduced. Accordingly, a resolution and a sensitivity of the touch module 800 may be improved. Similarly, a width of a non-touch area NTA3 between two third touch electrodes TE3 adjacent to each other in the tangential direction ($\hat{\varphi}$) may be reduced. Accordingly, the sensitivity of the touch module 800 may be improved.

Figure 26:
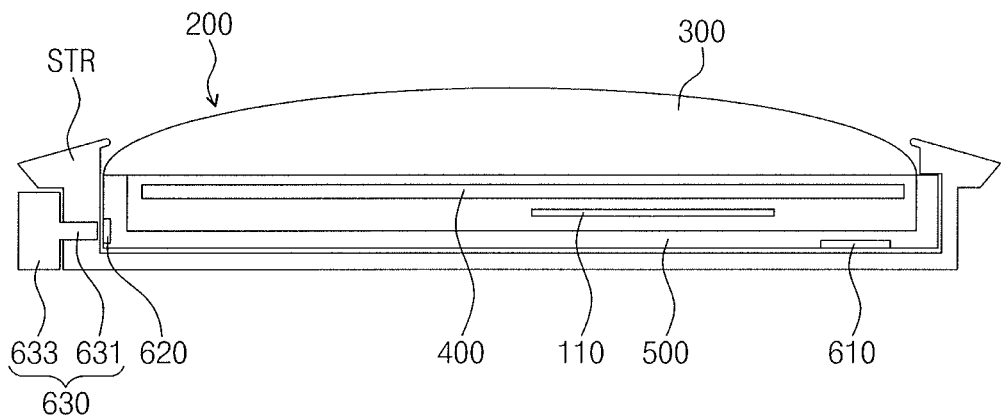
FIG. 26 illustrates a cross-sectional view showing an electronic watch according to an exemplary embodiment of the present disclosure.

FIG. 26 is a cross-sectional view showing an electronic watch 1000 according to an exemplary embodiment of the present disclosure.

Referring to FIG. 26, the electronic watch 1000 includes a coupling-sensing sensor 610, a crown sensor 620, and a crown 630.

The crown 630 includes a crown shaft 631 and a crown disc 633. The crown shaft 631 is inserted into or coupled to a coupling hole defined through a sidewall of the strap STR such that the crown shaft 631 is rotated or moves to a horizontal direction. The crown disc 633 is connected to one end of the crown shaft 631 and disposed outside the strap STR to be exposed to the outside.

The crown sensor 620 is disposed in the housing 500. The crown sensor 620 is disposed at a sidewall of the housing 500 facing the coupling hole. The crown sensor 620 makes contact with or is disposed adjacent to the other end of the crown shaft 631. The crown sensor 620 senses the rotation or movement in the horizontal direction of the crown shaft 631 or senses a position of the crown shaft 631 to output a crown signal. As an example, the electronic module substrate 110 controls the display module 200 using the crown signal. The user rotates the crown 630 or moves the crown 630 in the horizontal direction to control the display module 200.

The coupling-sensing sensor 610 is disposed in the housing 500. The coupling-sensing sensor 610 is disposed between the housing 500 and the strap STR. The coupling-sensing sensor 610 makes contact with or is disposed adjacent to the strap STR. The coupling-sensing sensor 610 senses whether the display module 200 is coupled to the coupling space of the strap STR and generates a coupling signal. The coupling-sensing sensor 610 may be, for example, a pressure sensor and senses a pressure applied thereto by the display module 200 to generate the coupling signal when the display module 200 is coupled to the strap STR. However, the coupling-sensing sensor 610 may include a proximity sensor or an infrared sensor according to embodiments.

The electronic module substrate 110 may control the display module 200 using the coupling signal.

Figure 27:
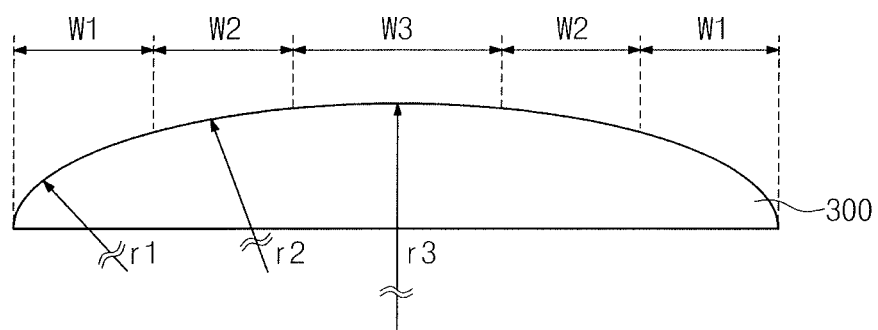
FIG. 27 illustrates a cross-sectional view showing a window member according to an exemplary embodiment of the present disclosure.

FIG. 27 is a cross-sectional view showing a window member according to an exemplary embodiment of the present disclosure.

The window member 300 according to the present exemplary embodiment may have a variable curvature. The curvature of the window member 300 may be varied along the horizontal direction. In more detail, when radius of curvatures of the first, second, and third window areas WA1, WA2, and WA3 are respectively referred to as first, second, and third radius of curvatures r1, r2, and r3, the first, second, and third radius of curvatures r1, r2, and r3 satisfy the following relation of r1<r2<r3. Accordingly, a difference between the first to third thicknesses of the first to third window areas WA1 to WA3 is reduced, and the image is effectively prevented from being distorted by the window member 300. As a result, the display quality of the display module 200 may be improved. In addition, the first, second, and third radius of curvatures r1, r2, and r3 may satisfy the following relation of r1>r2>r3.

In the present exemplary embodiment, the window member 300 includes a plurality of lens layers to prevent the distortion of the image. The window member 300 includes, for example, a concave lens layer with a concave lens shape and a convex lens layer with a convex lens shape. The window member 300 has a structure in which the concave lens layer and the convex lens layer are alternately stacked one on another. Among the lens layers, at least one lens layer has a refractive index different from other lens layers.

Figure 28:
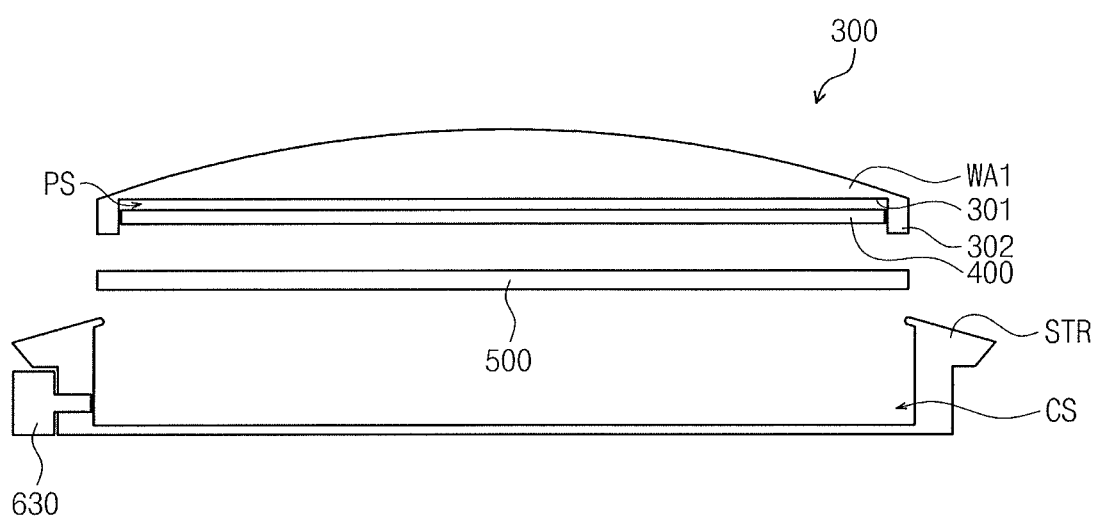
FIG. 28 illustrates a cross-sectional view showing a window member according to an exemplary embodiment of the present disclosure.

FIG. 28 is a cross-sectional view showing a window member 300 according to an exemplary embodiment of the present disclosure.

Referring to FIG. 28, the window member 300 may further include an extension portion 302 extending from a first window area WA1. The extension portion 302 extends to the display panel 400 and defines a panel space PS. The panel space PS is defined under a lower surface 301 of the window member 300.

The window member 300 is coupled to a housing 500, and the display module 200 is disposed in the coupling space of the strap STR.

Figure 29A:
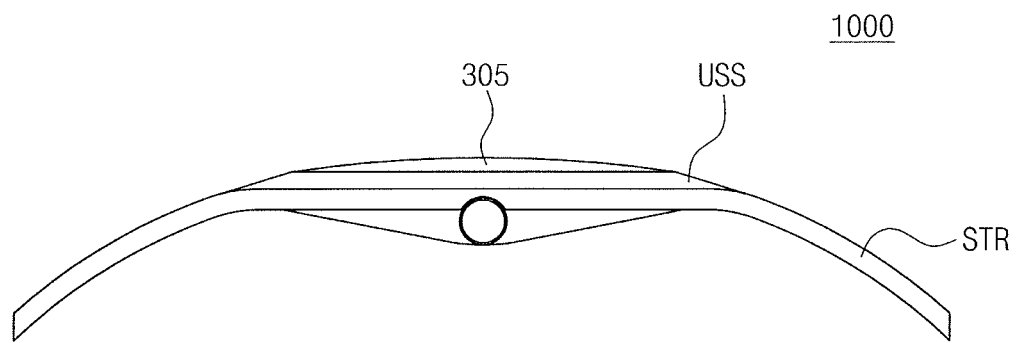
FIGS. 29A to 29C illustrate cross-sectional views showing electronic watches according to an exemplary embodiment of the present disclosure.
Figure 29B:
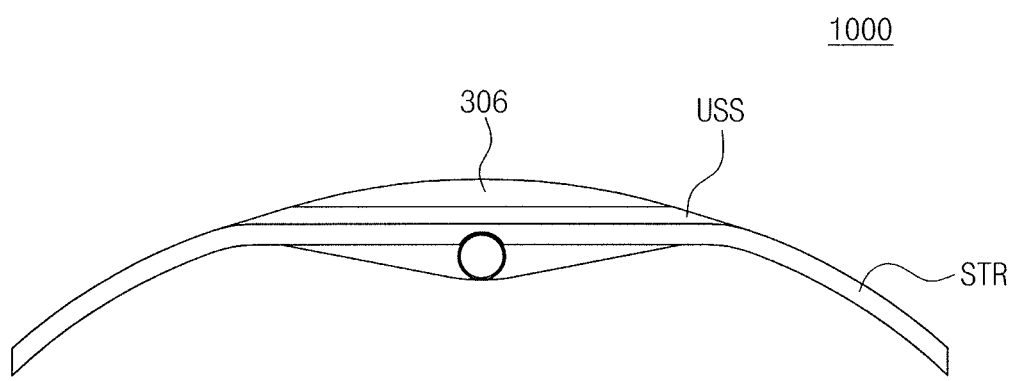
Figure 29C:
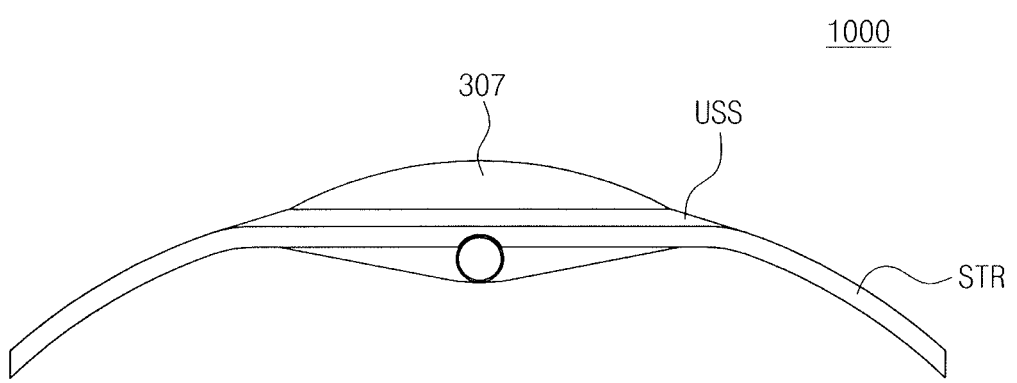

FIGS. 29A to 29C are cross-sectional views showing electronic watches according to an exemplary embodiment of the present disclosure.

Referring to FIG. 29A, a curvature of an upper surface of a window member 305 may be smaller than a curvature of an upper surface of a strap STR. Referring to FIG. 29B, a curvature of an upper surface of a window member 306 may be equal to a curvature of an upper surface USS of a strap STR. Referring to FIG. 29C, a curvature of an upper surface USS of a window member 307 may be greater than a curvature of a strop STR.

According to the curvature of the upper surface of the window member 300, the electronic watch 1000 provides the user with the image having improved three-dimensional effect, sense of immersion (or immersiveness), and presence of the image.

Figure 30A:
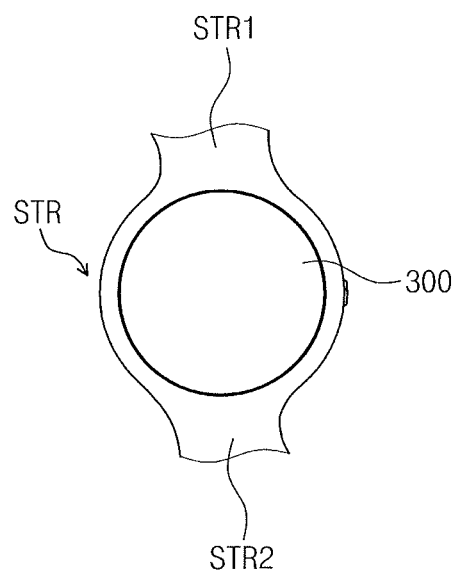
FIGS. 30A and 30B illustrate plan views showing an electronic watch according to an exemplary embodiment of the present disclosure.
Figure 30B:
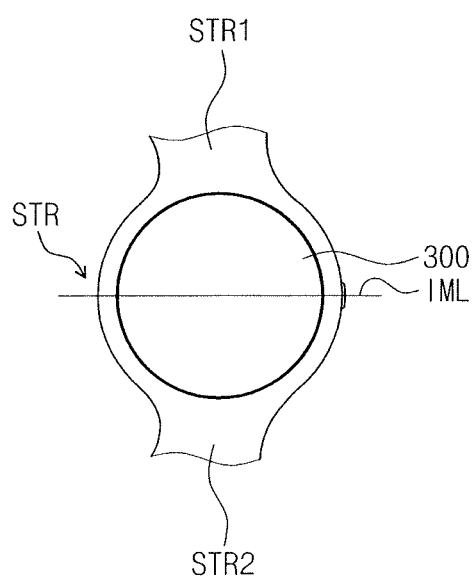

FIGS. 30A and 30B are plan views showing an electronic watch according to an exemplary embodiment of the present disclosure.

Referring to FIG. 30A, a strap STR includes first and second sub-straps STR1 and STR2. The first and second sub-straps STR1 and STR2 are substantially symmetric about the origin with respect to a center of the window member 300. The first and second sub-straps STR1 and STR2 extend in opposite directions such that the window member 300 is disposed between the first and second sub-straps STR1 and STR2.

Referring to FIG. 30B, the first and second straps STR1 and STR2 are symmetrical with each other with respect to an imaginary line IML crossing a center of the window member 300 and parallel to a horizontal direction.

Figure 31:
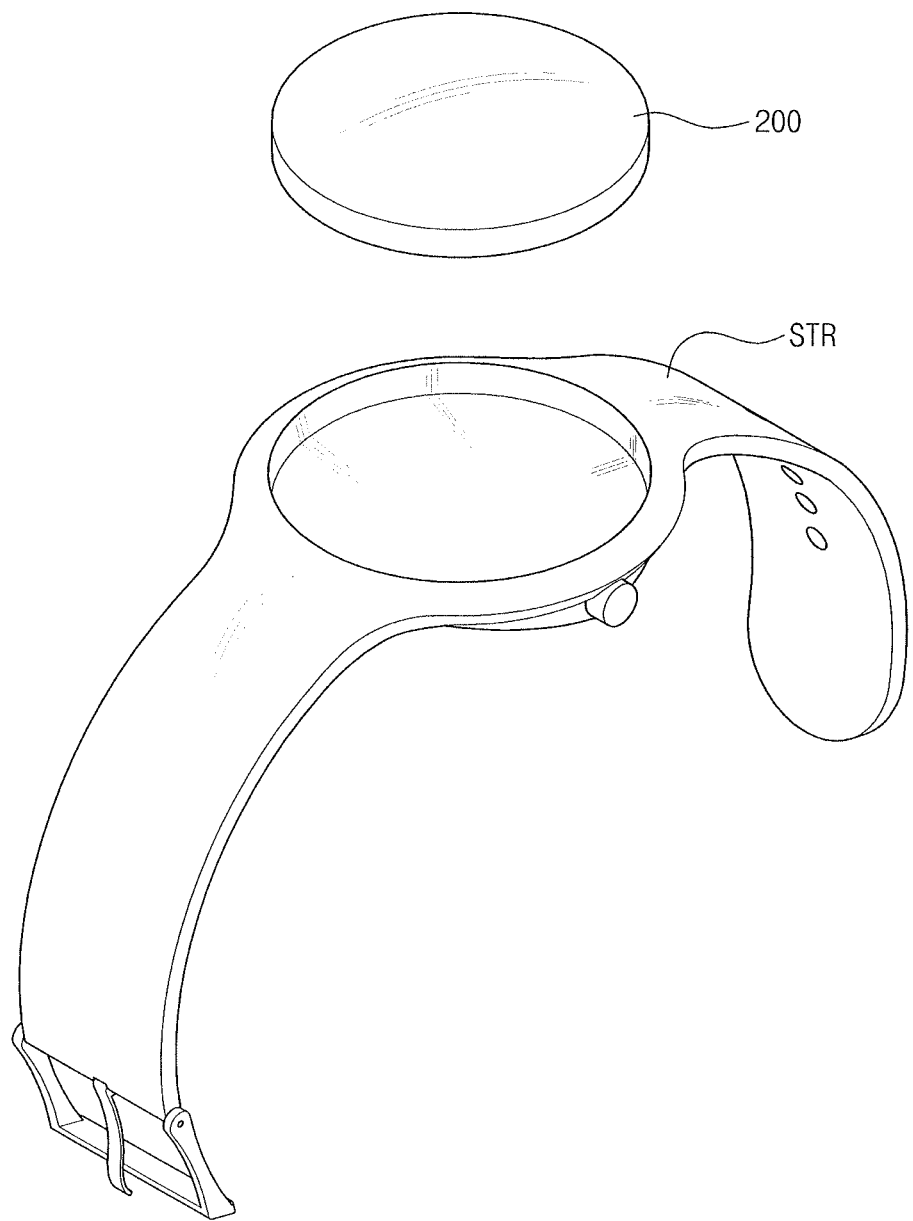
FIG. 31 illustrates an exploded perspective view showing an electronic watch according to an exemplary embodiment of the present disclosure.

FIG. 31 is an exploded perspective view showing an electronic watch according to an exemplary embodiment of the present disclosure.

Referring to FIG. 31, as described above, the display module 200 may be separated from the strap STR. Among various display modules 200 and straps STR, the user may select the display module 200 and the strap STR in accordance with function and design of the display module 200 and the strap STR and combines the selected display module 200 and the selected strap STR to use the electronic watch for a particular purpose, usage, or preference.

Figure 32:
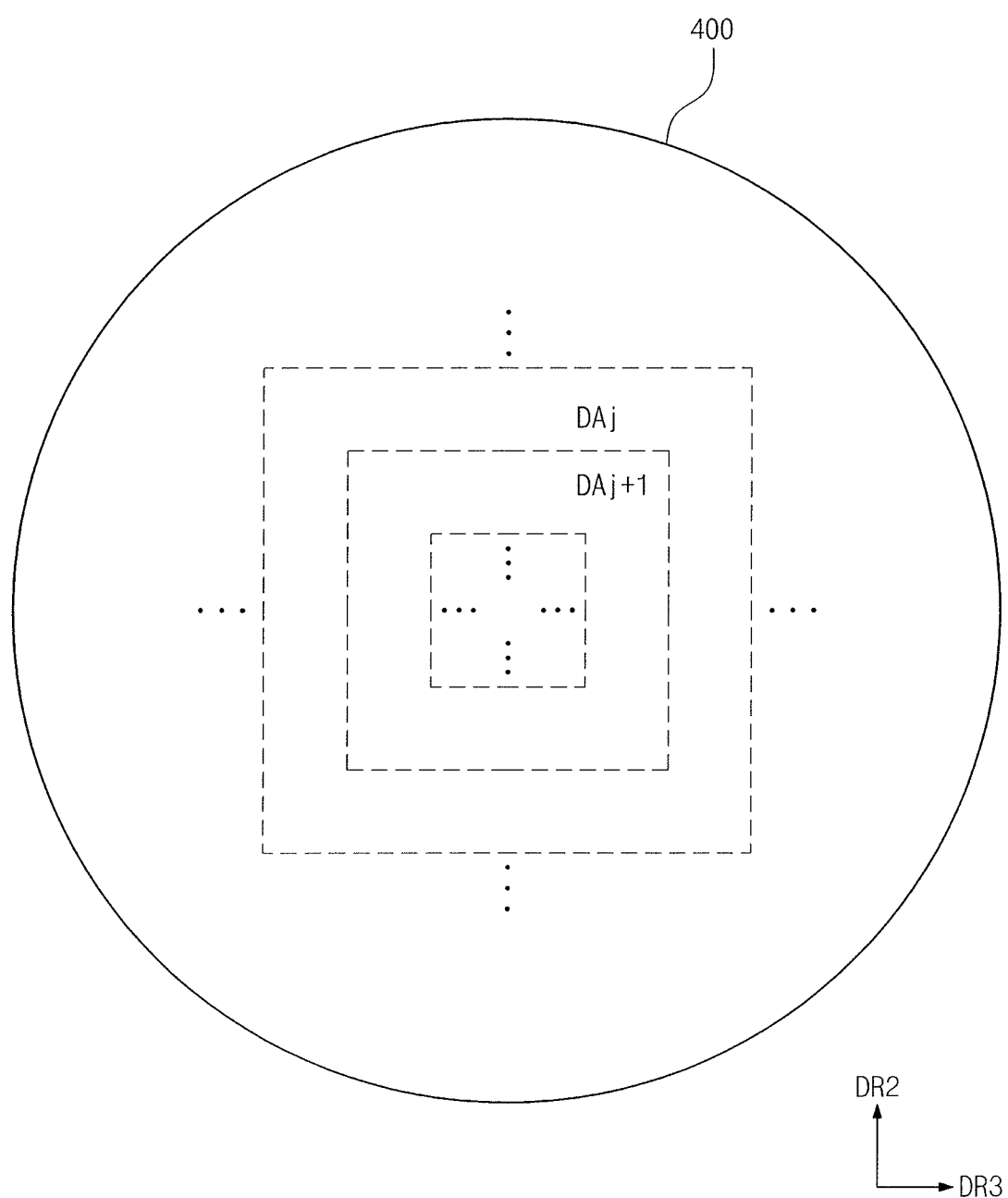
FIG. 32 illustrates a plan view showing a display area according to an exemplary embodiment of the present disclosure.
Figure 33:
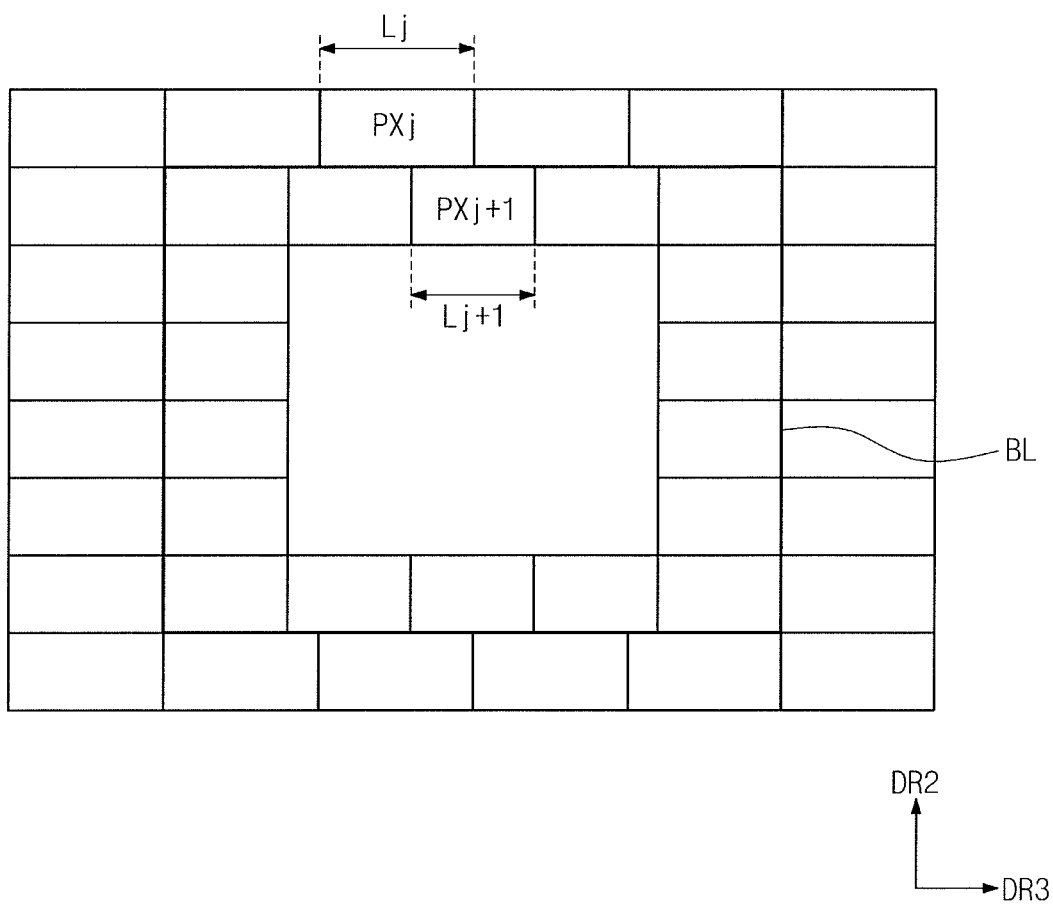
FIG. 33 illustrates an enlarged plan view showing a display area shown in FIG. 32.

FIG. 32 is a plan view showing a display area according to an exemplary embodiment of the present disclosure, and FIG. 33 is an enlarged plan view showing a display area shown in FIG. 32.

Referring to FIG. 32, the display areas may have a polygonal shape.

For instance, among the display areas, a j-th display area DAj and a (j+1)th area DAj+1 may have a rectangular shape with pairs of sides, which are respectively parallel to second and third directions DR2 and DR3. The second and third directions DR2 and DR3 are substantially parallel to a plane surface. The j-th display area DAj may surround the (j+1)th display area DAj+1. Boundaries of the j-th display area DAj and the (j+1)th display area DAj+1 may be substantially parallel to the second direction DR2 or the third direction DR3.

Referring to FIG. 33, the j-th display area DAj includes a j-th pixel PXj, and the (j+1)th display area DAj+1 includes a (j+1)th pixel PXj+1. The j-th and (j+1)th pixels PXj and PXj+1 may have a rectangular shape with pairs of sides, which are respectively parallel to the second and third directions DR2 and DR3.

When a length of a side parallel to the third direction DR3 of the j-th pixel PXj is referred to as a j-th side length Lj, a length of a side parallel to the third direction DR3 of the (j+1)th pixel PXj+1 is referred to as a (j+1)th side length Lj+1, the number of the j-th pixels PXj arranged in the third direction DR3 is referred to as "M", and the number of the (j+1)th pixels PXj+1 arranged in the third direction DR3 is referred to as "N", an equation of $$M = \frac{Lj+1}{Lj} \times N$$

(M and N are natural numbers) is satisfied. For instance, when the j-th side length Lj is 1 and the (j+1)th side length Lj+1 is 0.8, (M, N) satisfying the equation may be (8, 10) or (12, 15). Since the j-th and (j+1)th pixels PXj and PXj+1 satisfy the equation, opposite boundaries BL of the first and second display areas DAj and DAj+1 may be substantially parallel to the second direction DR2.

FIGS. 34A to 34E are plan views showing sub-pixels according to an exemplary embodiment of the present disclosure.

Figure 34A:
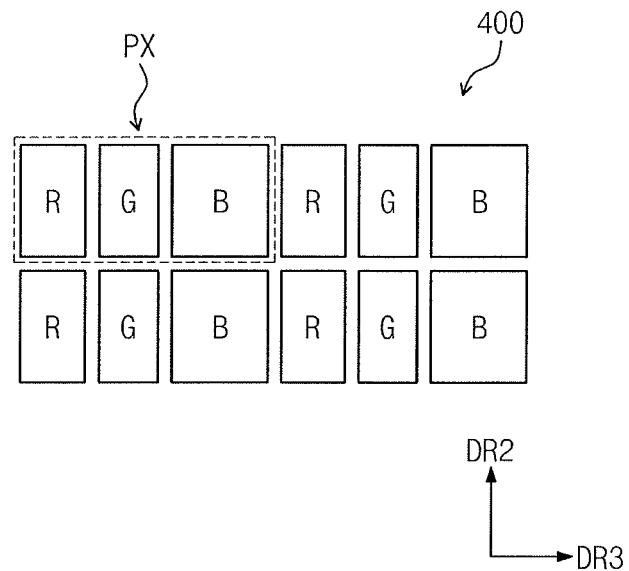
FIGS. 34A to 34E illustrate plan views showing subpixels according to an exemplary embodiment of the present disclosure.

Referring to FIG. 34A, pixels PX are arranged along second and third directions DR2 and DR3 in a matrix form. Each of the pixels PX includes a red sub-pixel R, a green sub-pixel G, and a blue sub-pixel B. Each of the red, green, and blue sub-pixels R, G, and B has a rectangular shape with sides substantially parallel to the second and third directions DR2 and DR3. The red, green, and blue sub-pixels R, G, and B are sequentially arranged in the third direction DR3.

Figure 34B:
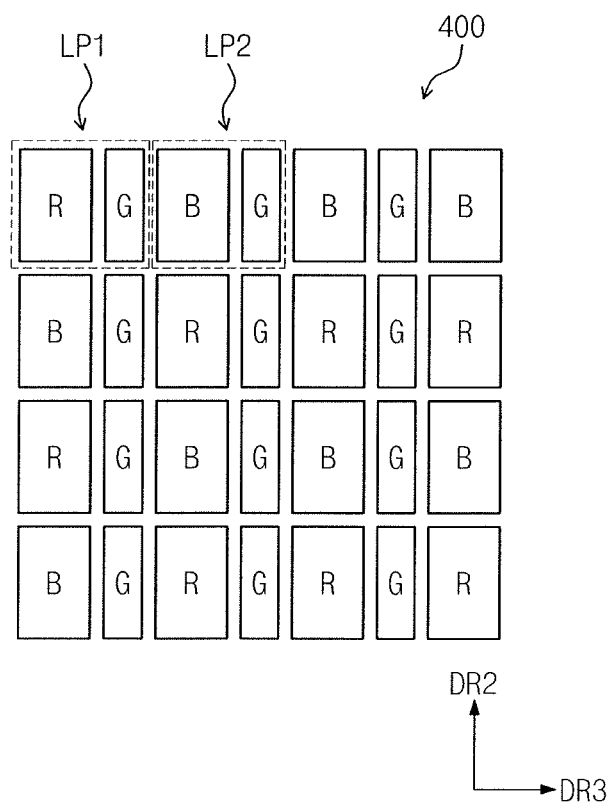

Referring to FIG. 34B, a display panel 400 includes a first logic pixel LP1 configured to include red and green subpixels R and G arranged in the third direction DR3 and a second logic pixel LP2 configured to include blue and green sub-pixels B and G arranged in the third direction DR3. The first and second logic pixels LP1 and LP2 are alternately arranged with each other along the second and third directions DR2 and DR3.

Figure 34C:
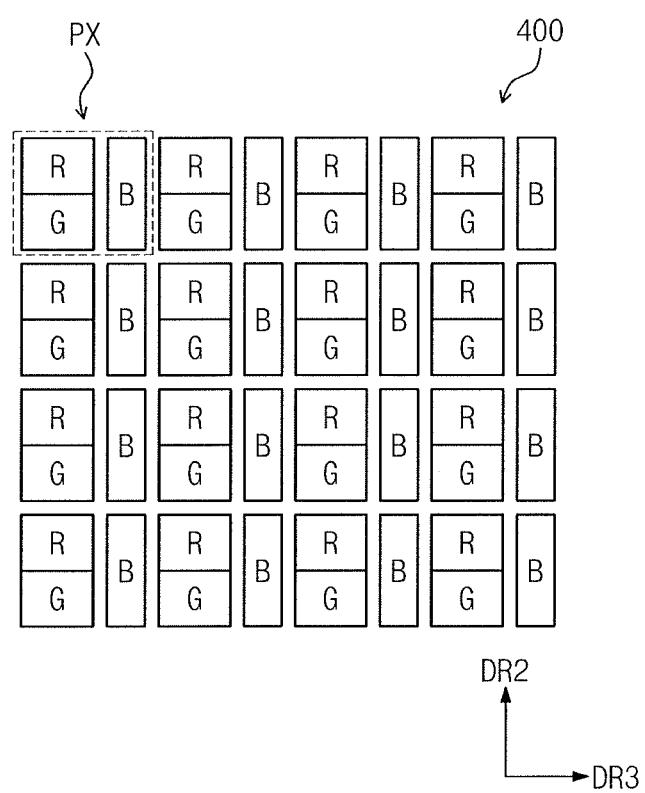

Referring to FIG. 34C, pixels PX are arranged in a matrix form along second and third directions DR2 and DR3. Each of the pixels PX includes a red sub-pixel R, a green sub-pixel G, and a blue sub-pixel B. The red and green sub-pixel R and G are arranged in the second direction DR2. The blue sub-pixel B is arranged to be spaced apart from the red and green sub-pixels R and G in the third direction DR3.

Figure 34D:
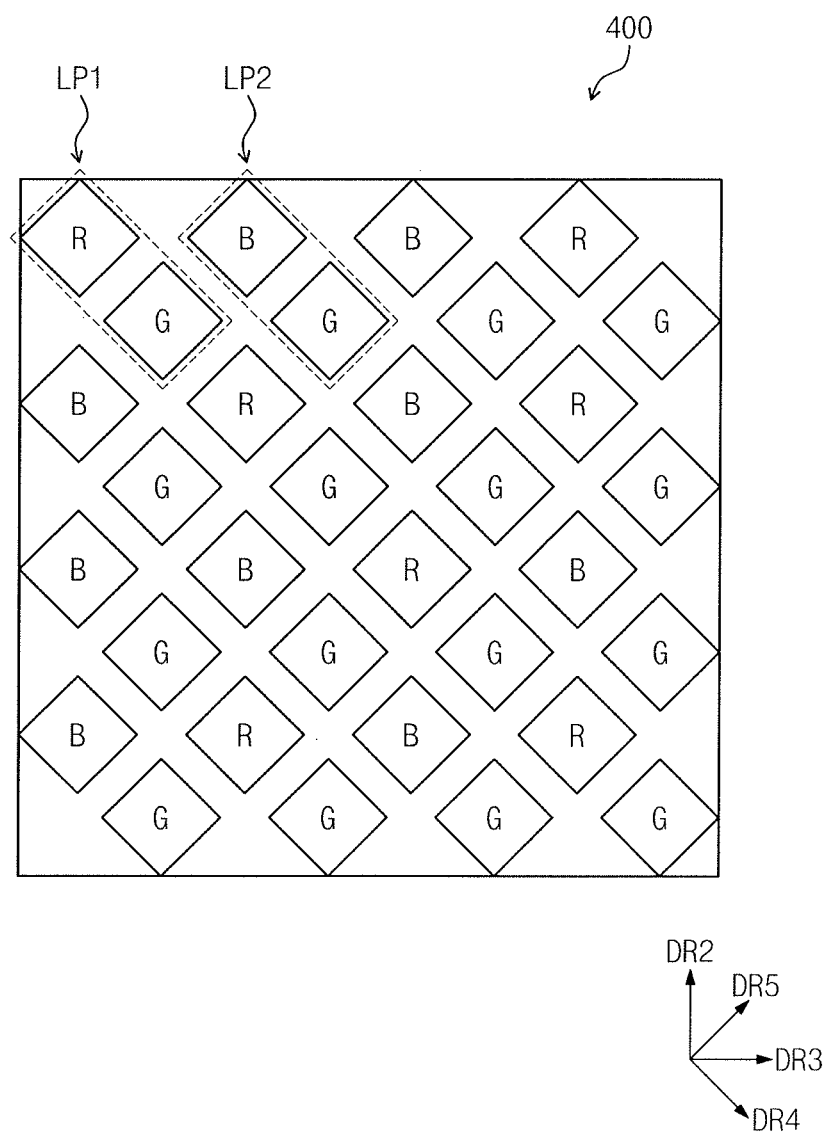

Referring to FIG. 34D, a display panel 400 includes a first logic pixel LP1 configured to include red and green sub-pixels R and G arranged in a fourth direction DR4 and a second logic pixel LP2 configured to include blue and green sub-pixels B and G arranged in the fourth direction DR4. The fourth direction DR4 may be a direction that is not parallel to at least one side of the display panel 400 or all sides of the display panel 400. The first and second logic pixels LP1 and LP2 are alternately arranged in a fifth direction DR5. The fifth direction DR5 is substantially perpendicular to the fourth direction DR4.

Figure 34E:
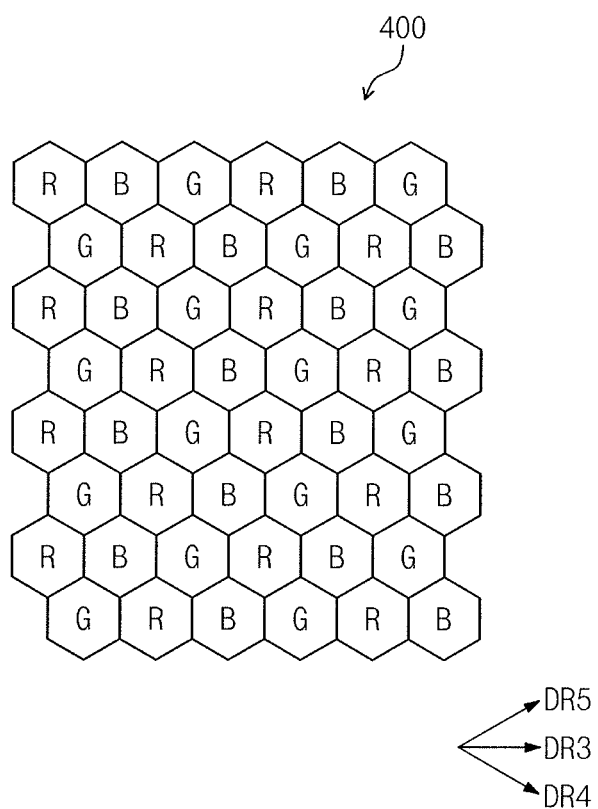

Referring to FIG. 34E, each of red, green, and blue sub-pixels R, G, and B has a hexagonal shape with three pairs of sides, which are respectively parallel to third, fourth, and fifth directions DR3, DR4, and DR5. Each of an angle between the third and fourth directions DR3 and DR4 and an angle between the third and fifth directions DR3 and DR5 is about 60 degrees. The red, green, and blue sub-pixels R, G, and B are arranged in a matrix form along the third and fourth directions DR3 and DR4.

By way of summation and review, according to embodiments, a display module includes a window member having a first window area with a first thickness and a second window area with a second thickness greater than the first thickness, and a display panel having a first display area overlapping the first window area in a thickness direction and including a first pixel, and a second display area overlapping the second window area in the thickness direction and including a second pixel. The second pixel has a second pixel area smaller than a first pixel area of the first pixel, and the pixels are arranged along a curved surface of the window member such that the image is not distorted by the curved surface of the window member. Thus, the display quality of the image displayed in the display panel may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display module, comprising:
    a window member including a first window area having a first thickness and a second window area having a second thickness greater than the first thickness; and
    a display panel including:
        a first display area overlapping the first window area in a thickness direction and including a plurality of first pixels; and
    a second display area overlapping the second window area in the thickness direction and including a plurality of second pixels, at least one of the plurality of second pixels having a second pixel area smaller than a first pixel area of at least one of the plurality of first pixels, wherein
    the first and second pixels satisfy equation (ES1/PS1)< (ES2/PS2),
    where PS1 denotes the first pixel area, ES1 denotes an area of a first light emitting area of at least one of the plurality of first pixels, PS2 denotes the second pixel area, and ES2 denotes an area of a second light emitting area of at least one of the plurality of second pixels.

2. The display module as claimed in claim 1, wherein:
    the window member further comprises a third window area having a third thickness greater than the second thickness, and
    the display panel further comprises a third display area overlapping the third window area in the thickness direction and having a plurality of third pixels, the second pixel area being greater than a third pixel area of at least one of the plurality of third pixels.

3. The display module as claimed in claim 2, wherein the second display area is between the first and third display areas to connect the first display area to the third display area when viewed in plan view.

4. The display module as claimed in claim 1, wherein the display panel further comprises:
    a first pixel definition layer exposing a lower electrode of at least one of the plurality of first pixels to correspond to the first light emitting area; and
    a second pixel definition layer exposing a lower electrode of at least one of the plurality of the second pixels to correspond to the second light emitting area.

5. The display module as claimed in claim 1, wherein the display panel further comprises:
    a first black matrix overlapping the plurality of first pixels in the thickness direction to define the first light emitting area; and
    a second black matrix overlapping the plurality of second pixels in the thickness direction to define the second light emitting area, the first black matrix having an area greater than an area of the second black matrix.

6. The display module as claimed in claim 5, wherein the plurality of the first and second pixels are arranged in a matrix form along a radial direction ($\hat{\rho}$) and a tangential direction ($\hat{\varphi}$) of a cylindrical coordinate system.

7. The display module as claimed in claim 6, wherein a width in the tangential direction ($\hat{\varphi}$) of the first black matrix is greater than a width in the tangential direction ($\hat{\varphi}$) of a portion of the second black matrix.

8. The display module as claimed in claim 6, wherein a width in the radial direction ($\hat{\rho}$) of the first black matrix is greater than a width in the radial direction ($\hat{\rho}$) of a portion of the second black matrix.

9. The display module as claimed in claim 6, wherein:
    at least one of the plurality of first pixels includes first and second sub-pixels arranged in the tangential direction ($\hat{\varphi}$), and
    at least a portion of a sub-light emitting area of the first sub-pixel does not overlap at least a portion of a sub-light emitting area of the second sub-pixel in the tangential direction ($\hat{\varphi}$).

10. The display module as claimed in claim 6, wherein the display panel further comprises first and second display lines substantially parallel to the radial direction ($\hat{\rho}$), the second display line being between first pixels adjacent to each other in the tangential direction ($\hat{\varphi}$) among the plurality of first pixels and between second pixels adjacent to each other in the tangential direction ($\hat{\varphi}$) among the plurality of second pixels, and the first display line being between first pixels adjacent to each other in the tangential direction ($\hat{\varphi}$) among the plurality of first pixels and spaced apart from the plurality of second pixels in the radial direction ($\hat{\rho}$).

11. The display module as claimed in claim 1, wherein:
the window member has a substantially circular shape or an oval shape when viewed in plan view, the first display area being external to the second display area when viewed in plan view, and
a boundary of the first and second display areas has a circular shape or an oval shape.

12. The display module as claimed in claim 1, further comprising a controller to receive a first input image data having information on an image displayed in the first display area and a second input image data having information on an image displayed in the second display area, wherein
the controller compensates for a grayscale value of at least one of the first and second input image data to compensate for a difference in brightness between the first and second pixel areas, which is caused by a different in area between the first and second pixel areas.

13. The display module as claimed in claim 1, wherein an entire upper surface of the window member is curved, and a curvature of an upper surface of the first window area is different from a curvature of an upper surface of the second window area.

14. The display module as claimed in claim 1, wherein a length of at least one of the plurality of second pixels in a horizontal direction perpendicular to the thickness direction is smaller than a length of at least one of the plurality of the first pixels in the horizontal direction.

15. The display module as claimed in claim 14, wherein a total number of the plurality of first pixels in the first area is smaller than a total number of the plurality of second pixels in the second area.

16. The display module as claimed in claim 14, wherein a first distance in a horizontal direction perpendicular to the thickness direction between the first pixels adjacent to each other among the plurality of first pixels is greater than a second distance in the horizontal direction between the second pixels adjacent to each other among the plurality of second pixels.

17. The display module as claimed in claim 1, further comprising a touch module including:
a first touch area overlapping the first window area in a thickness direction and including a first touch electrode; and
a second touch area overlapping the second window area in the thickness direction and including a second touch electrode, the second touch electrode having a touch sensitivity greater than a touch sensitivity of the first touch electrode.

18. The display module as claimed in claim 17, wherein the second touch electrode has an area smaller than an area of the first touch electrode.

19. The display module as claimed in claim 17, wherein each of the first and second touch electrodes is provided in a plural number, and a distance between adjacent second touch electrodes to each other among the second touch electrodes is smaller than a distance between adjacent first touch electrodes to each other among the first touch electrodes.

20. The display module as claimed in claim 17, wherein each of the first and second touch electrodes is provided in a plural number, and the first and second touch electrodes are arranged in a matrix form along a radial direction ($\hat{\rho}$) and a tangential direction ($\hat{\varphi}$) of a cylindrical coordinate system.

21. The display module as claimed in claim 20, wherein:
the touch module further comprises a plurality of first touch lines and a plurality of second touch lines, which are substantially parallel to the radial direction ($\hat{\rho}$),
the second touch lines are located between the first touch electrodes and between the second touch electrodes, and transmit a signal caused by a self-capacitance of the second touch electrodes, and
the first touch lines are located between the first touch electrodes and spaced apart from the second touch electrodes in the radial direction ($\hat{\rho}$), and transmit a signal caused by a self-capacitance of the first touch electrodes.

22. The display module as claimed in claim 17, wherein:
the touch module further comprises a sensing controller that outputs a first sensing signal to the first touch area and outputs a second sensing signal to the second touch area, and
the second sensing signal has an intensity greater than an intensity of the first sensing signal.

23. An electronic watch, comprising the display module as claimed in claim 1, wherein:
the display panel includes the first display area to display a first partial image to a first direction and the second display area to display a second partial image to the first direction;
the window member includes an edge portion on the first display area to enlarge the first partial image M1 times and a center portion on the second display area to enlarge the second partial image M2 times, the window member having an upper surface convex in the first direction; and
a housing is positioned under the display panel to accommodate the display panel, wherein
M2 is greater than M1, and
a number of pixels per a unit area in the first display area is smaller than a number of pixels per a unit area in the second display area.

24. The electronic watch as claimed in claim 23, wherein an equation of PN2/PN1=M2/M1 is satisfied, where
PN1 denotes the number of the pixels per the unit area of the first display area, and
PN2 denotes the number of the pixels per the unit area of the second display area.

25. An electronic device, comprising:
a window member including an upper surface convex in a thickness direction in which an image is provided; and
a display panel including a first display area overlapping an edge portion of the upper surface in the thickness direction and having a first pixel, and a second display area overlapping a center portion of the upper surface in the thickness direction and having a second pixel, the second pixel having a second pixel area smaller than a first pixel area of the first pixel, wherein
the first and second pixels satisfy equation (ES1/PS1)< (ES2/PS2),
where PS1 denotes the first pixel area, ES1 denotes an area of a first light emitting area of the first pixel, PS2 denotes the second pixel area, and ES2 denotes an area of a second light emitting area of the second pixel.

* * * * *